United States Patent
Liu et al.

(10) Patent No.: US 11,937,465 B2
(45) Date of Patent: Mar. 19, 2024

(54) ARRAY SUBSTRATE, DISPLAY PANEL AND DISPLAY DEVICE THEREOF

(71) Applicant: BOE Technology Group Co., Ltd., Beijing (CN)

(72) Inventors: Libin Liu, Beijing (CN); Jiangnan Lu, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 102 days.

(21) Appl. No.: 17/630,908

(22) PCT Filed: Mar. 11, 2021

(86) PCT No.: PCT/CN2021/080326
§ 371 (c)(1),
(2) Date: Jan. 27, 2022

(87) PCT Pub. No.: WO2022/188116
PCT Pub. Date: Sep. 15, 2022

(65) Prior Publication Data
US 2023/0165069 A1  May 25, 2023

(51) Int. Cl.
*H10K 59/124* (2023.01)
*G09G 3/3233* (2016.01)

(52) U.S. Cl.
CPC ......... *H10K 59/124* (2023.02); *G09G 3/3233* (2013.01); *G09G 2300/0426* (2013.01);
(Continued)

(58) Field of Classification Search
CPC ... G09G 2300/0819; G09G 2300/0426; G09G 3/3233; G09G 2300/0861; G09G 2310/08;
(Continued)

(56) References Cited

U.S. PATENT DOCUMENTS 9,276,120 B2  3/2016 Morosawa et al.
10,297,620 B2  5/2019 Chen et al.
(Continued)

FOREIGN PATENT DOCUMENTS

AU  2020376100 A1  7/2021
CN  205722744 U  11/2016
(Continued)

OTHER PUBLICATIONS

Written Opinion issued in International Application No. PCT/CN2021/080326 dated Nov. 26, 2021, (4p).
(Continued)

*Primary Examiner* — Abbas I Abdulselam
(74) *Attorney, Agent, or Firm* — Arch & Lake LLP

(57) ABSTRACT

Embodiments of the present disclosure relate to the field of display technology, and in particular, to an array substrate, a display panel and a display device thereof. The array substrate includes a substrate and a plurality of sub-pixels on the substrate. Each sub-pixel includes a pixel circuit. The pixel circuit includes a plurality of transistors. The plurality of transistors includes at least one oxide transistor. The array substrate further includes: an oxide semiconductor layer on the substrate, the oxide semiconductor layer comprising a channel region of the oxide transistor; a first planarization layer on the substrate and covering at least a portion of the oxide semiconductor layer; a barrier part on the side of the first planarization layer away from the substrate.

20 Claims, 45 Drawing Sheets

(52) U.S. Cl.
CPC ............ *G09G 2300/0819* (2013.01); *G09G 2300/0842* (2013.01); *G09G 2300/0861* (2013.01); *G09G 2310/08* (2013.01); *G09G 2320/0233* (2013.01)

(58) Field of Classification Search
CPC ... G09G 2300/0842; G09G 2320/0233; H10K 59/124
See application file for complete search history.

(56) References Cited

U.S. PATENT DOCUMENTS

| | | | |
|---|---|---|---|
| 10,622,434 B2 | 4/2020 | Choi et al. | |
| 10,886,359 B2 | 1/2021 | Choi et al. | |
| 11,133,367 B2 | 9/2021 | Wang et al. | |
| 2010/0193772 A1 | 8/2010 | Morosawa et al. | |
| 2013/0221358 A1 | 1/2013 | Nordlung et al. | |
| 2013/0056728 A1 | 3/2013 | Morosawa et al. | |
| 2015/0048372 A1 | 2/2015 | Morosawa et al. | |
| 2017/0162608 A1 | 6/2017 | Yamazaki et al. | |
| 2018/0102381 A1 | 4/2018 | Chen et al. | |
| 2018/0190730 A1* | 7/2018 | Cho | H10K 59/131 |
| 2019/0172888 A1 | 6/2019 | Choi et al. | |
| 2019/0189720 A1* | 6/2019 | Lim | H10K 59/124 |
| 2019/0237491 A1 | 8/2019 | Chen et al. | |
| 2020/0043963 A1* | 2/2020 | Bu | G09G 3/3233 |
| 2020/0161402 A1 | 5/2020 | Wang et al. | |
| 2020/0212161 A1 | 7/2020 | Choi et al. | |
| 2021/0050469 A1 | 2/2021 | Zhou et al. | |
| 2021/0091168 A1 | 3/2021 | Choi et al. | |
| 2021/0320132 A1 | 10/2021 | Chen et al. | |
| 2022/0208806 A1 | 6/2022 | Park et al. | |

FOREIGN PATENT DOCUMENTS

| | | |
|---|---|---|
| CN | 108493198 A | 9/2018 |
| CN | 109148489 A | 1/2019 |
| CN | 110444553 A | 11/2019 |
| CN | 110690265 A | 1/2020 |
| CN | 111640777 A | 9/2020 |
| CN | 111724745 A | 9/2020 |
| CN | 112289813 A | 1/2021 |
| CN | 112289841 A | 1/2021 |
| CN | 112397025 A | 2/2021 |
| CN | 212724668 U | 3/2021 |
| CN | 112909054 A | 6/2021 |
| EP | 3799132 A | 3/2021 |
| KR | 20210053814 A | 5/2021 |
| WO | 2019196410 A1 | 10/2019 |
| WO | 2020209535 A1 | 10/2020 |
| WO | 2021083298 A1 | 5/2021 |

OTHER PUBLICATIONS

Written Opinion issued in International Application No. PCT/CN2021/115249 dated Nov. 25, 2021, (2p).
Extended European Search Report of EP Application No. 21929594.6 dated Jul. 19, 2023, (8p).

\* cited by examiner

US 11,937,465 B2

ARRAY SUBSTRATE, DISPLAY PANEL AND DISPLAY DEVICE THEREOF

CROSS REFERENCE TO RELATED APPLICATION

The present application is a 35 U.S.C. 371 national phase application of PCT International Application No. PCT/CN2021/080326 filed on Mar. 11, 2021, the entire disclosure of which is incorporated herein as a part of the present application for all purposes.

TECHNICAL FIELD

Embodiments of the present disclosure relate to the field of display technology, and in particular, to an array substrate, a display panel and a display device thereof.

BACKGROUND

Organic Light Emission Diode (OLED) display panels have advantages such as self-luminescence, high efficiency, bright colors, light weight, power saving, rollability, and a wide temperature range, and have been gradually applied to large-area displays, lighting, automotive displays, and other fields.

SUMMARY

Embodiments of the present disclosure provide an array substrate and a related display panel and display device.

A first aspect of the present disclosure provides an array substrate, comprising a substrate and a plurality of sub-pixels formed on the substrate. Each of the sub-pixels includes a pixel circuit, the pixel circuit includes a plurality of transistors, and the plurality of transistors includes at least one oxide transistor. The array substrate further includes:
  an oxide semiconductor layer formed on the substrate, where the oxide semiconductor layer includes a channel region of the oxide transistor;
  a first planarization layer formed on the substrate and covering at least a portion of the oxide semiconductor layer, where the first planarization layer has a recessed region, at least a portion of an orthographic projection of the recessed region on the substrate is located outside the orthographic projection of the channel region of the oxide transistor on the substrate; and
  a barrier part formed on the side of the first planarization layer away from the substrate, where at least a portion of the orthographic projection of the barrier part on the substrate overlaps orthographic projection of the channel region of the oxide transistor on the substrate, the orthographic projection of the barrier part on the substrate overlaps at least a portion of the orthographic projection of the recessed region on the substrate, and the barrier part is filled in in the recessed region.

In an exemplary embodiment of the present disclosure, the orthographic projection of the recessed region on the substrate surrounds the orthographic projection of the channel region of the oxide transistor on the substrate.

In an exemplary embodiment of the present disclosure, the distance in the horizontal direction between the inner annular surface of the recessed region and an edge of the channel region of the oxide transistor is from 0.5 μm to 7 μm, where the horizontal direction is perpendicular to the thickness direction of the substrate.

In an exemplary embodiment of the present disclosure, the distance in the horizontal direction between the inner annular surface of the recessed region and the outer annular surface of the recessed region is from 1 μm to 7 μm, where the horizontal direction is perpendicular to the thickness direction of the substrate.

In an exemplary embodiment of the present disclosure, the recessed region includes a groove structure, and at the groove structure, the ratio of the remaining thickness of the first planarization layer to the groove depth of the groove structure is greater than 0 and less than or equal to 3.

In an exemplary embodiment of the present disclosure, at the groove structure, the sum of the remaining thickness of the first planarization layer and the groove depth of the groove structure is from 1 μm to 3 μm.

In an exemplary embodiment of the present disclosure, the orthographic projection of the channel region of the oxide transistor on the substrate is located within the orthographic projection of the recessed region on the substrate.

In an exemplary embodiment of the present disclosure, the barrier part is in direct contact with the first planarization layer.

In an exemplary embodiment of the present disclosure, the pixel circuit includes a driving circuit, a driving reset circuit, and a compensation circuit. The driving circuit includes a control terminal, a first terminal and a second terminal, and is configured to provide a driving current to the light emission device. The control terminal of the driving circuit is coupled to the first node. The driving reset circuit is coupled to a driving reset control signal input terminal, the first node and a driving reset voltage terminal, and is configured to provide the driving reset voltage from the driving reset voltage terminal to the control terminal of the driving circuit under the control of the driving reset control signal from the driving reset control signal input terminal to reset the control terminal of the driving circuit. The compensation circuit is coupled to the second terminal of the driving circuit, the first node and the compensation control signal input terminal, and is configured to perform threshold compensation on the driving circuit according to the compensation control signal from the compensation control signal input terminal.

In an exemplary embodiment of the present disclosure, each of the driving circuit, the driving reset circuit, and the compensation circuit includes at least one of the transistors. The transistor of the driving circuit is defined as a driving transistor, the transistor of the driving reset circuit is defined as a driving transistor, and the transistor of the compensation circuit is defined as a compensation circuit transistor.

The first terminal of the driving transistor is coupled to the first terminal of the driving circuit, the gate of the driving transistor is coupled to the control terminal of the driving circuit, and the second terminal of the driving transistor is connected to the second terminal of the driving circuit.

The first terminal of the driving reset transistor is coupled to the driving reset voltage terminal, the gate of the driving reset transistor is coupled to the driving reset control signal input terminal, and the second terminal of the driving reset transistor is coupled to the the first node.

The first terminal of the compensation transistor is coupled to the second terminal of the driving circuit, the gate of the compensation transistor is coupled to the compensation control signal input terminal, and the second terminal of the compensation transistor is coupled to the first node.

In an exemplary embodiment of the present disclosure, the plurality of transistors includes at least one silicon semiconductor transistor. The array substrate includes: a silicon semiconductor layer, located on the side of the oxide semiconductor layer close to the substrate, and isolated from the oxide semiconductor layer. The silicon semiconductor layer includes the channel region of the silicon semiconductor transistor.

In an exemplary embodiment of the present disclosure, the driving transistor is the silicon semiconductor transistor, and the driving reset transistor and the compensation transistor are the oxide transistors.

In an exemplary embodiment of the present disclosure, the driving transistor is a P-type transistor, and the driving reset transistor and the compensation transistor are N-type transistors.

In an exemplary embodiment of the present disclosure, the pixel circuit further includes a voltage stabilizing circuit. The voltage stabilizing circuit is coupled to the control terminal of the driving circuit, the first node and the voltage stabilizing control signal input terminal, and is configured to enable a conduction between the control terminal of the driving circuit and the first node under the control of the voltage stabilizing control signal from the voltage stabilizing control signal input terminal.

In an exemplary embodiment of the present disclosure, the voltage stabilizing circuit includes at least one of the transistors, and the transistor of the voltage stabilizing circuit is defined as a voltage stabilizing transistor.

The first terminal of the voltage stabilizing transistor is coupled to the control terminal of the driving circuit, the gate of the voltage stabilizing transistor is coupled to the voltage stabilizing control signal input terminal, and the second terminal of the voltage stabilizing transistor is coupled to the first node.

Each of the driving transistor, the driving reset transistor and the compensation transistor is the silicon semiconductor transistor, and the voltage stabilizing transistor is the oxide transistor.

In an exemplary embodiment of the present disclosure, each of the driving transistor, the driving reset transistor and the compensation transistor is a P-type transistor, and the voltage stabilizing transistor is an N-type transistor.

In an exemplary embodiment of the present disclosure, the pixel circuit further includes a data writing circuit, a storage circuit, a light emission control circuit, and a light emission reset circuit.

The data writing circuit is coupled to the data signal input terminal, the scan signal input terminal and the first terminal of the driving circuit, and is configured to provide the data signal from the data signal input terminal to the first terminal of the driving circuit under the control of the scan signal from the scan signal input terminal.

The storage circuit is coupled to the first power voltage terminal and the control terminal of the driving circuit, and is configured to store the voltage difference between the first power voltage terminal and the control terminal of the driving circuit.

The light emission control circuit is coupled to the light emission control signal input terminal, the first power voltage terminal, the first and second terminals of the driving circuit, the light emission reset circuit and the light emission device, and is configured to apply the first power voltage from the first power voltage terminal to the driving circuit under the control of the light emission control signal from the light emission control signal input terminal, and to apply the driving current generated by the driving circuit to the light emission devices.

The light emission reset circuit is coupled to the light emission reset control signal input terminal, the first end of the light emission device and the light emission reset voltage terminal, and is configured to provide the light emission reset voltage from the light emission reset voltage terminal to the light emission device under the control of the light emission reset control signal from the light emission reset control signal input terminal to reset the light emission device.

In an exemplary embodiment of the present disclosure, each of the data writing circuit, the light emission reset circuit and the light emission control circuit includes at least one of the transistors. The transistor of the data writing circuit is defined as a data writing transistor. The transistor of the light emission reset circuit is defined as a light emission reset transistor. The transistor of the light emission control circuit is defined as a light emission control transistor, and the light emission control circuit includes at least two light emission control transistors, which are a first light emission control transistor and a second light emission control transistor. The storage circuit includes a storage capacitor.

The first terminal of the data writing transistor is coupled to the data signal input terminal, the gate of the data writing transistor is coupled to the scan signal input terminal, and the second terminal of the data writing transistor is coupled to the first terminal of the driving circuit.

The first terminal of the storage capacitor is coupled to the first power voltage terminal, and the second terminal of the storage capacitor is coupled to the control terminal of the driving circuit. The storage capacitor is configured to store the voltage difference between the first power voltage terminal and the control terminal of the driving circuit.

The first terminal of the first light emission control transistor is coupled to the first power voltage terminal, the gate of the first light emission control transistor is coupled to the light emission control signal input terminal, and the second terminal of the first light emission control transistor is coupled to the first terminal of the driving circuit.

The first terminal of the second light emission control transistor is coupled to the second terminal of the driving circuit, the gate of the second light emission control transistor is coupled to the light emission control signal input terminal, and the second terminal of the second light emission control transistor is coupled to the first terminal of the light emission device.

The first terminal of the light emission reset transistor is coupled to the light emission reset voltage terminal, the gate of the light emission reset transistor is coupled to the light emission reset control signal input terminal, and the second terminal of the light emission reset transistor is coupled to the first terminal of the light emission device.

In an exemplary embodiment of the present disclosure, the data writing transistor, the first light emission control transistor, the second light emission control transistor, and the light emission reset transistor are all the silicon semiconductor transistors.

In an exemplary embodiment of the present disclosure, the data writing transistor, the first light emission control transistor, the second light emission control transistor, and the light emission reset transistor are all P-type transistors.

In an exemplary embodiment of the present disclosure, the driving reset voltage terminal and the light emission reset voltage terminal are different reset voltage terminals. In an exemplary embodiment of the present disclosure, a conductive layer is further included on a side of the first planarization layer away from the substrate. The conductive layer includes a data signal line and a first power voltage line arranged along a row direction. The data signal line is coupled to the first terminal of the data writing transistor. The first power voltage line is coupled to the first terminal of the storage capacitor and the first terminal of the first light emission control transistor. A portion of the first power voltage line serves as the barrier part.

A second aspect of the present disclosure provides a display panel including the array substrate described in any one of the above embodiments.

A third aspect of the present disclosure provides a display device including the above-mentioned display panel.

Other features and advantages of the present disclosure will become apparent from the following detailed description, or can be learned in part by practice of the present disclosure.

It is to be understood that the foregoing general description and the following detailed description are exemplary and explanatory only and are not restrictive of the present disclosure.

BRIEF DESCRIPTION OF THE DRAWINGS

The accompanying drawings, which are incorporated in and constitute a part of the present specification, illustrate embodiments consistent with the present disclosure and together with the present description serve to explain the principle of the present disclosure. Obviously, the drawings in the following description are only some embodiments of the present disclosure, and for those of ordinary skill in the art, other drawings may also be obtained from these drawings without creative efforts.

DETAILED DESCRIPTION OF THE EMBODIMENTS

Figure 1:
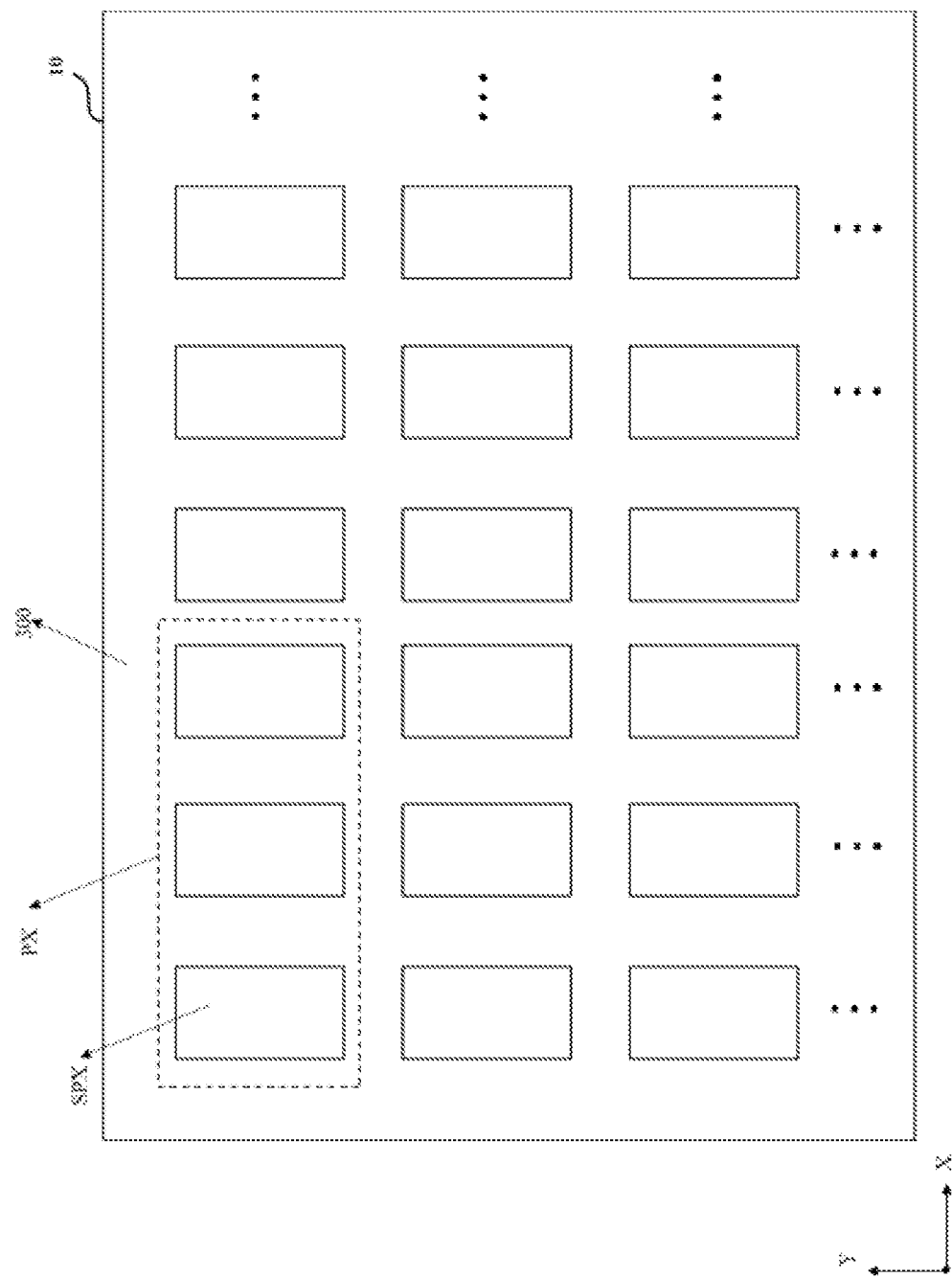
FIG. 1 shows a schematic diagram of an array substrate according to an embodiment of the present disclosure.

Firstly, it should be noted that unless the context clearly dictates otherwise, the singular forms of words used herein and in the appended claims include the plural and vice versa. Thus, when referring to the singular, the plural of the respective term is generally included. Similarly, the words "comprising" and "including" are to be construed as inclusive rather than exclusive. Likewise, the terms "including" and "or" should be construed as inclusive unless otherwise indicated herein. Where the term "instance" is used herein, particularly when it follows a group of terms, the term "instance" is merely exemplary and illustrative and should not be considered exclusive or broad.

In addition, it should also be noted that when introducing elements of the present application and embodiments thereof, the articles "a," "an," "the," and "said" are intended to mean that there are one or more of the elements. Unless otherwise stated, "several" means two or more. The terms "comprising", "including", "containing" and "having" are intended to be inclusive, and mean that there may be additional elements other than the listed elements. The terms "first", "second", "third", etc. are used for descriptive purposes only and should not be construed to indicate or imply relative importance and formation order.

Further, in the drawings, the thicknesses and areas of various layers are exaggerated for clarity. It will be understood that when a layer, region, or component is referred to as being "on" another part, it means that it is directly on the other part, or other components may also be intervening. Conversely, when a component is referred to as being "directly" on top of another component, it means that no other component is located in between.

In the related art, the pixel driving circuit may be formed by using a Low Temperature Polycrystalline Oxide (LTPO) technology. However, the H (hydrogen) element in the Thin-Film Encapsulation (TFE) process has impacts on the stability of the oxide channel. In some embodiments of the present disclosure, the H element may be blocked by covering the dense metal layer above the oxide channel region. But, it has been found through testing that the H element will pass through the looser organic planarization layer below the dense metal layer and enter the oxide channel region, thereby affecting the channel stability.

In order to alleviate influences of the H element on the oxide channel region, an embodiment of the present disclosure provides an array substrate. In the following, non-limiting description is given of the array substrate provided by an embodiment of the present disclosure with reference to the accompanying drawings, as described below. Different features in these specific embodiments may be combined with each other under the condition that they do not conflict with each other, so as to obtain new embodiments. These new embodiments also fall within the protection scope of the present disclosure.

FIG. 1 shows a schematic diagram of an array substrate 10. As shown in FIG. 1, the array substrate 10 includes a substrate 300, and a plurality of sub-pixels SPX arranged on the substrate 300 in multiple rows and columns. The substrate may be a glass substrate, a plastic substrate, or the like. The display area of the substrate 300 includes a plurality of pixel units PX, and each pixel unit may include a plurality of sub-pixels SPX, such as three or four.

The sub-pixels SPX are arranged at intervals along the row direction X and the column direction Y. The row direction X and the column direction Y are perpendicular to each other. At least one of the sub-pixels SPX includes a pixel circuit and a light emission device. The pixel circuit may include a transistor and a capacitor. The pixel circuit generates an electrical signal through an interaction between the transistor and the capacitor, and the generated electrical signal is input to the first terminal of the light emission device. By applying a respective voltage to the second terminal of the light emission device, the light emission device may be driven to emit light. A plurality of transistors may be provided in the pixel circuit, and at least one transistor among the plurality of transistors may be an oxide transistor.

Figure 13:
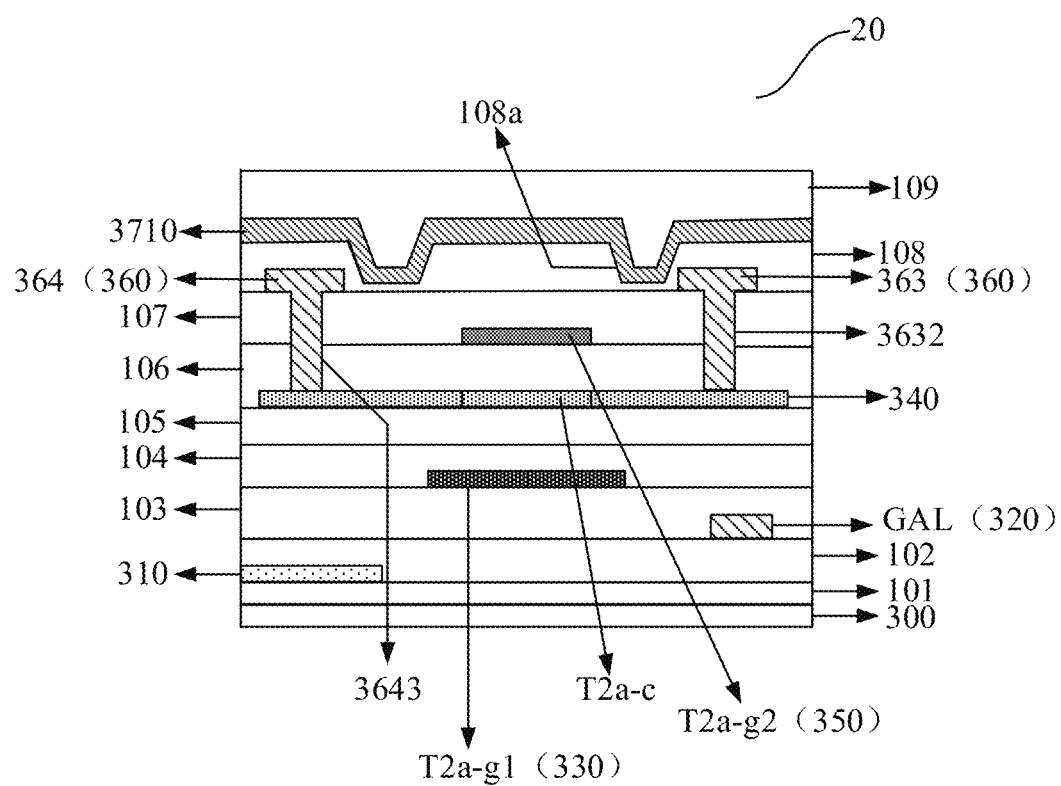
FIG. 13 shows a schematic cross-sectional structure diagram of the array substrate taken along the line A1-A2 in FIG. 12 according to Embodiment 1 of the present disclosure.

In some embodiments of the present disclosure, as shown in FIG. 13, the array substrate may include an oxide semiconductor layer 340, a first planarization layer 108 and a barrier part 3710. The oxide semiconductor layer 340 is formed on the substrate 300, and the oxide semiconductor layer 340 includes the aforementioned channel region of the oxide transistor (T2a-c shown in FIG. 13). The first planarization layer 108 is formed on the substrate 300 and covers at least part of the oxide semiconductor layer 340. The first planarization layer 108 has a recessed region 108a. At least part of the orthographic projection of the recessed region 108a on the substrate 300 is located outside the orthographic projection of the channel region T2a-c of the oxide transistor on the substrate 300. The barrier part 3710 is formed on the side of the first planarization layer 108 away from the substrate 300. At least part of the orthographic projection of the barrier part 3710 on the substrate 300 overlaps the orthographic projection of the channel region T2a-c of the oxide transistor on the substrate 300. The orthographic projection of the barrier part 3710 on the substrate 300 overlaps at least part of the orthographic projection of the recessed region 108a on the substrate 300. The barrier part 3710 is filled in the recessed region 108a. The H element in the film encapsulation technology is blocked.

In the present disclosure, the first planarization layer is thinned around the channel region of the oxide transistor in the array substrate, and a recessed region on a side of the channel region of the oxide transistor is prepared. Thus, when preparing the barrier part on the first planarization layer, the barrier part can also be filled in the recessed region while covering the channel region of the oxide transistor. That is, the barrier part is formed around the channel region of the oxide transistor. In other words, the barrier part helps to protect the channel region of the oxide transistor. In an embodiment of the present disclosure, the aforementioned recessed region is prepared on the first planarization layer, and then the recessed region is filled with a barrier part. In this way, the H element can be blocked from entering the channel region of the oxide transistor or the path of the H element entering the channel region of the oxide transistor can be extended, so as to improve the channel stability of the oxide transistor.

It should be noted that, the channel region mentioned in embodiments of the present disclosure refers to a region located between the source doped region and the drain doped region in the semiconductor layer (usually called the active layer) of the transistor.

For example, as shown in FIG. 13, the aforementioned barrier part 3710 and the first planarization layer 108 may be in direct contact. That is, after the first planarization layer 108 is fabricated on the substrate 300, a film including the barrier part 3710 is formed immediately. In other words, the barrier part 3710 and the first planarization layer 108 do not contain other film layers.

In some embodiments of the present disclosure, the orthographic projection of the recessed region 108a on the substrate 300 may surround the orthographic projection of the channel region T2a-c of the oxide transistor on the substrate 300, as shown in FIG. 13. That is, the recessed region 108a may be a annular region. It should be understood that the recessed region 108a is not limited to an annular shape, and surrounding around the channel region T2a-c of the oxide transistor. Alternatively, the recessed region 108a may be only provided at one side, two sides, three sides, etc. of the channel region T2a-c of the oxide transistor.

Optionally, the orthographic projection of the recessed region 108a on the substrate 300 may surround the orthographic projection of the oxide semiconductor layer 340 on the substrate 300.

Optionally, at least part of the orthographic projection of the recessed region 108a on the substrate 300 may coincide with the boundary of the orthographic projection of the oxide semiconductor layer 340 on the substrate 300.

Optionally, the orthographic projection of the channel region of the oxide transistor on the substrate may be located within the orthographic projection of the recessed region on the substrate. That is, the recessed region of the first planarization layer completely covers the channel region of the oxide transistor, and the orthographic projection area of the recessed region of the first planarization layer on the substrate is larger than the orthographic projection area of the channel region of the oxide transistor on the substrate.

It should be noted that the oxide semiconductor layer 340 in an embodiment of the present disclosure may include the oxide semiconductor pattern layer of at least one pixel circuit. The oxide semiconductor pattern layer of each pixel circuit may be used to form a channel region of an oxide transistor, or the channel regions of two oxide transistors, or more.

In some embodiments of the present disclosure, the distance in the horizontal direction between the inner annular surface of the aforementioned recessed region 108a and an edge of the channel region of the oxide transistor may be from 0.5 μm to 7 μm, for example, 0.5 μm, 1.5 μm, 2.5 μm, 3.5 μm, 4.5 μm, 5.5 μm, 6.5 μm, 7 μm, etc. On the one hand, such design helps to alleviate problems such as that the performance of the oxide transistor is affected due to the recessed region 108a being too close to the channel region T2a-c of the oxide transistor. On the other hand, this helps to alleviate a situation where the pixel density (PPI) is affected due to the recessed region 108a being too far from the channel region T2a-c of the oxide transistor. That is, while protecting the performance of the oxide transistor, the resolution of the display product can be also ensured.

It should be noted that the horizontal direction mentioned in embodiments of the present disclosure is a direction perpendicular to the thickness direction of the substrate.

It should be understood that the distance in the horizontal direction between the inner annular surface of the recessed region and the edge of the channel region of the oxide transistor is not limited to the aforementioned value range, and it may also be in other value ranges, as long as the resolution of the display product is ensured while still maintaining the performance of the oxide transistor.

In some embodiments of the present disclosure, the inner annular surface (i.e., the side close to the channel region) of the recessed region 108a and the outer annular surface (i.e., the side away from the channel region) of the recessed region 108a are separated in a horizontal direction by a spacing from 1 μm to 7 μm. That is, the width of the recessed region 108a may be from 1 μm to 7 μm, such as 1 μm, 2 μm, 3 μm, 4 μm, 5 μm, 6 μm, 7 μm, etc., but not limited thereto. On the one hand, such design helps to avoid a case where the recessed region 108a is too small to prevent the barrier part 3710 from being formed in the recessed region 108a. On the other hand, this also helps to avoid a case where the recessed region 108a is too wide rendering limited spaces for other structure.

It should be understood that the width of the recessed region is not limited to the aforementioned value ranges, but may also be in other value ranges, as long as the barrier part can be deposited in the recessed region, and impacts on other structures can be avoided.

In some embodiments of the present disclosure, the recessed region 108a may include a groove structure, and at this annular structure, the ratio of the remaining thickness of the first planarization layer 108 to the groove depth of the groove structure may be greater than 0 and less than or equal to 3. That is, there is still a portion of the first planarization layer 108 remaining at the recessed region 108a. Thus, while extending the path of the H element entering the channel region of the oxide transistor, improvements can be also achieved about effects of the recessed region 108a on other layers under the first planarization layer 108 during the fabrication process.

It should be noted that the surface of the first planarization layer 108a away from the substrate 300 is the top surface of the first planarization layer 108a. When the recessed region 108a includes a groove structure, the top surface of the first planarization layer 108a located at the recessed region 108a is separated from the substrate 300 by a distance smaller than the distance between the top surface of the first planarization layer 108a at other partial regions and the substrate 300, thereby forming a groove structure.

Optionally, at the groove structure, the ratio of the remaining thickness of the first planarization layer 108 to the groove depth of the groove structure may be less than or equal to 1. Further, the ratio of the remaining thickness of the first planarization layer 108 to the groove depth of the groove structure may be less than or equal to one-half. This helps to further lengthen the path of the H element entering the channel region of the oxide transistor. But the present disclosure is not limited thereto, depending on the specific situations.

It should be noted that when the recessed region surrounds the channel region of the oxide transistor, the depth of the groove structure may be deepened. The path of the H element entering the channel region of the oxide transistor may be extended without affecting other film layers. When the orthographic projection of the channel region of the oxide transistor on the substrate is located within the orthographic projection of the recessed region on the substrate, the barrier layer may be avoided from being too close to the channel region of the oxide transistor thus causing influences on the performance of the oxide transistor, while entry of the H element into the channel region of the oxide transistor is still relieved. Specifically, at the groove structure, the ratio of the remaining thickness of the first planarization layer to the groove depth of the groove structure may be controlled according to the actual situations.

For example, at the groove structure, the sum of the remaining thickness of the first planarization layer 108 and the groove depth of the groove structure may be from 1 μm to 3 μm, such as 1 μm, 1.5 μm, 2 μm, 2.5 μm, 3 μm and so on.

It should be understood that the sum of the remaining thickness of the first planarization layer 108 and the groove depth of the groove structure is not limited to the value ranges mentioned above, and may also be in other value ranges, as long as the product performance can be guaranteed.

In addition, it should also be understood that the recessed region 108a in an embodiment of the present disclosure is not limited to include the aforementioned groove structure. As permitted by the fabrication process, the recessed region 108a may also be a through hole structure. That is, there is no first planarization layer at the through hole structure, and the barrier part located at the through hole structure may be in contact with the film layers under the first planarization layer.

In an embodiment of the present disclosure, as shown in FIG. 13, the recessed region 108a has a certain slope angle. That is, in a direction from the side of the first planarization layer close to the substrate toward the side of the first planarization layer away from the substrate, the width of the recessed region gradually increases. It should be noted that the value range of the width of the aforementioned recessed region may be the value range of its maximum width, and the distance in the horizontal direction between the inner annular surface of the recessed region and the edge of the channel region of the oxide transistor may be the minimum distance between the inner annular surface of the recessed region and the edge of the channel region of the oxide transistor. But it should be noted that the slope angle of the recessed region in an embodiment of the present disclosure is not too large, so that the difference between the maximum width of the recessed region and the minimum width of the recessed region is negligible, depending on the specific situations.

The orthographic projection of the aforementioned recessed region on the substrate may be a rectangular ring, but not limited to this. It may also be a circular ring, an elliptical ring, or other polygonal rings, depending on the specific situations.

In some embodiments of the present disclosure, the plurality of transistors mentioned above are not limited to include an oxide transistor, but may also include a silicon semiconductor transistor. That is, the array substrate not only includes the aforementioned oxide semiconductor layer, but also includes a silicon semiconductor layer. The silicon semiconductor layer is located on the side of the oxide semiconductor layer close to the substrate, and is insulated and isolated from the oxide semiconductor layer. The silicon semiconductor layer includes the channel region of the silicon semiconductor transistor.

It should be noted that, in order to alleviate influences of the H element on the oxide channel region, the present disclosure is not limited to the aforementioned formation of an annular groove or annular through hole on the first planarization layer, and such influences may also be alleviated by changing the arrangement or design of the pixel circuit in the array substrate.

Various embodiments of the present disclosure capable of alleviating influences of the H element on the oxide channel region will be described in detail below with reference to the accompanying drawings.

Embodiment 1

Figure 2:
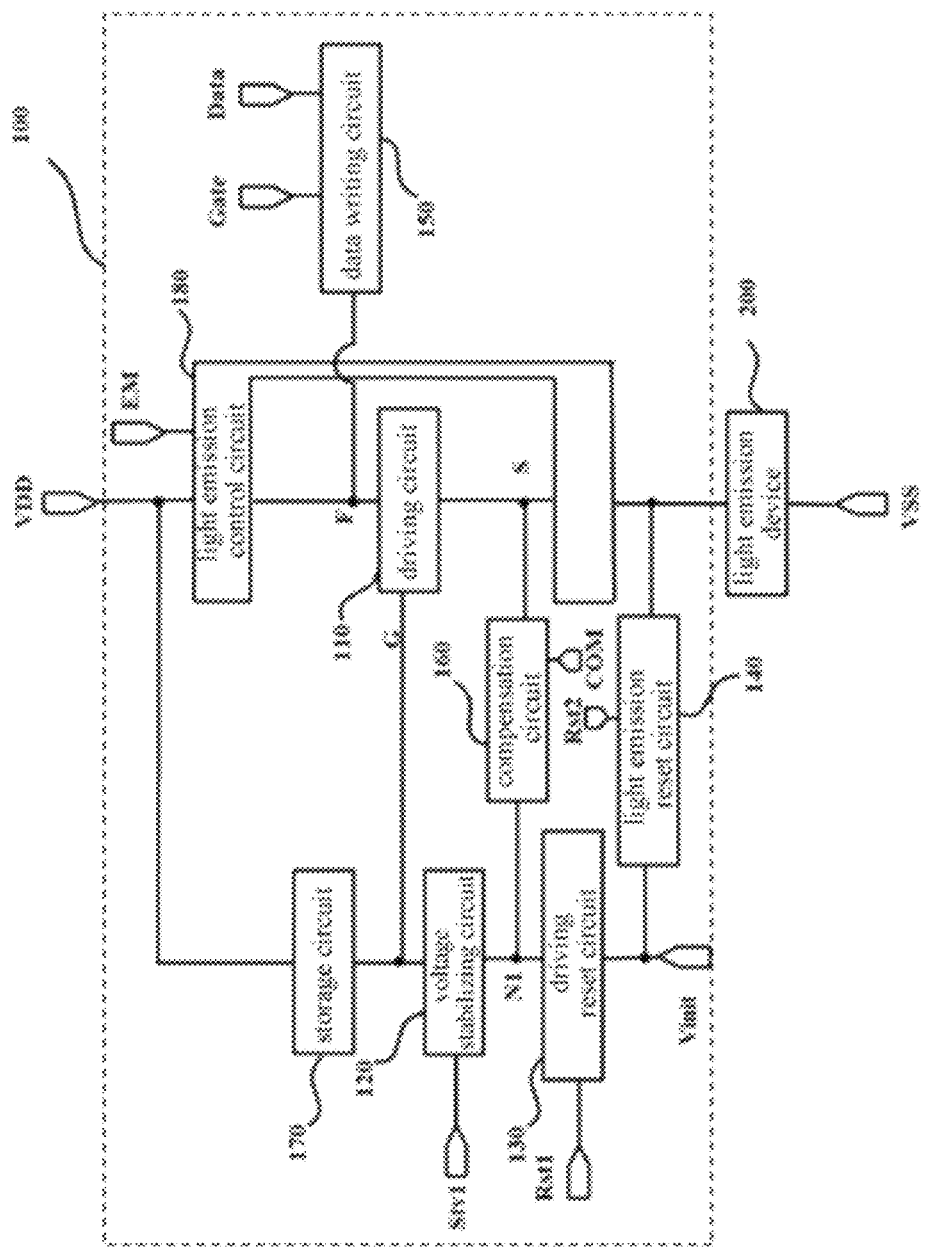
FIG. 2 shows a schematic block diagram of a sub-pixel according to Embodiment 1 of the present disclosure.

FIG. 2 shows a schematic block diagram of a sub-pixel according to Embodiment 1 of the present disclosure. As shown in FIG. 2, the sub-pixel SPX includes a pixel circuit 100 and a light emission device 200. The pixel circuit 100 includes: a driving circuit 110, a voltage stabilizing circuit 120, a driving reset circuit 130, a light emission reset circuit 140, a data writing circuit 150, a compensation circuit 160, a storage circuit 170 and a light emission control circuit 180.

As shown in FIG. 2, the driving circuit 110 includes a control terminal G, a first terminal F and a second terminal S. The driving circuit 110 is configured to provide a driving current to the light emission device 200 under the control of a control signal from the control terminal G.

The voltage stabilizing circuit 120 is coupled to the control terminal G of the driving circuit 110, the first node N1 and the voltage stabilizing control signal input terminal Stv1. The voltage stabilizing circuit 120 is configured to enable a conduction between the control terminal G of the driving circuit 110 and the first node N1 under the control of the voltage stabilizing control signal from the voltage stabilizing control signal input terminal Stv1, so as to reduce the leakage current of the driving circuit 110 via the voltage stabilizing circuit 120.

The driving reset circuit 130 is coupled to the driving reset control signal input terminal Rst1, the first node N1 and the driving reset voltage terminal Vinit1. The driving reset circuit 130 is configured to provide the reset voltage from the driving reset voltage terminal Vinit1 to the voltage stabilizing circuit 120 under the control of the driving reset control signal from the driving reset control signal input terminal Rst1, so as to reset the control terminal G of the driving circuit 110.

The light emission reset circuit 140 is coupled to the light emission reset control signal input terminal Rst2, the light emission device 200, and the light emission reset voltage terminal Vinit2. In an embodiment of the present disclosure, the light emission reset voltage terminal Vinit2 and the driving reset voltage terminal Vinit1 may be the same reset voltage terminal. Further, the light emission reset circuit 140 is also coupled to the light emission control circuit 180. The light emission reset circuit 140 is configured to provide the reset voltage from the driving reset voltage terminal Vinit to the light emission device 200 under the control of the light emission reset control signal from the light emission reset control signal input terminal Rst2, so as to reset the anode of the light emission device 200.

In an embodiment of the present disclosure, the driving reset control signal from the driving reset control signal input terminal Rst1 and the light emission reset control signal from the light emission reset control signal input terminal Rst2 may be the same signal.

The data writing circuit 150 is coupled to the data signal input terminal Data, the scan signal input terminal Gate and the first terminal F of the driving circuit 110. The data writing circuit 150 is configured to provide the data signal from the data signal input terminal Data to the first terminal F of the driving circuit 110 under the control of the scan signal from the scan signal input terminal Gate.

The compensation circuit 160 is coupled to the second terminal S of the driving circuit 110, the first node N1 and the compensation control signal input terminal Com. The compensation circuit 160 is configured to perform threshold compensation on the driving circuit 110 according to the compensation control signal from the compensation control signal input terminal Com.

In an embodiment of the present disclosure, the scan signal from the scan signal input terminal Gate and the compensation control signal from the compensation control signal input terminal Com may be the same signal.

The storage circuit 170 is coupled to the first power voltage terminal VDD and the control terminal G of the driving circuit 110. The storage circuit 170 is configured to store the voltage difference between the first power voltage terminal VDD and the control terminal G of the driving circuit 110.

The light emission control circuit 180 is coupled to the light emission control signal input terminal EM, the first power voltage terminal VDD, the first terminal F and the second terminal S of the driving circuit 110, the light emission reset circuit 140, and the light emission device 200. The light emission control circuit 180 is configured to apply the first power voltage from the first power voltage terminal VDD to the driving circuit 110 under the control of the light emission control signal from the light emission control signal input terminal EM, and to apply the driving current generated by the driving circuit 110 to the light emission device 200.

The light emission device 200 is coupled to the second power voltage terminal VSS, the light emission reset circuit 140 and the light emission control circuit 180. The light emission device 200 is configured to emit light under the driving by the driving current generated by the driving circuit 110. For example, the light emission device 200 may be a light emitting diode or the like. The light emitting diode may be an organic light emitting diode (OLED), a quantum dot light emitting diode (QLED), or the like.

In an embodiment of the present disclosure, the voltage stabilizing control signal, the scan signal, the driving reset control signal, the light emission reset control signal, the compensation control signal, the light emission control signal, and the compensation control signal may be square waves. The value range of the high level may be from 0 to 15V, and the value range of the low level is from 0 to −15V. For example, the high level is 7V, and the low level is −7V. The value range of the data signal may be from 0 to 8V, for example, from 2 to 5V. The value range of the first power voltage Vdd may be from 3 to 6V. The value range of the second power voltage Vss may be from 0 to −6V.

Alternatively, in some embodiments of the present disclosure, the driving reset control signal Rst1 provided to the driving reset circuit 130 and the light emission reset control signal Rst2 provided to the light emission reset circuit 140 may be different. Specifically, considering the influence of the driving reset voltage on data writing and compensation, the influence of energy consumption of the storage capacitor C, and hardware limitations of the power supply, the value range of the driving reset voltage may be from −1 to −5V, for example, −3V. This helps to shorten the time required for data writing and compensation, while still keeping the low power consumption of the circuit, thereby improving the compensation effect in a fixed time period, and thus improving the display effect. Specifically, when the range of the second power voltage Vss is from 0 to −6V, the value range of the light emission reset voltage may be from −2 to −6V, for example, being equal to the second power voltage Vss, which is from 0 to −6V. This helps to reduce the charging time of the PN junction before the OLED is turned on, and to reduce the response time of the OLED to the light emission signal. When the required brightness is consistent, the probability of different OLED brightness is reduced, thereby improving brightness uniformity, reducing low-frequency Flicker and low grayscale Mura (i.e., uneven brightness).

It should be noted that the aforementioned driving circuit 110, voltage stabilizing circuit 120, driving reset circuit 130, light emission reset circuit 140, data writing circuit 150 and compensation circuit 160 all include at least one transistor.

Figure 3:
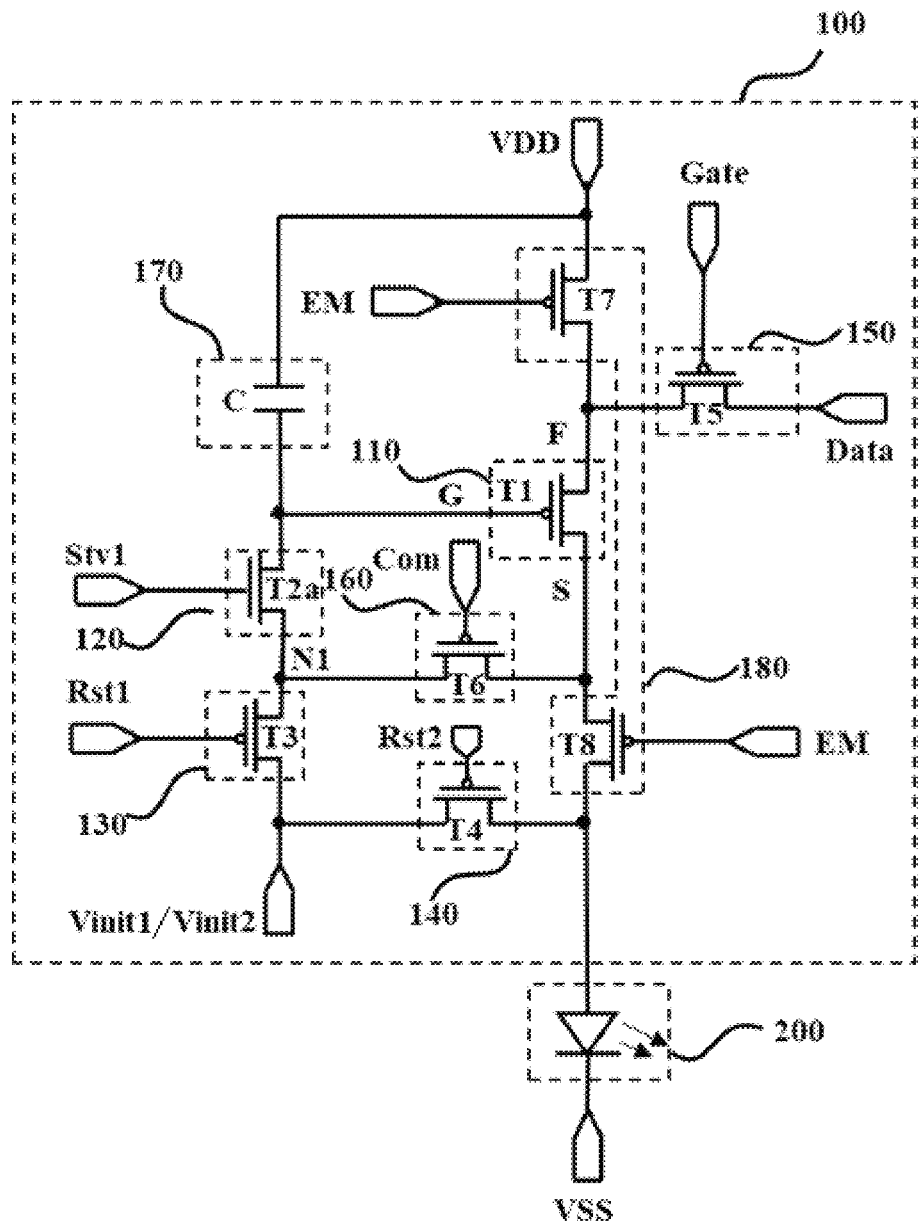
FIG. 3 shows a schematic diagram of the pixel circuit in FIG. 2.

FIG. 3 shows a schematic diagram of the pixel circuit 100 in FIG. 2. As shown in FIG. 3, the driving circuit 110 includes a driving transistor T1, the voltage stabilizing circuit 120 includes a voltage stabilizing transistor T2a, the driving reset circuit 130 includes a driving reset transistor T3, the light emission reset circuit 140 includes a light emission reset transistor T4, the data writing circuit 150 includes a data writing transistor T5, the compensation circuit 160 includes a compensation transistor T6, and the storage circuit 170 includes a storage capacitor C. The light emission control circuit 180 includes a first light emission control transistor T7 and a second light emission control transistor T8.

As shown in FIG. 3, the first terminal of the driving transistor T1 is coupled to the first terminal F of the driving circuit 110, the second terminal of the driving transistor T1 is coupled to the second terminal S of the driving circuit 110, and the gate of the driving transistor T1 is coupled to the control terminal G of the driving circuit 110.

The first terminal of the voltage stabilizing transistor T2a is coupled to the control terminal G of the driving circuit 110, the gate of the voltage stabilizing transistor T2a is coupled to the voltage stabilizing control signal input terminal Stv1, and the second terminal of the voltage stabilizing transistor T2a is coupled to the first node N1.

The first terminal of the driving reset transistor T3 is coupled to the driving reset voltage terminal Vinit1, the gate of the driving reset transistor T3 is coupled to the driving reset control signal input terminal Rst1, and the second terminal of the driving reset transistor T3 is coupled to the first node N1.

The first terminal of the light emission reset transistor T4 is coupled to the light emission reset voltage terminal Vinit2, the gate of the light emission reset transistor T4 is coupled to the light emission reset control signal input terminal Rst2, and the second terminal of the light emission reset transistor T4 is coupled to the anode of the light emission device 200. Further, the second terminal of the light emission reset transistor T4 is also coupled to the second terminal of the second light emission control transistor T8.

The first terminal of the data writing transistor T5 is coupled to the data signal input terminal Data, the gate of the data writing transistor T5 is coupled to the scanning signal input terminal Gate, and the second terminal of the data writing transistor T5 is coupled to the first terminal of the driving circuit 110.

The first terminal of the compensation transistor T6 is coupled to the second terminal S of the driving circuit 110, the gate of the compensation transistor T6 is coupled to the compensation control signal input terminal Com, and the second terminal of the compensation transistor T6 is coupled to the first node N1.

The first terminal of the storage capacitor C is coupled to the first power voltage terminal VDD, and the second terminal of the storage capacitor C is coupled to the control terminal G of the driving circuit 110. The storage capacitor is configured to store the voltage difference between the first power voltage terminal VDD and the control terminal G of the driving circuit 110.

The first terminal of the first light emission control transistor T7 is coupled to the first power voltage terminal VDD, the gate of the first light emission control transistor T7 is coupled to the light emission control signal input terminal EM, and the second terminal of the first light emission control transistor T7 is coupled to the first terminal F of the driving circuit 110.

The first terminal of the second light emission control transistor T8 is coupled to the second terminal S of the driving circuit 110, the gate of the second light emission control transistor T8 is coupled to the light emission control signal input terminal EM, and the second terminal of the second light emission control transistor T8 is coupled to the anode of the light emission device 200.

In an embodiment of the present disclosure, the voltage stabilizing transistor T2a may be the aforementioned oxide transistor. That is, the active layer of the voltage stabilizing transistor T2a may include an oxide semiconductor material, such as a metal oxide semiconductor material. It should be understood that, the aforementioned recessed region 108a (as shown in FIG. 13) may be formed around the channel region of the voltage stabilizing transistor T2a. The driving transistor T1, the driving reset transistor T3, the data writing transistor T5, the light emission reset transistor T4, the compensation transistor T6, the first light emission control transistor T7 and the second light emission control transistor T8 may be the aforementioned silicon semiconductor transistors. That is to say, active layers of the driving transistor T1, the driving reset transistor T3, the data writing transistor T5, the light emission reset transistor T4, the compensation transistor T6, the first light emission control transistor T7 and the second light emission control transistor T8 may include silicon semiconductor materials.

In an embodiment of the present disclosure, the voltage stabilizing transistor T2a may be an N-type transistor. The driving transistor T1, the driving reset transistor T3, the data writing transistor T5, the light emission reset transistor T4, the compensation transistor T6, the first light emission control transistor T7 and the second light emission control transistor T8 may be P-type transistors.

In addition, it should be noted that the transistors used in embodiments of the present disclosure may all be P-type transistors or N-type transistors. It is only necessary to connect terminals of a transistor of the selected type with reference to terminals of the respective transistor in embodiments of the present disclosure, and provide the respective voltage terminal with a corresponding high voltage or low voltage. For example, for an N-type transistor, the input terminal is the drain, the output terminal is the source, and the control terminal is the gate. For a P-type transistor, the input terminal is the source, the output terminal is the drain, and the control terminal is the gate. For different types of transistors, the level of the control signal at the control terminal is also different. For example, for an N-type transistor, when the control signal is at a high level, the N-type transistor is in an on state. When the control signal is at a low level, the N-type transistor is in an off state. For a P-type transistor, when the control signal is at a low level, the P-type transistor is in an on state. When the control signal is at a high level, the P-type transistor is in an off state. The oxide semiconductor may include, for example, Indium Gallium Zinc Oxide (IGZO). The silicon semiconductor material may include Low Temperature PolySilicon (LTPS) or amorphous silicon (such as, hydrogenated amorphous silicon). Low Temperature PolySilicon generally refers to a case where the crystallization temperature at which polysilicon is obtained by crystallization of amorphous silicon is lower than 600 degrees Celsius.

Figure 4:
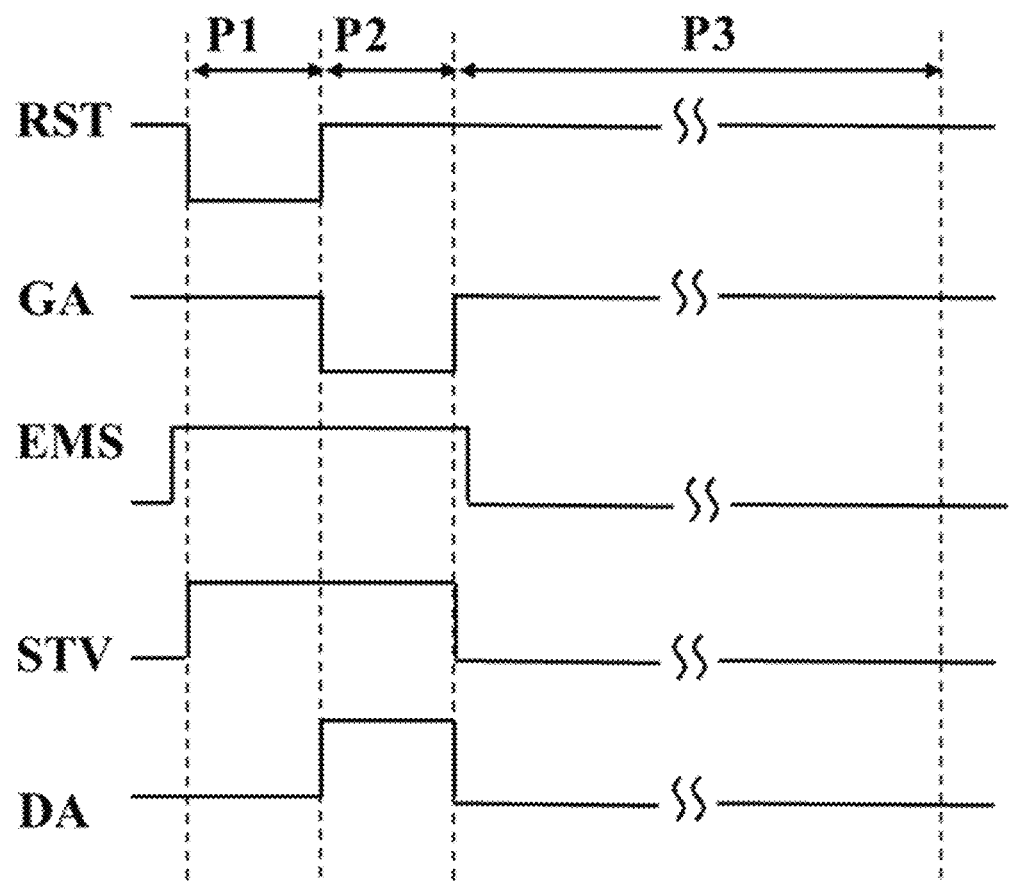
FIG. 4 is a timing diagram of signals driving the pixel circuit in FIG. 3.

FIG. 4 is a timing diagram of signals driving the pixel circuit of FIG. 3. As shown in FIG. 3, the working process of the pixel circuit 100 includes three stages, namely a first stage P1, a second stage P2 and a third stage P3.

In the following, an example is described. The light emission reset control signal and the driving reset control signal are the same signal, that is, the reset control signal RST. The compensation control signal and the scan signal are the same signal GA. The voltage stabilizing transistor T2a is an N-type transistor. The driving transistor T1, the driving reset transistor T3, the data writing transistor T5, the light emission reset transistor T4, the compensation transistor T6, the first light emission control transistor T7 and the second light emission control transistor T8 are P-type transistors. The working process of the pixel circuit in FIG. 4 will be described with reference to FIG. 3.

As shown in FIG. 4, in the first stage P1, a low-level reset control signal RST, a high-level scan signal GA, a high-level light emission control signal EMS, a high-level voltage stabilizing control signal STV and a low-level data signal DA are input. As shown in FIG. 4, the rising edge of the light emission control signal EMS is earlier than the starting point of the first stage P1, that is, earlier than the rising edge of the voltage stabilizing control signal STV. But the present disclosure is not limited to this, and the two rising edges may also be the same.

In the first stage P1, the gate of the driving reset transistor T3 receives the low-level driving reset control signal RST, and the driving reset transistor T3 is turned on, thereby applying the reset voltage VINT1 to the first node N1. The gate of the voltage stabilizing transistor T2a receives the high-level voltage stabilizing control signal STV, and the voltage stabilizing transistor T2a is turned on, thereby applying the reset voltage VINT1 at the first node N1 to the gate of the driving transistor T1. Thus, the gate of the driving transistor T1 is reset, so that the driving transistor T1 is ready for writing data in the second stage P2.

In the first stage P1, the gate of the light emission reset transistor T4 receives the high-level light emission control signal EMS, and the light emission reset transistor T4 is turned on, thereby applying the reset voltage VINT to the anode of OLED to reset the anode of OLED. Thus, the OLEDs do not emit light until the third stage P3.

In addition, in the first stage P1, the gate of the data writing transistor T5 receives the high-level scan signal GA, and the data writing transistor T5 is turned off. The gate of the compensation transistor T6 receives the high-level scan signal GA, and the compensation transistor T6 is turned off. The gate of the first light emission control transistor T7 receives the high-level light emission control signal EMS, and the first light emission control transistor T7 is turned off. The gate of the second light emission control transistor T8 receives the high-level light emission control signal EMS, and the second light emission control transistor T8 is turned off.

In the second stage P2, a high-level reset control signal RST, a low-level scan signal GA, a high-level light emission control signal EMS, a high-level voltage stabilizing control signal STV and a high-level data signal DA are input.

In the second stage P2, the gate of the data writing transistor T5 receives the low-level scan signal GA, and the data writing transistor T5 is turned on, thereby writing the high-level data signal DA to the first terminal of the driving transistor T1, that is, the first terminal F of the driving circuit 110. The gate of the compensation transistor T6 receives the low-level scan signal GA, and the compensation transistor T3 is turned on, thereby writing the high-level data signal DA of the first terminal F into the first node N1. The gate of the voltage stabilizing transistor T2a receives the high-level voltage stabilizing control signal STV, and the voltage stabilizing transistor T2a is turned on, thereby writing the high-level data signal DA of the first node N1 into the gate of the driving transistor T1, that is, the control terminal G of the driving circuit 110. Since the data writing transistor T5, the driving transistor T1, the compensation transistor T6 and the voltage stabilizing transistor T2a are all turned on, the data signal DA passes through the data writing transistor T5, the driving transistor T1, the compensation transistor T6 and the voltage stabilizing transistor T2a to charge the storage capacitor C again. That is, the gate of the driving transistor T1 is charged, meaning that the control terminal G is charged. Thus, the voltage at the gate of the driving transistor T1 is gradually increased.

It may be understood that, in the second stage P2, since the data writing transistor T5 is turned on, the voltage of the first terminal F remains at Vda. Meanwhile, according to the characteristics of the driving transistor T1, when the voltage of the control terminal G rises to Vda+Vth, the driving transistor T1 is turned off, and the charging process ends. Here, Vda represents the voltage of the data signal DA, and Vth represents the threshold voltage of the driving transistor T1. Since the driving transistor T1 being a P-type transistor is taken as an example in an embodiment of the present disclosure, the threshold voltage Vth here may be a negative value.

After the second stage P2, the voltage at the gate of the driving transistor T1 is Vda+Vth. That is to say, the voltage information about the data signal DA and the threshold voltage Vth is stored in the storage capacitor C, for compensating the threshold voltage of the driving transistor T1 in the subsequent third stage P3.

In addition, in the second stage P2, the gate of the driving reset transistor T3 receives the high-level reset control signal RST, and the driving reset transistor T3 is turned off. The gate of the light emission reset transistor T4 receives the high-level reset control signal RST, and the light emission reset transistor T4 is turned off. The gate of the first light emission control transistor T7 receives the high-level light emission control signal EMS, and the first light emission control transistor T7 is turned off. The gate of the second light emission control transistor T8 receives the high-level light emission control signal EMS, and the second light emission control transistor T8 is turned off.

In the third stage P3, a high-level reset control signal RST, a high-level scan signal GA, a low-level light emission control signal EMS, a low-level voltage stabilizing control signal STV and a low-level data signal DA are input. As shown in FIG. 4, in an embodiment of the present disclosure, the low-level light emission control signal EMS may be a low-level valid pulse width modulation signal. As shown in FIG. 4, the falling edge of the light emission control signal EMS is later than the end point of the second stage P1, that is, later than the falling edge of the voltage stabilizing control signal STV. But the present disclosure is not limited to this, and the two falling edges may also fall at the same time.

The gate of the voltage stabilizing transistor T2a receives the low-level voltage stabilizing control signal STV, and the voltage stabilizing transistor T2a is turned off. In an embodiment of the present disclosure, when the voltage stabilizing transistor T2a is an NMOS transistor, and the voltage stabilizing transistor T2a is switched from an on state to an off state, the first and second terminals of the voltage stabilizing transistor T2a release negative charges.

The gate of the compensation transistor T6 receives the high-level scan signal, and the compensation transistor T6 is turned off. In an embodiment of the present disclosure, when the compensation transistor T6 is a PMOS transistor, and the compensation transistor T6 is switched from an on state to an off state, the first and second terminals of the compensation transistor T6 release positive charges.

In addition, the gate of the first light emission control transistor T7 receives the light emission control signal EMS. According to an embodiment of the present disclosure, the light emission control signal EMS may be pulse width modulated. When the light emission control signal EMS is at a low level, the first light emission control transistor T7 is turned on, so that the first power voltage Vdd is applied to the first terminal F. The gate of the second light emission control transistor T8 receives the light emission control signal EMS. When the light emission control signal EMS is at a low level, the second light emission control transistor T8 is turned on, thereby applying the driving current generated by the driving transistor T1 to the anode of OLED.

In addition, the active layer of the voltage stabilizing transistor T2a includes an oxide semiconductor material, and the leakage current thereof is from 10-16 A to 10-19 A. Compared with the single-gate low temperature polysilicon transistor and the double-gate low temperature polysilicon transistor, the leakage current is smaller, so that the electrical leakage of the storage circuit may be further reduced to improve the brightness uniformity.

In addition, in the third stage P3, the gate of the light emission reset transistor T4 receives the high-level reset control signal RST, and the light emission reset transistor T4 is turned off. The gate of the driving reset transistor T3 receives the high-level reset control signal RST, and the driving reset transistor T3 is turned off. The gate of the data writing transistor T5 receives the high-level scan signal GA, and the data writing transistor T5 is turned off.

It is easy to understand that in the third stage P3, since the first light emission control transistor T7 is turned on, the voltage of the first terminal F is the first power voltage Vdd, and the voltage of the control terminal G is Vda+Vth, so that the driving transistor T1 is also turned on.

In the third stage P3, anode and cathode of the OLED are respectively provided with the first power voltage Vdd (high voltage) and the second power voltage Vss (low voltage), so as to emit light due to driving by the driving current generated by the driving transistor T1.

Based on the saturation current formula of the driving transistor T1, the driving current ID for driving the OLED to emit light may be obtained according to the following formulas:

$$ID = K(VGS - Vth)2$$

$$K[(Vda + Vth - Vdd) - Vth]2$$

$$K(Vda - Vdd)2.$$

In the above formulas, Vth represents the threshold voltage of the driving transistor T1, VGS represents the voltage between the gate and the source of the driving transistor T1, and K is a constant. It may be seen from the above formulas that the driving current ID flowing through the OLED is no longer related to the threshold voltage Vth of the driving transistor T1, but only related to the voltage Vda of the data signal DA, so that the threshold voltage Vth of the driving transistor T1 may be compensated. This solves the problem of threshold voltage drift of the driving transistor T1 caused by the processing procedure and the long-term operation, and eliminates its influence on the driving current ID, thereby improving the display effect.

For example, K in the above formulas may be expressed as:

$$K=0.5nCox(W/L),$$

where, n is the electron mobility of the driving transistor T1, Cox is the gate unit capacitance of the driving transistor T1, W is the channel width of the driving transistor T1, and L is the channel length of the driving transistor T1.

It should be noted that the relationship between the reset control signal RST, the scan signal GA, the light emission control signal EMS, the voltage stabilizing control signal STV, the data signal DA, and each stage is only illustrative. The high-level or low-level durations of the reset control signal RST, the scan signal GA, the light emission control signal EMS, the voltage stabilizing control signal STV, and the data signal DA are only illustrative.

FIG. 5-11 illustrate schematic plan views of layers in an array substrate according to embodiments of the present disclosure. A pixel circuit as shown in FIG. 3 is taken as an example for description. In the pixel circuit, the compensation control signal and the scan signal GA are the same signal, and the voltage stabilizing transistor T2a is an oxide transistor.

In the following, the positional relationship among various circuits in the pixel circuit on the substrate is described with reference to FIGS. 5 to 11. Those skilled in the art will understand that the scales in FIGS. 5 to 11 are drawing scales in order to more clearly represent positions of various parts, and should not be regarded as true scales of components. Those skilled in the art can select the size of each component based on actual requirements, which is not specifically limited in the present disclosure.

In an embodiment of the present disclosure, the array substrate includes a silicon semiconductor layer 310 on the substrate 300.

Figure 5:
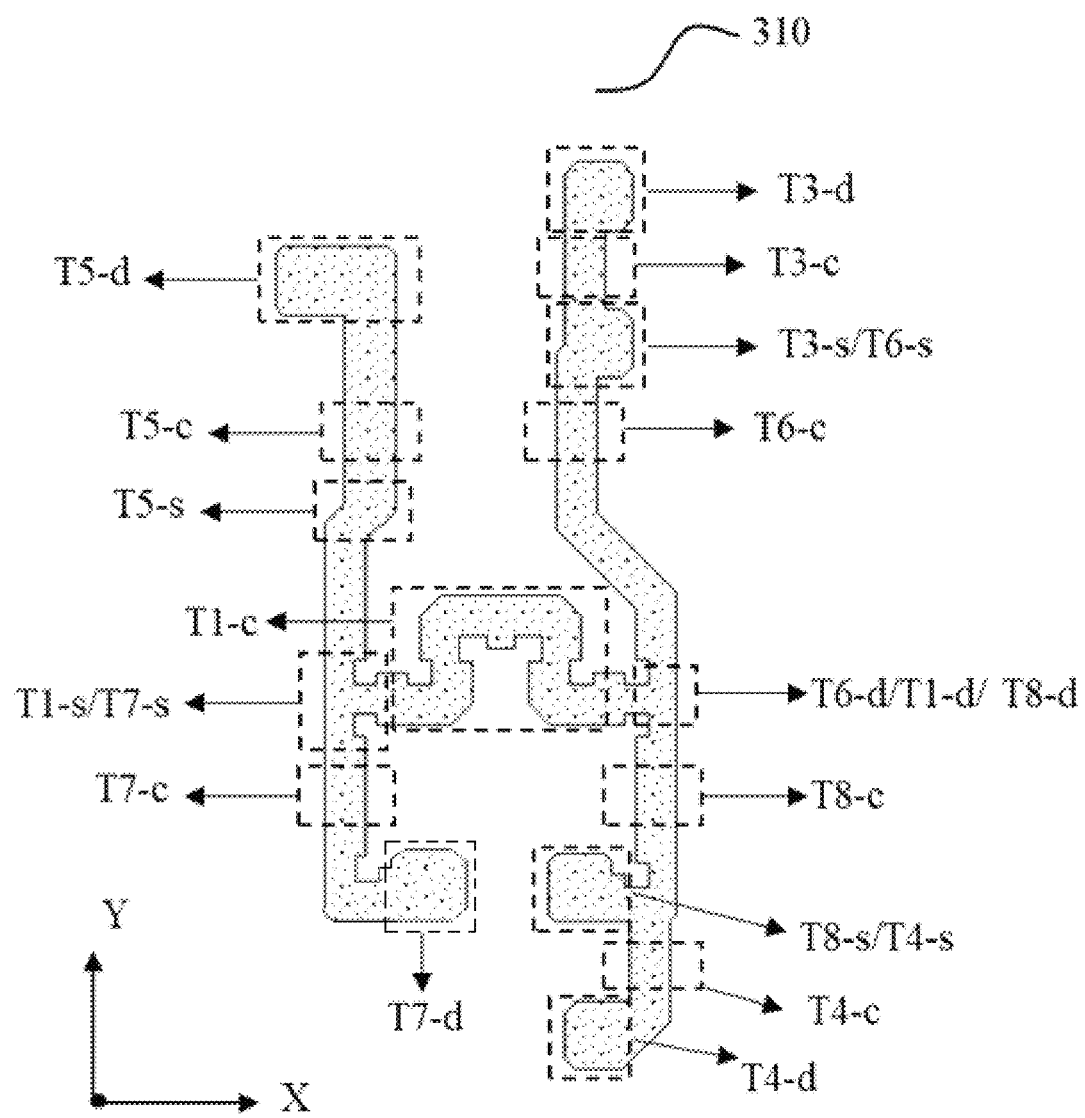
FIG. 5 shows a schematic plan view of a silicon semiconductor layer in an array substrate according to Embodiment 1 of the present disclosure.

FIG. 5 shows a schematic plan view of the silicon semiconductor layer 310 in the array substrate according to Embodiment 1 of the present disclosure. In an exemplary embodiment of the present disclosure, the driving transistor T1, the driving reset transistor T3, the light emission reset transistor T4, the data writing transistor T5, the compensation transistor T6, the first light emission control transistor T7, and the second light emission control transistor T8 in the pixel circuit are silicon transistors, such as low temperature polysilicon transistors.

In an exemplary embodiment of the present disclosure, the silicon semiconductor layer 310 may be used to form the active regions of the above-described driving transistor T1, driving reset transistor T3, light emission reset transistor T4, data writing transistor T5, compensation transistor T6, first light emission control transistor T7, and the second light emission control transistor T8. In an exemplary embodiment of the present disclosure, the silicon semiconductor layer 310 includes a channel region pattern and a doped region pattern of a transistor (i.e., first and second source/drain regions of the transistor). In an embodiment of the present disclosure, the channel region pattern and the doped region pattern of each transistor are integrally provided.

It should be noted that, in FIG. 5, a dotted line frame is used to denote regions in the silicon semiconductor layer 310 for source/drain regions and channel regions of respective transistors.

As shown in FIG. 5, the silicon semiconductor layer 310 includes the channel region T3-c of the driving reset transistor T3, the channel region T5-c of the data writing transistor T5, the channel region T6-c of the compensation transistor T6, the channel region T1-c of the driving transistor T1, the channel region T7-c of the first light emission control transistor T7, the channel region T8-c of the second light emission control transistor T8, and the channel region T4-c of the light emission reset transistor T4 in sequence along the Y direction (column direction) and the X direction (row direction).

In an exemplary embodiment of the present disclosure, the silicon semiconductor layer used for the above-described transistors may include an integrally formed low temperature polysilicon layer. The source region and the drain region of each transistor may be conductive by doping or the like, so as to realize electrical connection among various structures. That is, the silicon semiconductor layer of the transistor is an overall pattern formed by p-silicon or n-silicon, and each transistor in the same pixel circuit includes a doped region pattern (i.e., source region s and drain region d) and a channel region pattern. The active layers of different transistors are separated by doping structures.

As shown in FIG. 5, along the Y direction and the X direction, the silicon semiconductor layer 310 further includes: the drain region T3-$d$ of the driving reset transistor T3, the drain region T5-$d$ of the data writing transistor T5, the source region T3-$s$ of the driving reset transistor T3, the source region T6-$s$ of the compensation transistor T6, the source region T5-$s$ of the data writing transistor T5, the source region T1-$s$ of the driving transistor T1, the source region T7-$s$ of the first light emission control transistor T7, the drain region T6-$d$ of the compensation transistor T6, the drain region T1-$d$ of the driving transistor T1, the drain region T8-$d$ of the second light emission control transistor T8, the drain region T7-$d$ of the first light emission control transistor T7, the source region T8-$s$ of the second light emission control transistor T8, the source region T4-$s$ of the light emission reset transistor T4, and the drain region T4-$d$ of the light emission reset transistor T4.

In an exemplary embodiment of the present disclosure, the silicon semiconductor layer 310 may be formed of a silicon semiconductor material such as amorphous silicon, polysilicon, or the like. The above-mentioned source region and drain region may be regions doped with n-type impurities or p-type impurities. For example, the source regions and drain regions of the first light emission control transistor T7, the data writing transistor T5, the driving transistor T1, the compensation transistor T6, the driving reset transistor T3, the light emission reset transistor T4 and the second light emission control transistor T8 as described above are all regions doped with P-type impurities.

In an embodiment of the present disclosure, the array substrate further includes a first conductive layer 320 on a side of the silicon semiconductor layer away from the substrate.

Figure 6:
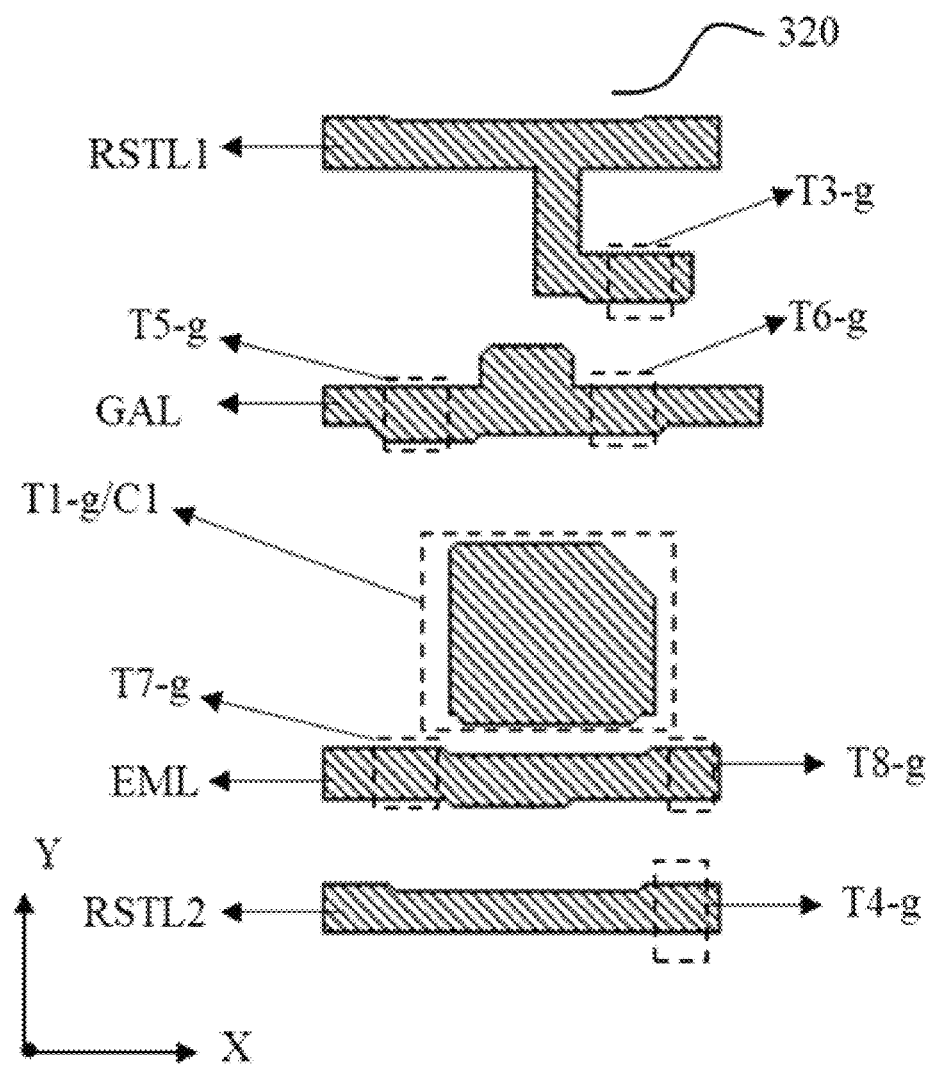
FIG. 6 shows a schematic plan view of a first conductive layer in an array substrate according to an embodiment of the present disclosure.

FIG. 6 shows a schematic plan view of the first conductive layer 320 in an array substrate according to an embodiment of the present disclosure. As shown in FIG. 6, the first conductive layer 320 includes a first reset control signal line RSTL1, a scan signal line GAL, a first terminal C1 of the storage capacitor C (the gate T1-$g$ of the driving transistor T1), a light emission control signal line EML, and a second reset control signal line RSTL2 arranged in sequence along the Y direction.

In an embodiment of the present disclosure, the light emission control signal line EML is coupled to the light emission control signal input terminal EM, and is configured to provide the light emission control signal input terminal EM with the light emission control signal EMS.

In an embodiment of the present disclosure, the scan signal line GAL is coupled to the scan signal input terminal Gate and the compensation control signal input terminal Com, and is configured to provide the scan signal GA to the scan signal input terminal Gate, and to provide the compensation control signal to the compensation control signal input terminal Com.

In an embodiment of the present disclosure, the gate T1-$g$ of the driving transistor T1 may also serve as the first terminal C1 of the storage capacitor C in an integrated structure.

In an embodiment of the present disclosure, the first reset control signal line RSTL1 is coupled to the driving reset control signal input terminal Rst1, so as to provide the reset control signal RST to the driving reset control signal input terminal Rst1.

In an embodiment of the present disclosure, referring to FIG. 5 and FIG. 6, the part where the orthographic projection of the first reset control signal line RSTL1 on the substrate overlaps the orthographic projection of the silicon semiconductor layer 310 on the substrate is the gate T3-$g$ of the driving reset transistor T3 of the pixel circuit. The part where the orthographic projection of the scan signal line GAL on the substrate overlaps the orthographic projection of the silicon semiconductor layer 310 on the substrate is the gate T5-$g$ of the data writing transistor T5 and the gate T6-$g$ of the compensation transistor T6 in the pixel circuit, respectively. The part where the orthographic projection of the first terminal C1 of the storage capacitor C in the pixel circuit on the substrate overlaps the orthographic projection of the silicon semiconductor layer 310 on the substrate is the gate T1-$g$ of the driving transistor T1 in the pixel circuit. The part where the orthographic projection of the light emission control signal line EML on the substrate overlaps the orthographic projection of the silicon semiconductor layer 310 on the substrate is the gate T7-$g$ of the first light emission control transistor T7 and the gate T8-$g$ of the second light emission control transistor T8 in the pixel circuit, respectively.

In an embodiment of the present disclosure, the second reset control signal line RSTL2 is coupled to the light emission reset control signal input terminal Rst2, so as to provide the light emission reset control signal input terminal Rst2 with the reset control signal RST.

In an embodiment of the present disclosure, the part where the orthographic projection of the second reset control signal line RSTL2 on the substrate overlaps the orthographic projection of the silicon semiconductor layer 310 on the substrate is the gate T4-$g$ of the light emission reset transistor T4 of the pixel circuit.

In an embodiment of the present disclosure, as shown in FIG. 6, in the Y direction, the gate T3-$g$ of the driving reset transistor T3, the gate T6-$g$ of the compensation transistor T6 and the gate T5-$g$ of the data writing transistor T5 are located on the first side of the gate T1-$g$ of the driving transistor T1. The gate T7-$g$ of the first light emission control transistor T7, the gate T8-$g$ of the first light emission control transistor T8, and the gate T4-$g$ of the light emission reset transistor T4 are located on the second side of the gate T1-$g$ of the driving transistor T1.

It should be noted that the first side and the second side of the gate T1-$g$ of the driving transistor T1 are two opposite sides in the Y direction of the gate T1-$g$ of the driving transistor T1. For example, as shown in FIG. 6, in the XY plane, the first side of the gate T1-$g$ of the driving transistor T1 may be the upper side of the gate T1-$g$ of the driving transistor T1. The second side of the gate T1-$g$ of the driving transistor T1 may be the lower side of the gate T1-$g$ of the driving transistor T1. In the description of the present disclosure, the "lower side" is, for example, the side of the array substrate for bonding ICs. For example, the lower side of the gate T1-$g$ of the driving transistor T1 is the side of the gate T1-$g$ of the driving transistor T1 close to ICs (not shown in the figure). The upper side is the opposite side to the lower side, such as the side of the gate T1-$g$ of the driving transistor T1 away from ICs.

More specifically, the gate T3-$g$ of the driving reset transistor T3 is located on the upper sides of the gate T6-$g$ of the compensation transistor T6 and the gate T5-$g$ of the data writing transistor T5. The gate T3-$g$ of the driving reset transistor T3 and the gate T6-g of the compensation transistor T6 overlap the gate T1-g of the driving transistor T1 in the Y direction.

In an embodiment of the present disclosure, in the X direction, as shown in FIG. 6, the gate T5-g of the data writing transistor T5 and the gate T7-g of the first light emission control transistor T7 are located at the third side of the gate T1-g of the driving transistor T1. The gate T8-g of the second light emission control transistor T8 and the gate T4-g of the light emission reset transistor T4 are located on the fourth side of the gate T1-g of the driving transistor T1.

It should be noted that the third side and the fourth side of the gate T1-g of the driving transistor T1 are two opposite sides in the X direction of the gate T1-g of the driving transistor T1. For example, as shown in FIG. 6, in the XY plane, the third side of the gate T1-g of the driving transistor T1 may be the left side of the gate T1-g of the driving transistor T1. The fourth side of the gate T1-g of the driving transistor T1 may be the right side of the gate T1-g of the driving transistor T1.

It should be noted that the active regions of the transistors shown in FIG. 6 correspond to respective regions where the first conductive layer 320 and the silicon semiconductor layer 310 overlap.

In an embodiment of the present disclosure, the array substrate further includes a second conductive layer located on a side of the first conductive layer away from the substrate and insulated from the first conductive layer.

Figure 7:
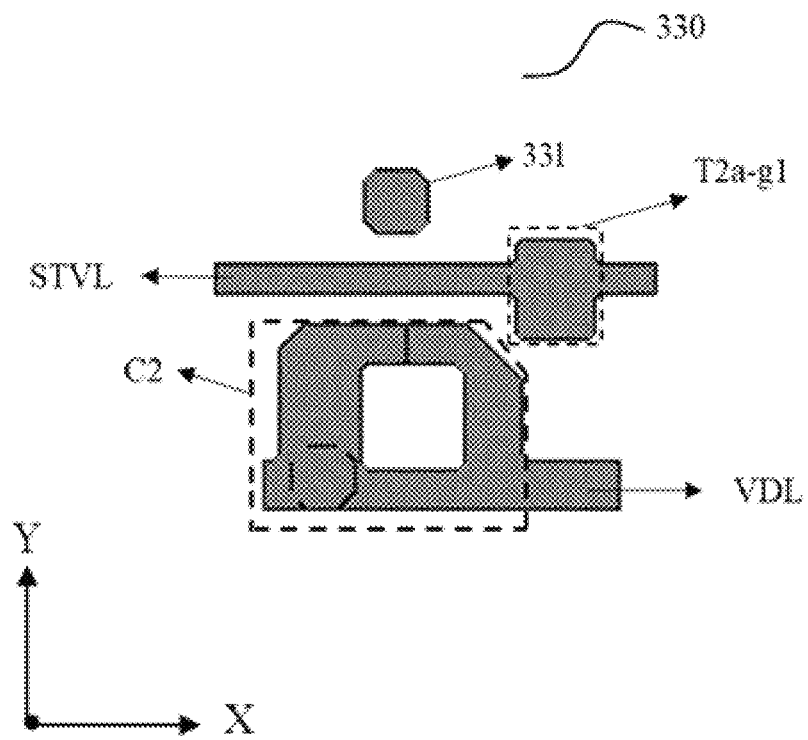
FIG. 7 shows a schematic plan view of a second conductive layer in an array substrate according to Embodiment 1 of the present disclosure.

FIG. 7 shows a schematic plan view of the second conductive layer 330 in an array substrate according to Embodiment 1 of the present disclosure. As shown in FIG. 7, the second conductive layer 330 includes a voltage stabilizing block 331, a voltage stabilizing control signal line STVL, a second terminal C2 of the storage capacitor C, and a first power voltage line VDL arranged along the Y direction.

In an embodiment of the present disclosure, referring to FIGS. 6 and 7, projections of the second terminal C2 of the storage capacitor C and the first terminal C1 of the storage capacitor C on the substrate at least partially overlap.

In an embodiment of the present disclosure, as shown in FIG. 7, the first power voltage line VDL extends along the X direction and is integrally formed with the second terminal C2 of the storage capacitor C. The first power voltage line VDL is coupled to the first power voltage terminal VDD, and is configured to provide the first power voltage Vdd thereto. The voltage stabilizing control signal line STVL is coupled to the voltage stabilizing control signal input terminal Sty, and is configured to provide the voltage stabilizing control signal STV thereto.

In an embodiment of the present disclosure, as shown in FIG. 7, in the Y direction, the voltage stabilizing control signal line STVL is located on the first side of the second terminal C2 of the storage capacitor C, and the voltage stabilizing block 331 is located at a side of the voltage stabilizing control signal line STVL away from the second terminal C2 of the storage capacitor C. The first power voltage line VDL is located on the second side of the second terminal C2 of the storage capacitor C. Similar to the above description about the first side and the second side of the gate T1-g of the driving transistor T1, the first side and the second side of the second terminal C2 of the storage capacitor C are two opposite sides in the Y direction of the second terminal C2 of the storage capacitor C. The first side of the second terminal C2 of the storage capacitor C is the upper side of the second terminal C2 of the storage capacitor C in the Y direction, and the second side of the second terminal C2 of the storage capacitor C is the lower side of the second terminal C2 of the storage capacitor C in the Y direction.

Specifically, in the Y direction, the voltage stabilizing control signal line STVL is located on the upper side of the second terminal C2 of the storage capacitor C. The first power signal line VDL is located on the lower side of the second terminal C2 of the storage capacitor C.

In an embodiment of the present disclosure, as shown in FIG. 7, the voltage stabilizing control signal line STVL is provided with the first gate terminal T2a-g1 of the voltage stabilizing transistor T2a. Details will be described below with reference to FIG. 8.

In an embodiment of the present disclosure, the array substrate further includes an oxide semiconductor layer located on a side of the second conductive layer away from the substrate and insulated from the second conductive layer.

Figure 8:
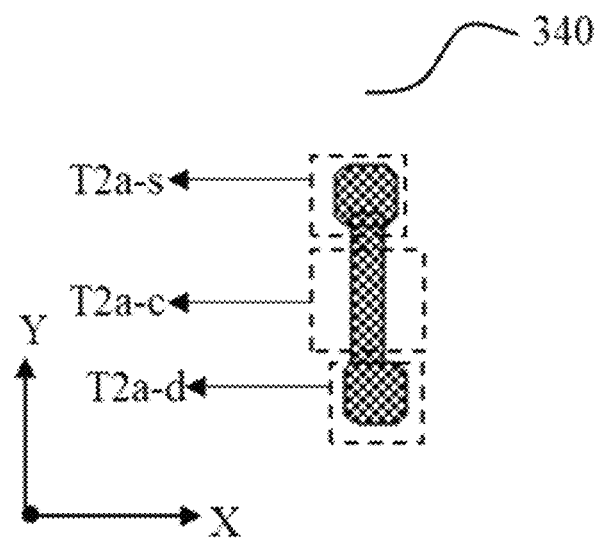
FIG. 8 shows a schematic plan view of an oxide semiconductor layer in an array substrate according to Embodiment 1 of the present disclosure.

FIG. 8 shows a schematic plan view of the oxide semiconductor layer 340 in an array substrate according to Embodiment 1 of the present disclosure. In an exemplary embodiment of the present disclosure, the oxide semiconductor layer 340 may be used to form the active layer of the above-described voltage stabilizing transistor T2a.

In an exemplary embodiment of the present disclosure, similar to the silicon semiconductor layer 310, the oxide semiconductor layer 340 includes a channel pattern and a doped region pattern of a transistor (i.e., a first source/drain region and a second source/drain region of the transistor).

In FIG. 8, a dotted line frame is used to show regions of the source/drain region and the channel region of the voltage stabilizing transistor T2a in the oxide semiconductor layer 340.

As shown in FIG. 8, the oxide semiconductor layer 340 includes the source region T2a-s of the voltage stabilizing transistor T2a, the channel region T2a-c of the voltage stabilizing transistor T2a, and the drain region T2a-d of the voltage stabilizing transistor T2a sequentially along the Y direction.

In an embodiment of the present disclosure, referring to FIGS. 7 and 8, the overlapping part between the orthographic projection of the voltage stabilizing control signal line STVL on the substrate and the orthographic projection of the oxide semiconductor layer 340 on the substrate is the first gate T2a-g1 of the voltage stabilizing transistor T2a. The projection of the channel region T2a-c of the voltage stabilizing transistor T2a on the substrate completely overlaps the projection of the first gate T2a-g1 of the voltage stabilizing transistor T2a on the substrate.

In an exemplary embodiment of the present disclosure, the oxide semiconductor layer 340 may be formed of an oxide semiconductor material, such as, indium gallium zinc oxide IGZO. The above-mentioned source region and drain region may be regions doped with n-type impurities or p-type impurities. For example, both the source region and the drain region of the voltage stabilizing transistor T2a are regions doped with N-type impurities.

In an embodiment of the present disclosure, the array substrate further includes a third conductive layer located on the side of the oxide semiconductor layer away from the substrate and insulated from the oxide semiconductor layer.

Figure 9:
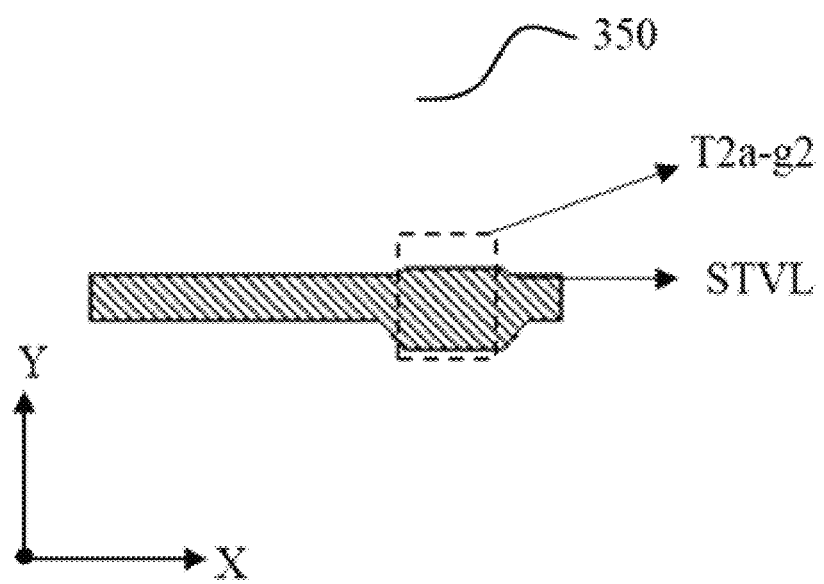
FIG. 9 shows a schematic plan view of a third conductive layer in an array substrate according to Embodiment 1 of the present disclosure.

FIG. 9 shows a schematic plan view of the third conductive layer 350 in an array substrate according to Embodiment 1 of the present disclosure. As shown in FIG. 9, the third conductive layer 350 includes a voltage stabilizing control signal line STVL.

In an embodiment of the present disclosure, as shown in FIG. 9, the voltage stabilizing control signal line STVL is provided with the second gate T2a-g2 of the voltage stabilizing transistor T2a. Specifically, the overlapping portion between the orthographic projection of the voltage stabilizing control signal line STVL on the substrate and the orthographic projection of the oxide semiconductor layer 340 on the substrate is the second gate T2a-g2 of the voltage stabilizing transistor T2a.

In an embodiment of the present disclosure, referring to FIG. 7, FIG. 8 and FIG. 9, projections of the second gate T2a-g2 of the voltage stabilizing transistor T2a, the channel region T2a-c of the voltage stabilizing transistor T2a and the first gate T2a-g1 of the voltage stabilizing transistor T2a on the substrate completely overlap.

It should be noted that, in some embodiments of the present disclosure, an insulation layer or a dielectric layer is further provided between adjacent active semiconductor layer and conductive layer or between adjacent conductive layers. Specifically, an insulation layer or a dielectric layer (which will be described in detail below with reference to the cross-sectional view) is further provided respectively between the silicon semiconductor layer 310 and the first conductive layer 320, between the first conductive layer 320 and the second conductive layer 330, between the second conductive layer 330 and the oxide semiconductor layer 340, between the oxide semiconductor layer 340 and the third conductive layer 350, between the third conductive layer 350 and the fourth conductive layer 360 (which will be described in detail below with reference to FIG. 12), and between the fourth conductive layer 360 and the fifth conductive layer 370 (which will be described in detail below with reference to FIG. 11).

It should be noted that the via hole described below is a via hole simultaneously penetrating through the insulation layers or dielectric layers provided between adjacent active semiconductor layer and conductive layer or between adjacent conductive layers. Specifically, the via hole is a via hole penetrating simultaneously the insulation layers or dielectric layers between the silicon semiconductor layer 310 and the first conductive layer 320, between the first conductive layer 320 and the second conductive layer 330, between the second conductive layer 330 and the oxide semiconductor layer 340, between the oxide semiconductor layer 340 and the third conductive layer 350, between the third conductive layer 350 and the fourth conductive layer 360, and between the fourth conductive layer 360 and the fifth conductive layer 370.

In the drawings of the present disclosure, white circles are used to indicate regions corresponding to via holes.

In an embodiment of the present disclosure, the array substrate further includes a fourth conductive layer located on a side of the third conductive layer away from the substrate and insulated from the third conductive layer.

Figure 10:
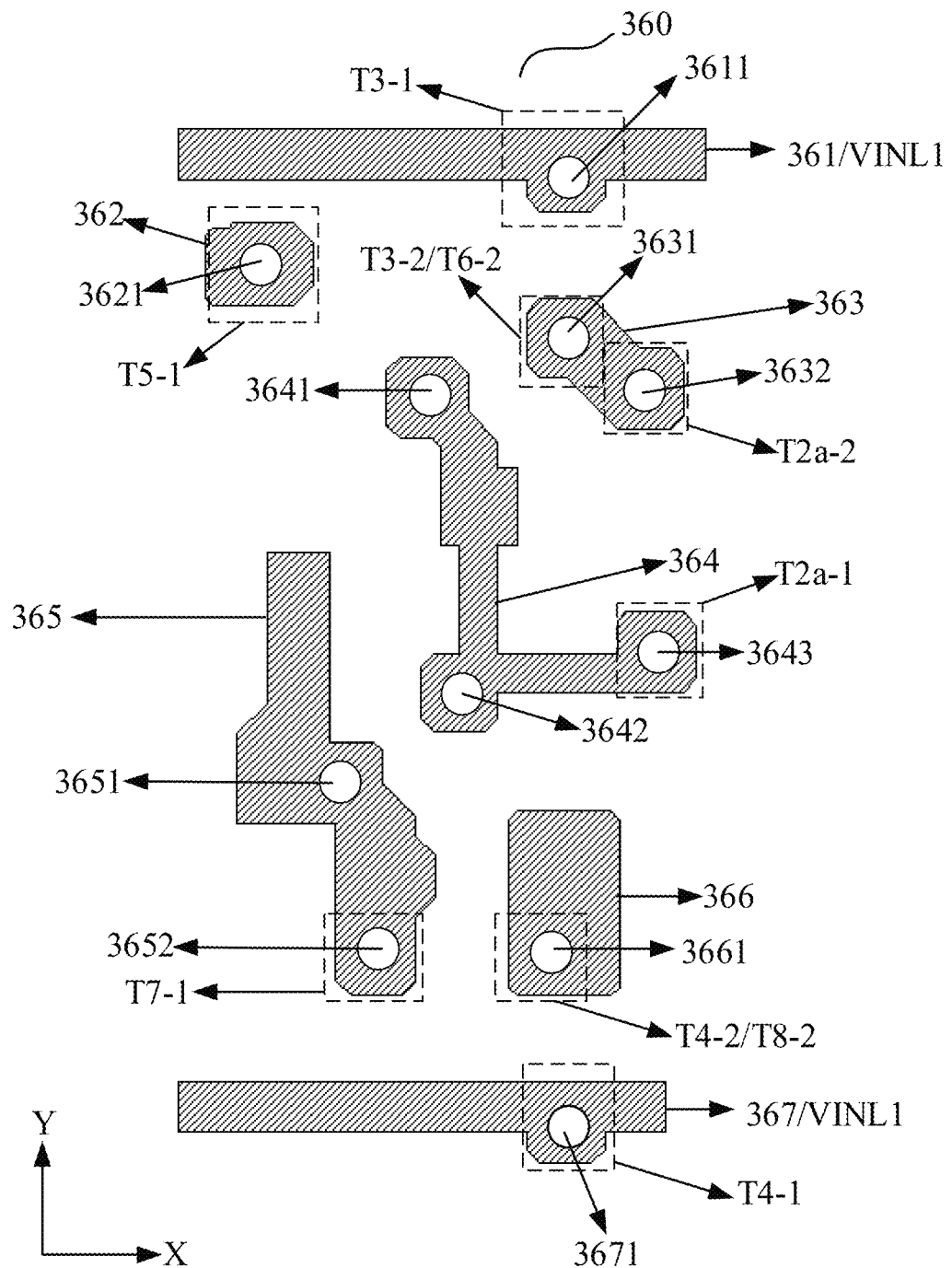
FIG. 10 shows a schematic plan view of a fourth conductive layer in an array substrate according to Embodiment 1 of the present disclosure.

FIG. 10 shows a schematic plan view of the fourth conductive layer 360 in an array substrate according to Embodiment 1 of the present disclosure. As shown in FIG. 10, the fourth conductive layer 360 includes a first connection part 361, a second connection part 362, a third connection part 363, a fourth connection part 364, a fifth connection part 365, a sixth connection part 366, and a seven connection part 367.

In an embodiment of the present disclosure, the second connection part 362, the third connection part 363, the fourth connection part 364, the fifth connection part 365, and the sixth connection part 366 are provided at a middle position between the first connection part 361 and the seventh connection part 367, and the specific positions are shown in FIG. 10.

The first connection part 361 is coupled to the silicon semiconductor layer 310 through the via hole 3611. Specifically, the first connection part 361 is coupled to the drain region T3-d of the driving reset transistor T3 through the via hole 3611, to form the first terminal T3-1 of the driving reset transistor T3. The first connection part 361 serves as the first reset voltage line VINL1.

The second connection part 362 is coupled to the silicon semiconductor layer 310 through the via hole 3621. Specifically, the second connection part 362 is coupled to the drain region T5-d of the data writing transistor T5 through the via hole 3621, forming the first terminal T5-1 of the data writing transistor T5.

The third connection part 363 is coupled to the silicon semiconductor layer 310 through the via hole 3631. Specifically, the third connection part 363 is coupled to the source region of the driving reset transistor T3 and the source region T3-s/T6-s of the compensation transistor T6 through the via hole 3631, forming the second terminal of the driving reset transistor T3 and the second terminal T3-2/T6-2 of the compensation transistor T6. The third connection part 363 is coupled to the oxide semiconductor layer 340 through the via hole 3632. Specifically, the third connection part 363 is coupled to the source region T2a-s of the voltage stabilizing transistor T2a through the via hole 3632, to form the second terminal T2a-2 of the voltage stabilizing transistor T2a.

The fourth connection part 364 is coupled to the second conductive layer 330 through the via hole 3641, specifically to the voltage stabilizing block 331 located on the side of the voltage stabilizing control signal line STVL away from the second terminal C2 of the storage capacitor C in FIG. 7, for realizing the voltage stabilizing effect. Besides, the fourth connection part 364 is also coupled to the first conductive layer 320 through the via hole 3642. Specifically, the fourth connection part 364 is coupled to the gate T1-g of the driving transistor T1 and the first terminal C1 of the storage capacitor C through the via hole 3642. The fourth connection part 364 is coupled to the oxide semiconductor layer 340 through the via hole 3643. Specifically, the fourth connection part 364 is coupled to the drain region T2a-d of the voltage stabilizing transistor T2a through the via hole 3643 to form the first terminal T2a-1 of the voltage stabilizing transistor T2a.

The fifth connection part 365 is coupled to the second conductive layer 330 through the via hole 3651. Specifically, the fifth connection part 365 is coupled to the first power voltage line VDL and the second terminal C2 of the storage capacitor C through the via hole 3651. The fifth connection part 365 is coupled to the silicon semiconductor layer 310 through the via hole 3652. Specifically, the fifth connection part 365 is coupled to the drain region T7-d of the first light emission control transistor T7 through the via hole 3652 to form the first terminal T7-1 of the first light emission control transistor T7.

The sixth connection part 366 is coupled to the silicon semiconductor layer 310 through the via hole 3661. Specifically, the sixth connection part 366 is coupled to the source region T8-s of the second light emission control transistor T8 and the source region T4-s of the light emission reset transistor T4 through the via hole 3661, forming the second terminal T8-2 of the second light emission control transistor T8 and the second terminal T4-2 of the light emission reset transistor T4.

The seventh connection part 367 is coupled to the silicon semiconductor layer 310 through the via hole 3671. Specifically, the first connection part 367 is coupled to the drain region T4-d of the light emission reset transistor T4 through the via hole 3671 to form the first terminal T4-1 of the light emission reset transistor T4. The seventh connection part 367 functions as the first reset voltage line VINL1.

In an embodiment of the present disclosure, the array substrate further includes a fifth conductive layer located on a side of the fourth conductive layer away from the substrate and insulated from the fourth conductive layer.

Figure 11:
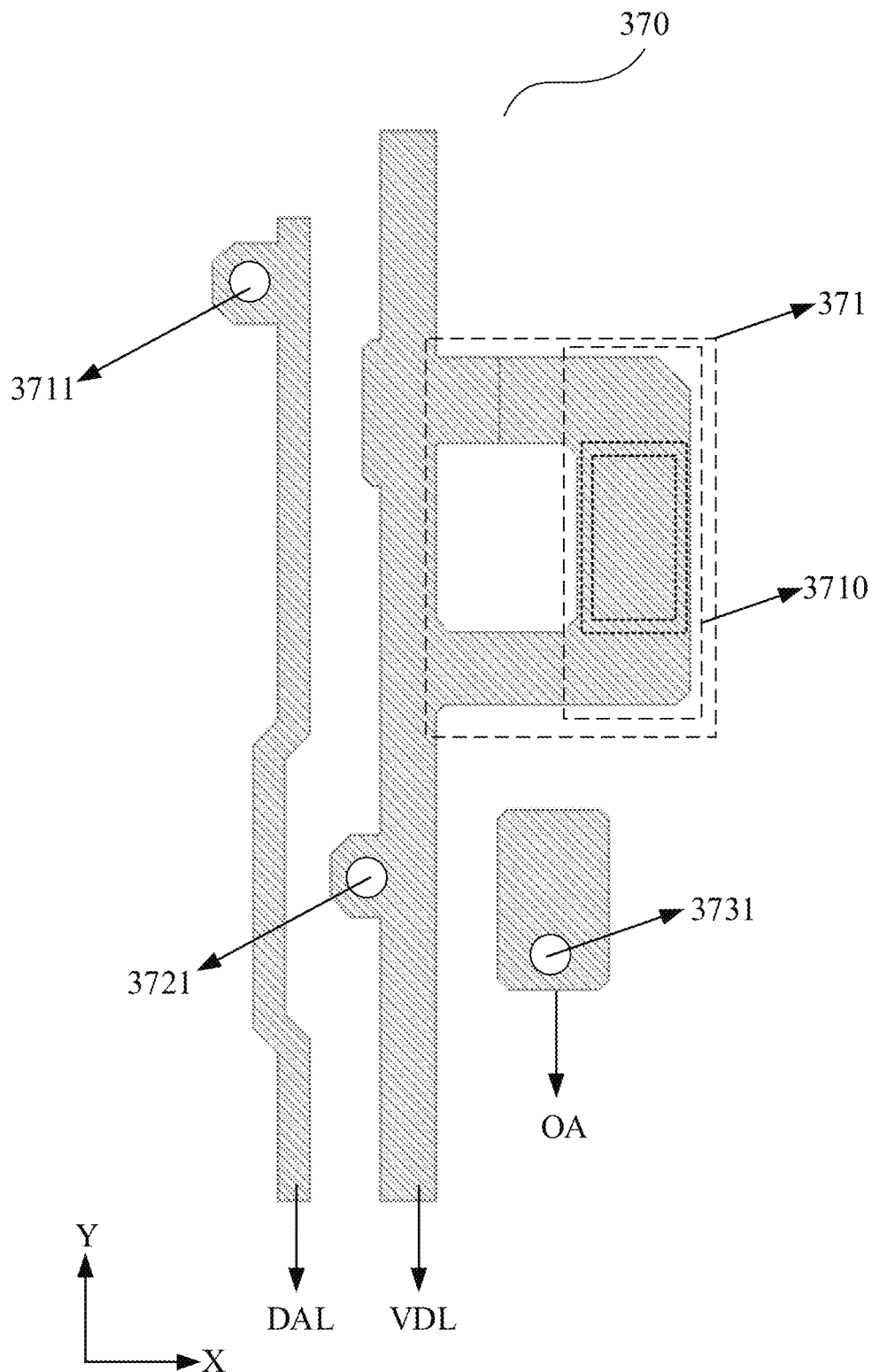
FIG. 11 shows a schematic plan view of a fifth conductive layer in an array substrate according to Embodiment 1 of the present disclosure.

FIG. 11 shows a schematic plan view of the fifth conductive layer 370 in an array substrate according to Embodiment 1 of the present disclosure. As shown in FIG. 11, the fifth conductive layer includes a data signal line DAL, a first power voltage line VDL, and a transfer terminal OA coupled to the first terminal of the light emission device 200 disposed along the row direction X. The data signal line DAL extends along the column direction Y, and is coupled to the second connection part 362 of the fourth conductive layer 360 through the via hole 3711. The first power voltage line VDL extends along the column direction Y as a whole, and is coupled to the fifth connection part 365 of the fourth conductive layer 360 through the via hole 3721. The transfer terminal OA extends along the column direction Y, and is coupled to the sixth connection part 366 of the fourth conductive layer 360 through the via hole 3731. In an embodiment of the present disclosure, the distance that the transfer terminal OA extends along the column direction Y is smaller than the data signal line DAL and the first power voltage line VDL.

In an embodiment of the present disclosure, the first power voltage line VDL has a closed rectangular part 371. With reference to FIGS. 8 and 11, the orthographic projection of the second side, extending in the Y direction of the rectangular part 371 arranged in the row direction X, on the substrate overlaps the orthographic projection of the oxide semiconductor layer 340 on the substrate. This arrangement helps to isolate the oxide semiconductor layer 340 from the encapsulation layer on the side of the fifth conductive layer 370 away from the substrate and adjacent to the fifth conductive layer 370, so as to prevent the hydrogen element in the encapsulation layer from causing the oxide material (such as metal oxide material) in the oxide semiconductor layer 340 to become unstable in performance. A part of the orthographic projection of the second side, extending in the Y direction of the rectangular part 371 arranged in the row direction X, on the substrate overlapping the orthographic projection of the oxide semiconductor layer 340 on the substrate is the aforementioned barrier part 3710.

The solid line rectangular frame on the barrier part 3710 in FIG. 11 represents a region on the barrier part 3710 corresponding to the recessed region of the first planarization layer. The recessed region may surround the channel region T2a-c of the voltage stabilizing transistor T2a, to further extend the path of the hydrogen element in the encapsulation layer entering the channel region T2a-c of the voltage stabilizing transistor T2a, thereby improving the stability of the voltage stabilizing transistor T2a.

Figure 12:
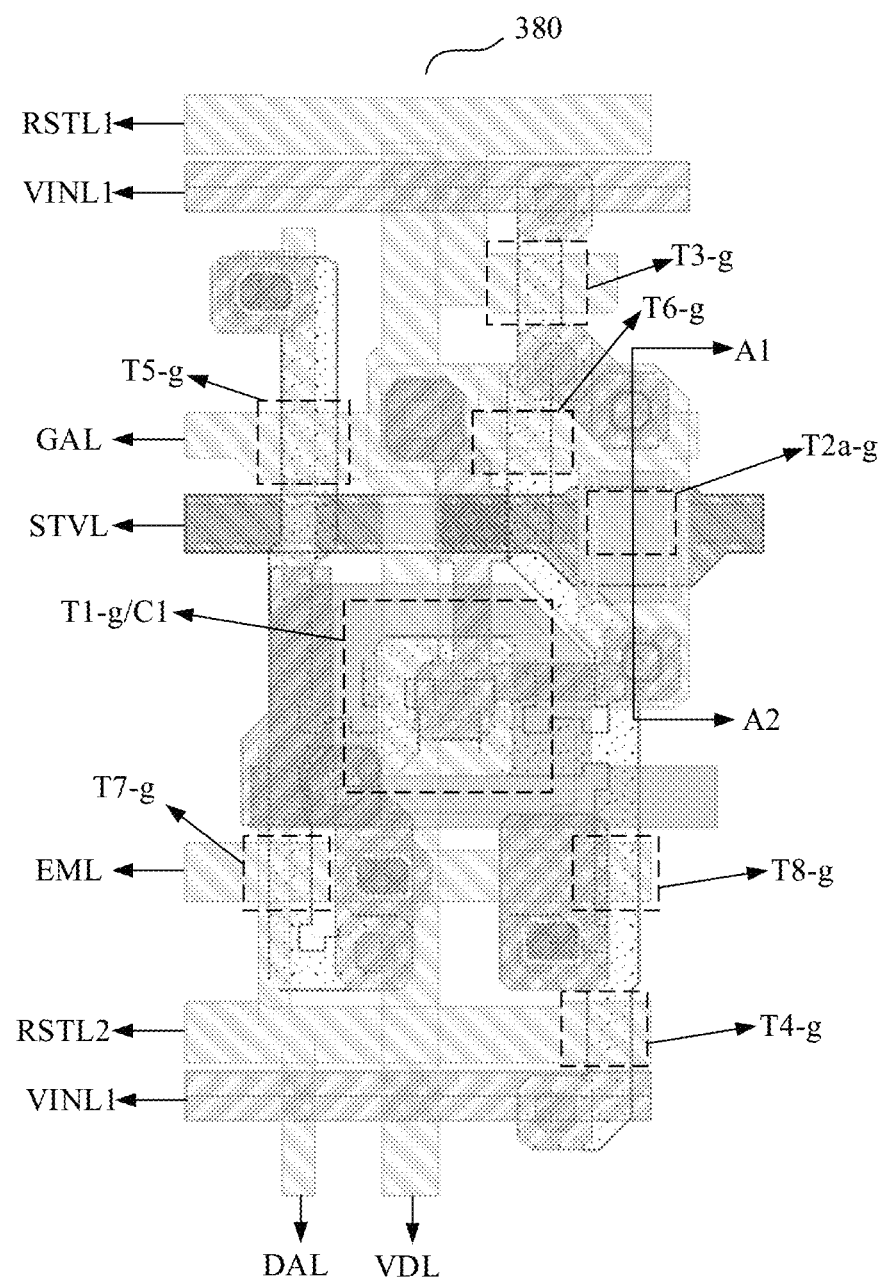
FIG. 12 shows a planar layout view of a silicon semiconductor layer, a first conductive layer, a second conductive layer, an oxide semiconductor layer, a third conductive layer, a fourth conductive layer, and a fifth conductive layer as stacked according to Embodiment 1 of the present disclosure.

FIG. 12 shows a schematic plan layout view of a silicon semiconductor layer, a first conductive layer, a second conductive layer, an oxide semiconductor layer, a third conductive layer, a fourth conductive layer and a fifth conductive layer after stacking according to Embodiment 1 of the present disclosure.

As shown in FIG. 12, the plan layout view 380 includes a silicon semiconductor layer 310, a first conductive layer 320, a second conductive layer 330, an oxide semiconductor layer 340, a third conductive layer 350, a fourth conductive layer 360, and a fifth conductive layer 370. For ease of viewing, FIG. 12 shows the gate T1-g of the driving transistor T1, the gate T2a-g of the voltage stabilizing transistor T2a, the gate T3-g of the driving reset transistor T3, the gate T4-g of the light emission reset transistor T4, the gate T5-g of the data writing transistor T5, the gate T6-g of the compensation transistor T6, the first plate C1 of the storage capacitor C, the gate T7-g of the first light emission control transistor T7 and the gate T8-g of the second light emission control transistor T8.

FIG. 13 shows a schematic cross-sectional structure diagram of the array substrate taken along the line A1-A2 in FIG. 12 according to an embodiment of the present disclosure. As shown in FIG. 13, and referring to FIGS. 5 to 12, the array substrate 20 includes: a substrate 300; a first buffer layer 101 on the substrate 300; and a silicon semiconductor layer 310 on the first buffer layer 101.

In an embodiment of the present disclosure, as shown in FIG. 13, the array substrate 20 further includes: a first gate insulation layer 102 covering the buffer layer 101 and the silicon semiconductor layer 310; and a first conductive layer 320 located at a side of the first gate insulation layer 102 away from the substrate 300. The cross-sectional view shows the scan signal line GAL included in the first conductive layer 320.

In an embodiment of the present disclosure, as shown in FIG. 13, the array substrate 20 further includes: a first interlayer insulation layer 103 located on a side of the first conductive layer 320 away from the substrate 300; and a second conductive layer 330 on the side of the first interlayer insulation layer 103 away from the substrate 300. The cross-sectional view shows the voltage stabilizing control signal line STVL included in the second conductive layer 330, and the voltage stabilizing control signal line STVL includes the first gate T2a-g1 of the voltage stabilizing transistor T2a.

In an embodiment of the present disclosure, as shown in FIG. 13, the array substrate 20 further includes: a second interlayer insulation layer 104 located on the side of the second conductive layer 330 away from the substrate 300; a second buffer layer 105 covering the second interlayer insulation layer 104; and an oxide semiconductor layer 340 on the side of the second buffer layer 105 away from the substrate 300. The cross-sectional view shows the channel region T2a-c of the voltage stabilizing transistor T2a, the orthographic projection of which on the substrate 300 overlapping the orthographic projection of the first gate T2a-g1 of the voltage stabilizing transistor T2a on the voltage stabilizing control signal line STVL on the substrate 300.

In an embodiment of the present disclosure, as shown in FIG. 13, the array substrate 20 further includes: a second gate insulation layer 106 covering the oxide semiconductor layer 340 and the second buffer layer 105; and a third conductive layer 350 on the side of the second gate insulation layer 106 away from the substrate 300. The cross-sectional view shows the voltage stabilizing control signal line STVL included in the third conductive layer 350. As shown in FIG. 13, a part of the orthographic projection of the voltage stabilizing control signal line STVL on the substrate 300 overlapping the orthographic projection of the channel region T2a-c of the voltage stabilizing transistor T2a included in the oxide semiconductor layer 320 on the substrate 300 is the second gate T2a-g2 of the voltage stabilizing transistor T2a.

In an embodiment of the present disclosure, as shown in FIG. 13, the array substrate 20 further includes: a third interlayer insulation layer 107 covering the third conductive layer 350 and the second gate insulation layer 106; and a fourth conductive layer 360 located on a side of the third interlayer insulation layer 107 away from the substrate 300. In conjunction with FIG. 12, the cross-sectional view shows the third connection part 363 and the fourth connection part 364. The third connection part 363 is coupled to the oxide semiconductor layer 340 through the via hole 3632. The fourth connection part 364 is coupled to the oxide semiconductor layer 340 through the via hole 3643.

In an embodiment of the present disclosure, as shown in FIG. 13, the array substrate 20 further includes: a first planarization layer 108 covering the fourth conductive layer 360 and the third interlayer insulation layer 107; and a fifth conductive layer 370 on a side of the first planarization layer 108 away from the substrate 300. The cross-sectional view shows the recessed region 108a opened on the first planarization layer 108. The orthographic projection of the recessed region 108a on the substrate 300 surrounds the orthographic projection of the channel region T2a-c of the voltage stabilizing transistor T2a on the substrate 300. Besides, the cross-sectional view also shows the first power voltage line VDL of the fifth conductive layer 370. The orthographic projection of the barrier part 3710 of the first power voltage line VDL on the substrate 300 covers the oxide semiconductor layer 370, namely: covering the orthographic projection of the channel region T2a-c of the voltage stabilizing transistor T2a on the substrate 300. In addition, a portion of the barrier part 3710 is filled in the recessed region 108a. Such design increases the entry of the H element entering the channel region T2a-c of the voltage stabilizing transistor T2a, thereby improving the stability of the voltage stabilizing transistor T2a.

In an embodiment of the present disclosure, as shown in FIG. 13, the array substrate 20 further includes a second planarization layer 109 covering the fifth conductive layer 370 and the first planarization layer 108.

In view of above, the pixel circuit according to an embodiment of the present disclosure may be an 8T1C circuit, and the pixel circuit includes 8 transistors and 1 storage capacitor.

In addition, it should be noted that the first conductive layer 320, the second conductive layer 330, the third conductive layer 350, the fourth conductive layer 360, and the fifth conductive layer 370 as mentioned in embodiments of the present disclosure may include metal materials, and are non-transparent conductive layers. The non-transparent conductive layer refers to a conductive layer with poor light transmittance or light impermeability. Each conductive layer may be a single-layer film structure or a multi-layer film composite structure, depending on the specific situations. Embodiments provided in the following are also applicable to the descriptions herein. Therefore, detailed descriptions will not be repeated hereinafter.

Embodiment 2

Figure 14:
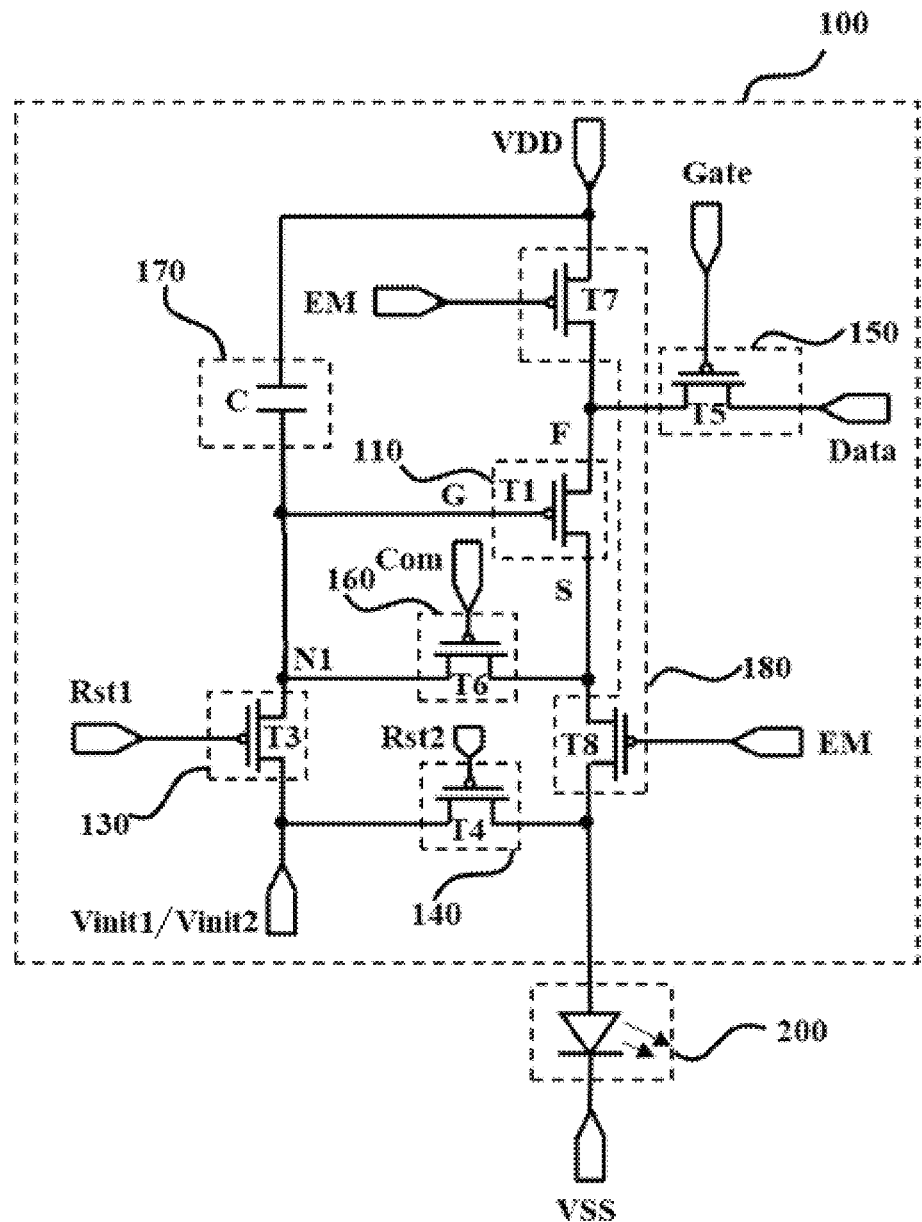
FIG. 14 shows a schematic diagram of a sub-pixel according to Embodiment 2 of the present disclosure.

FIG. 14 shows a schematic diagram of a sub-pixel according to Embodiment 2 of the present disclosure. The main difference between the sub-pixels in Embodiment 2 of the present disclosure and the sub-pixels in the aforementioned Embodiment 1 of the present disclosure is that a voltage stabilizing circuit is not provided. That is, the voltage stabilizing transistor T2a is not provided.

Specifically, as shown in FIG. 14, the pixel circuit 100 may include a driving transistor T1, a driving reset transistor T3, a light emission reset transistor T4, a data writing transistor T5, a compensation transistor T6, a storage capacitor C, a first light emission control transistor T7, and a second light emission control transistor T8.

The main difference in the schematic diagram of the circuit structure of the sub-pixel between Embodiment 2 of the present disclosure and Embodiment 1 of the present disclosure is that: no voltage stabilizing transistor T2a is provided between the first node N1 and the control terminal G of the driving circuit 110, and for connections among the remaining transistors and the storage capacitor C, the description in Embodiment 1 may be referred to, which will not be repeated here.

In an embodiment of the present disclosure, the driving reset transistor T3 and the compensation transistor T6 may be the aforementioned oxide transistors. That is, the active layers of the driving reset transistor T3 and the compensation transistor T6 may include oxide semiconductor materials, such as metal oxide semiconductor material, so as to reduce electric leakage and improve Vth compensation. It should be understood that the aforementioned recessed regions may be respectively formed around the channel regions of the driving reset transistor T3 and the compensation transistor T6. The driving transistor T1, the data writing transistor T5, the light emission reset transistor T4, the first light emission control transistor T7 and the second light emission control transistor T8 may be the aforementioned silicon semiconductor transistors. That is to say, the active layers of the driving transistor T1, the data writing transistor T5, the light emission reset transistor T4, the first light emission control transistor T7 and the second light emission control transistor T8 may include a silicon semiconductor material.

In an embodiment of the present disclosure, the driving reset transistor T3 and the compensation transistor T6 may be N-type transistors. The driving transistor T1, the light emission reset transistor T4, the data writing transistor T5, the first light emission control transistor T7 and the second light emission control transistor T8 may be P-type transistors.

In view of above, the pixel circuit according to an embodiment of the present disclosure may be a 7T1C circuit. That is, it includes 7 transistors and 1 storage capacitor C as mentioned above.

FIGS. 15-21 show schematic plan views of each layer in an array substrate according to Embodiment 2 of the present disclosure. A pixel circuit 100 shown in FIG. 14 is taken as an example for description. In the pixel circuit 100, the compensation control signal and the scan signal GA are the same signal. The driving reset transistor T3 and the compensation transistor T6 are oxide transistors. The driving transistor T1, the data writing transistor T5, the light emission reset transistor T4, the first light emission control transistor T7 and the second light emission control transistor T8 may be silicon semiconductor transistors.

The positional relationship among various circuits in the pixel circuit on the substrate will be described below with reference to FIGS. 15 to 21. Those skilled in the art will understand that the scales in FIGS. 15 to 21 are drawn to facilitate a clearer representation of positions of parts and should not be regarded as true scales of components. Those skilled in the art may select the size of each component based on actual requirements, which is not specifically limited in the present disclosure.

In an embodiment of the present disclosure, the array substrate includes a silicon semiconductor layer 310 on the substrate 300.

Figure 15:
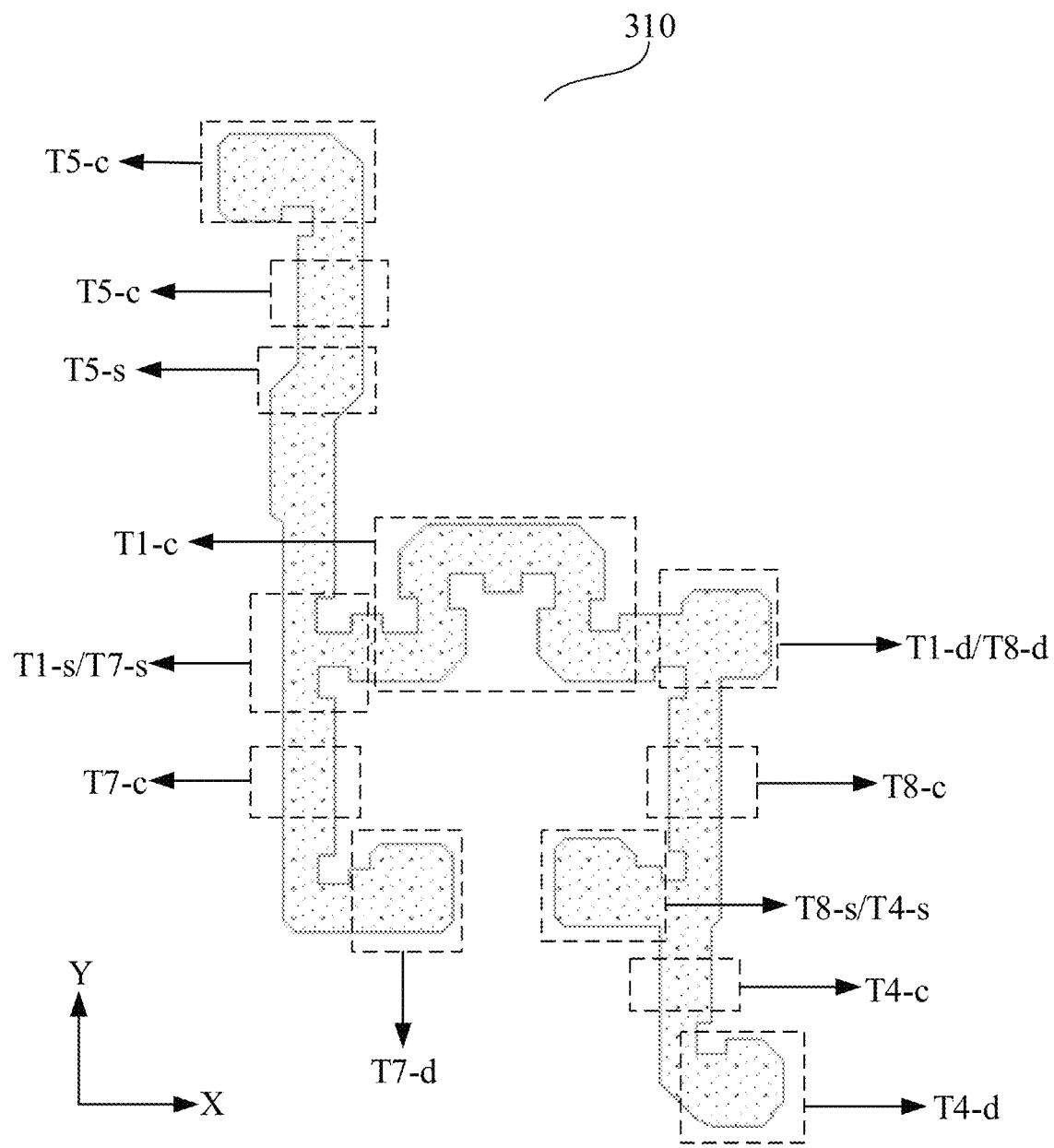
FIG. 15 shows a schematic plan view of a silicon semiconductor layer in an array substrate according to Embodiment 2 of the present disclosure.

FIG. 15 shows a schematic plan view of the silicon semiconductor layer 310 in an array substrate according to Embodiment 2 of the present disclosure. In an exemplary embodiment of the present disclosure, the driving transistor T1, the light emission reset transistor T4, the data writing transistor T5, the first light emission control transistor T7 and the second light emission control transistor T8 in the pixel circuit are silicon semiconductor transistors, such as low temperature polysilicon transistors.

In an exemplary embodiment of the present disclosure, the silicon semiconductor layer 310 may be used to form active regions of the driving transistor T1, the light emission reset transistor T4, the data writing transistor T5, the first light emission control transistor T7 and the second light emission control transistor T8. In an exemplary embodiment of the present disclosure, the silicon semiconductor layer 310 includes a channel region pattern and a doped region pattern of a transistor (i.e., first and second source/drain regions of the transistor). In an embodiment of the present disclosure, the channel region pattern and the doped region pattern of each transistor are integrally provided.

It should be noted that, in FIG. 15, a dotted line frame is used to indicate regions in the silicon semiconductor layer 310 for source/drain regions and channel regions of respective transistors.

As shown in FIG. 15, the silicon semiconductor layer 310 includes the channel region T5-$c$ of the data writing transistor T5, the channel region T1-$c$ of the driving transistor T1, the channel region T7-$c$ of the first light emission control transistor T7, the channel region T8-$c$ of the second light emission control transistor T8, and the channel region T4-$c$ of the light emission reset transistor T4, as arranged in the Y direction (column direction) and the X direction (row direction).

In an exemplary embodiment of the present disclosure, the silicon semiconductor layer used for the above-described transistor may include an integrally formed low temperature polysilicon layer. The source region and the drain region of each transistor may be conductive by doping or the like, so as to realize electrical connections among various structures. That is, the silicon semiconductor layer of the transistor is an overall pattern formed of p-silicon or n-silicon, and each transistor in the same pixel circuit includes a doped region pattern (i.e., including a source region s and a drain region d) and a channel region pattern. The active layers of different transistors are separated by doping structures.

As shown in FIG. 15, the silicon semiconductor layer 310 further includes a drain region T5-$d$ of the data writing transistor T5, a source region T5-$s$ of the data writing transistor T5, a source region T1-$s$ of the driving transistor T1, a source region T7-$s$ of the first light emission control transistor T7, a drain region T1-$d$ of the driving transistor T1, a drain region T8-$d$ of the second light emission control transistor T8, a drain region T7-$d$ of the first light emission control transistor T7, a source region T8-$s$ of the second light emission control transistor T8, a source region T4-$s$ of the light emission reset transistor T4, and a drain region T4-$d$ of the light emission reset transistor T4 along the Y direction and the X direction.

In an exemplary embodiment of the present disclosure, the silicon semiconductor layer 310 may be formed of a silicon semiconductor material such as amorphous silicon, polysilicon, or the like. The above-mentioned source region and drain region may be regions doped with n-type impurities or p-type impurities. For example, the source regions and drain regions of the first light emission control transistor T7, the data writing transistor T5, the driving transistor T1, the compensation transistor T6, the driving reset transistor T3, the light emission reset transistor T4 and the second light emission control transistor T8 are regions doped with P-type impurities.

In an embodiment of the present disclosure, the array substrate further includes a first conductive layer 320 on a side of the silicon semiconductor layer away from the substrate.

Figure 16:
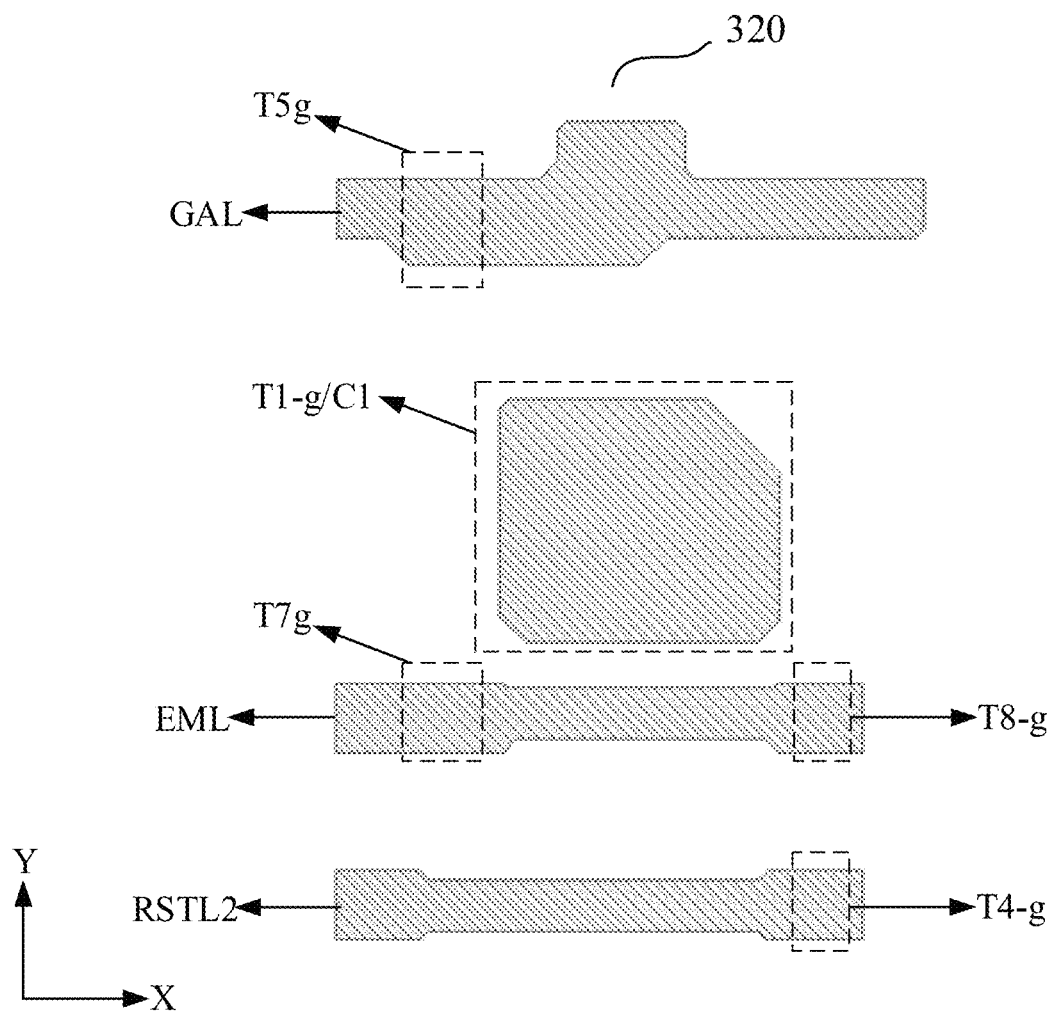
FIG. 16 shows a schematic plan view of a first conductive layer in an array substrate according to Embodiment 2 of the present disclosure.

FIG. 16 shows a schematic plan view of the first conductive layer 320 in an array substrate according to Embodiment 2 of the present disclosure. As shown in FIG. 6, the first conductive layer 320 includes the scan signal line GAL, the first terminal C1 of the storage capacitor C (the gate T1-$g$ of the driving transistor T1), the light emission control signal line EML, and the second reset control signal line RSTL2, as arranged in sequence along the Y direction.

In an embodiment of the present disclosure, the light emission control signal line EML is coupled to the light emission control signal input terminal EM, and is configured to provide the light emission control signal input terminal EM with the light emission control signal EMS.

In an embodiment of the present disclosure, the scan signal line GAL is coupled to the scan signal input terminal Gate, and is configured to provide the scan signal GA to the scan signal input terminal Gate.

In an embodiment of the present disclosure, the gate T1-$g$ of the driving transistor T1 may also serve as the first terminal C1 of the storage capacitor C in an integrated structure.

In an embodiment of the present disclosure, the portion where the orthographic projection of the scan signal line GAL on the substrate overlaps the orthographic projection of the silicon semiconductor layer 310 on the substrate is the gate T5-$g$ of the data writing transistor T5 in the pixel circuit. The portion where the orthographic projection of the first terminal C1 of the storage capacitor C in the pixel circuit on the substrate overlaps the orthographic projection of the silicon semiconductor layer 310 on the substrate is the gate T1-$g$ of the driving transistor T1 in the pixel circuit. The portion where the orthographic projection of the light emission control signal line EML on the substrate overlaps the orthographic projection of the silicon semiconductor layer 310 on the substrate is the gate T7-$g$ of the first light emission control transistor T7 and the gate T8-$g$ of the second light emission control transistor T8 in the pixel circuit, respectively.

In an embodiment of the present disclosure, the second reset control signal line RSTL2 is coupled to the light emission reset control signal input terminal Rst2 to provide the light emission reset control signal input terminal Rst2 with the reset control signal RST.

In an embodiment of the present disclosure, the portion where the orthographic projection of the second reset control signal line RSTL2 on the substrate overlaps the orthographic projection of the silicon semiconductor layer 310 on the substrate is the gate T4-$g$ of the light emission reset transistor T4 of the pixel circuit.

It should be noted that the positional relationships in the XY plane among the gate T1-$g$ of the driving transistor T1, the gate T4-$g$ of the light emission reset transistor T4, the gate T5-$g$ of the data writing transistor T5, the gate T7-$g$ of the first light emission control transistor T7 and the gate T8-$g$ of the second light emission control transistor T8 are shown in FIG. 16, which will not be described in detail here.

In addition, it should be noted that the active regions of the transistors shown in FIG. 16 correspond to the respective regions where the first conductive layer 320 and the silicon semiconductor layer 310 overlap.

In an embodiment of the present disclosure, the array substrate further includes a second conductive layer located on a side of the first conductive layer away from the substrate and insulated from the first conductive layer.

Figure 17:
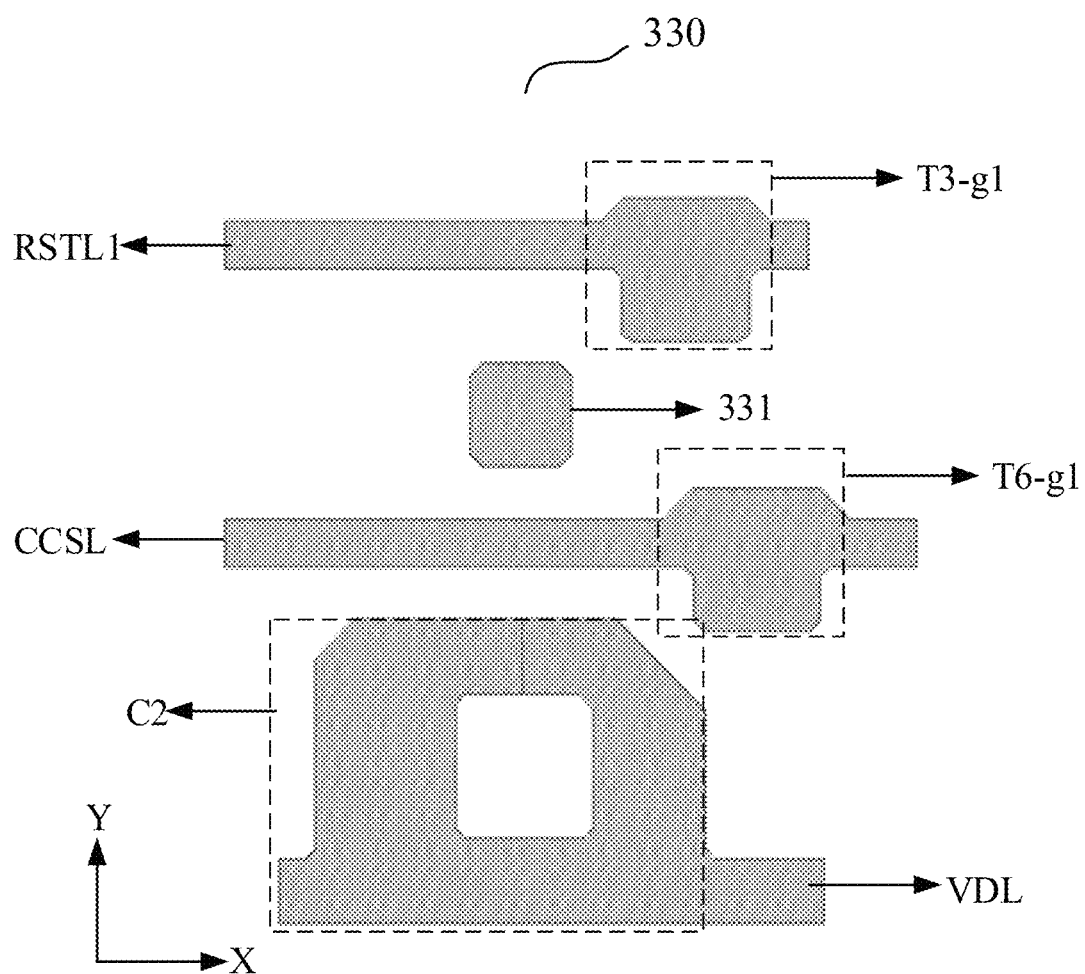
FIG. 17 shows a schematic plan view of a second conductive layer in an array substrate according to Embodiment 2 of the present disclosure.

FIG. 17 shows a schematic plan view of the second conductive layer 330 in an array substrate according to Embodiment 2 of the present disclosure. As shown in FIG. 17, the second conductive layer 330 includes a first reset control signal line RSTL1, a voltage stabilizing block 331, a compensation control signal line CCSL, a second terminal C2 of the storage capacitor C, and a first power voltage line VDL arranged along the Y direction. The specific arrangements may be referred to as shown in FIG. 17, which will not be described too much here.

In an embodiment of the present disclosure, the first reset control signal line RSTL1 is coupled to the driving reset control signal input terminal Rst1 to provide the reset control signal RST to the driving reset control signal input terminal Rst1.

In an embodiment of the present disclosure, the compensation control signal line CCSL is coupled to the compensation control signal input terminal Com, and is configured to provide the compensation control signal input terminal Com with the compensation control signal.

In an embodiment of the present disclosure, referring to FIGS. 6 and 7, the projections of the second terminal C2 of the storage capacitor C and the first terminal C1 of the storage capacitor C on the substrate at least partially overlap.

In an embodiment of the present disclosure, as shown in FIG. 7, the first power voltage line VDL extends along the X direction and is integrally formed with the second terminal C2 of the storage capacitor C. The first power voltage line VDL is coupled to the first power voltage terminal VDD, and is configured to provide the first power voltage Vdd thereto.

In an embodiment of the present disclosure, referring to FIGS. 16 and 17, the projections of the second terminal C2 of the storage capacitor C and the first terminal C1 of the storage capacitor C on the substrate at least partially overlap.

In an embodiment of the present disclosure, as shown in FIG. 17, the first power voltage line VDL extends along the X direction and is integrally formed with the second terminal C2 of the storage capacitor C. The first power voltage line VDL is coupled to the first power voltage terminal VDD, and is configured to provide the first power voltage Vdd thereto.

In an embodiment of the present disclosure, as shown in FIG. 17, the first reset control signal line RSTL1 is provided with the first gate T3-g1 of the driving reset transistor T3; and the compensation control signal line CCSL is provided with the first gate T6-g1 of the compensation transistor T6. Details will be described below with reference to FIG. 18.

In an embodiment of the present disclosure, the array substrate further includes an oxide semiconductor layer located on a side of the second conductive layer away from the substrate and insulated from the second conductive layer.

Figure 18:
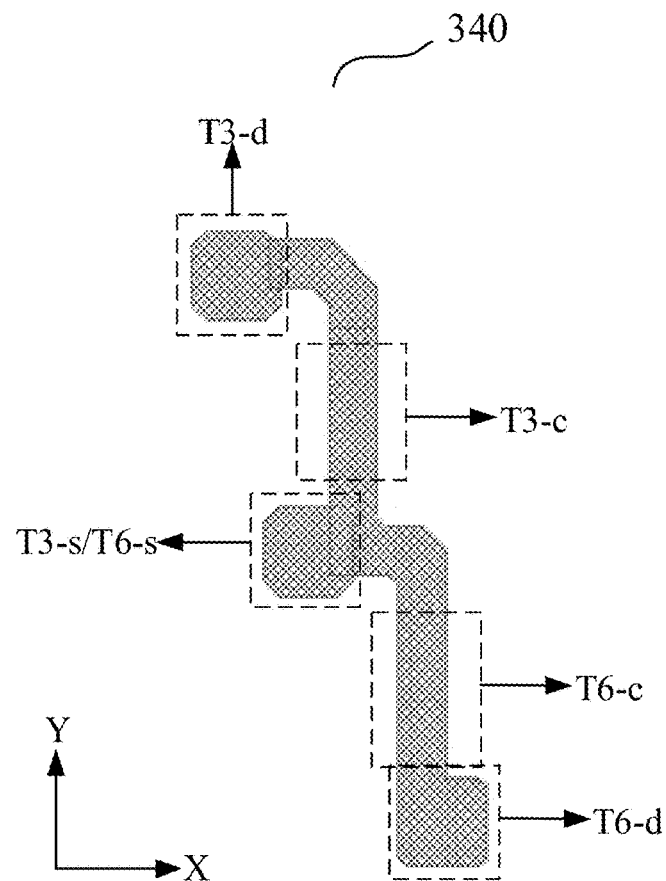
FIG. 18 shows a schematic plan view of an oxide semiconductor layer in an array substrate according to Embodiment 2 of the present disclosure.

FIG. 18 shows a schematic plan view of the oxide semiconductor layer 340 in an array substrate according to Embodiment 2 of the present disclosure. In an exemplary embodiment of the present disclosure, the oxide semiconductor layer 340 may be used to form the active layers of the above-described driving reset transistor T3 and compensation transistor T6.

In an exemplary embodiment of the present disclosure, similar to the silicon semiconductor layer 310, the oxide semiconductor layer 340 includes a channel pattern and a doped region pattern of a transistor (i.e., a first source/drain region and a second source/drain region of the transistor).

In FIG. 18, a dotted line frame is used to illustrate the regions of the source/drain regions and the channel regions of the driving reset transistor T3 and the compensation transistor T6 in the oxide semiconductor layer 340.

In an embodiment of the present disclosure, referring to FIGS. 17 and 18, the overlapping part between the orthographic projection of the compensation control signal line CCSL on the substrate and the orthographic projection of the oxide semiconductor layer 340 on the substrate is the first gate T6-g1 of the compensation transistor T6. Projections on the substrate of the channel region T6-c of the compensation transistor T6 and the first gate T6-g1 of the compensation transistor T6 completely overlap with each other. The overlapping part between the orthographic projection of the first reset control signal line RSTL1 on the substrate and the orthographic projection of the oxide semiconductor layer 340 on the substrate is the first gate T3-g1 of the driving reset transistor T3. Projections on the substrate of the channel region T3-c of the driving reset transistor T3 and the first gate T3-g1 of the driving reset transistor T3 completely overlap with each other.

In an embodiment of the present disclosure, the array substrate further includes a third conductive layer located on the side of the oxide semiconductor layer away from the substrate and insulated from the oxide semiconductor layer.

Figure 19:
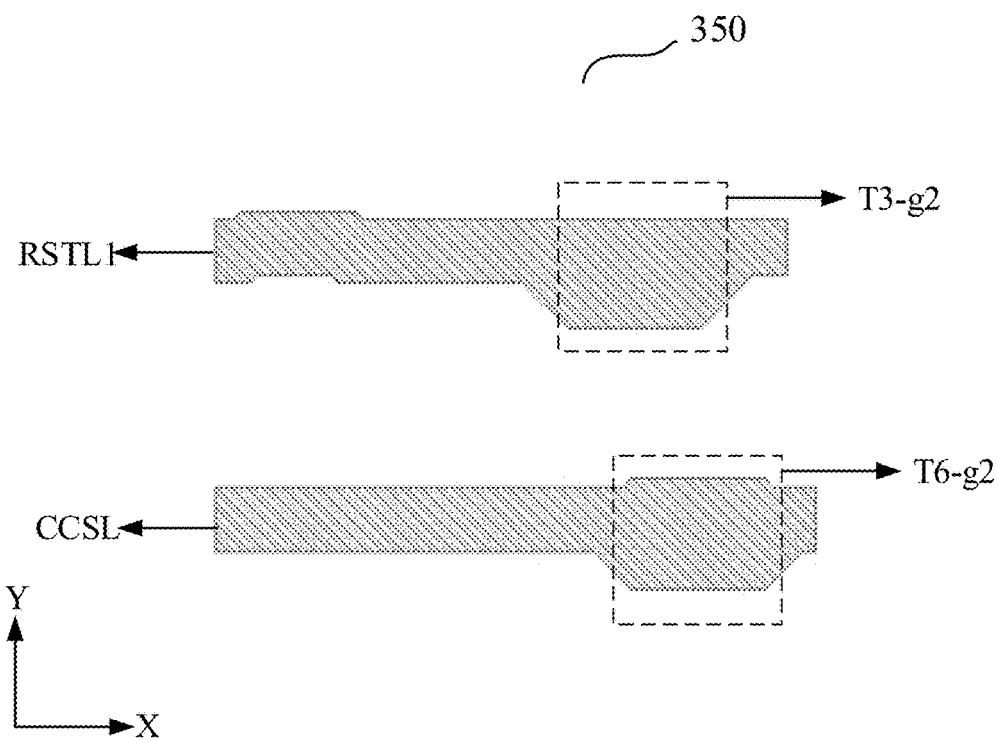
FIG. 19 shows a schematic plan view of a third conductive layer in an array substrate according to Embodiment 2 of the present disclosure.

FIG. 19 shows a schematic plan view of the third conductive layer 350 in an array substrate according to Embodiment 2 of the present disclosure. As shown in FIG. 19, the third conductive layer 350 includes a compensation control signal line CCSL and a first reset control signal line RSTL1.

The overlapping portion between the orthographic projection of the compensation control signal line CCSL on the substrate and the orthographic projection of the oxide semiconductor layer 340 on the substrate in the third conductive layer 350 is the second gate T6-g2 of the compensation transistor T6. Projections on the substrate of the channel region T6-c of the compensation transistor T6 and the second gate T6-g2 of the compensation transistor T6 completely overlap with each other. The overlapping part between the orthographic projection of the first reset control signal line RSTL1 on the substrate and the orthographic projection of the oxide semiconductor layer 340 on the substrate is the second gate T3-g2 of the driving reset transistor T3. Projections on the substrate of the channel region T3-c of the driving reset transistor T3 and the second gate T3-g2 of the driving reset transistor T3 completely overlap with each other.

It should be noted that, in some embodiments of the present disclosure, an insulation layer or a dielectric layer is further provided between adjacent active semiconductor layer and conductive layer or between adjacent conductive layers. Specifically, an insulation layer or a dielectric layer (which will be described in detail below with reference to the cross-sectional view) is further provided respectively between the silicon semiconductor layer 310 and the first conductive layer 320, between the first conductive layer 320 and the second conductive layer 330, between the second conductive layer 330 and the oxide semiconductor layer 340, between the oxide semiconductor layer 340 and the third conductive layer 350, between the third conductive layer 350 and the fourth conductive layer 360 (which will be described in detail below with reference to FIG. 12), and between the fourth conductive layer 360 and the fifth conductive layer 370 (which will be described in detail below with reference to FIG. 11).

It should be noted that the via hole described below is a via hole simultaneously penetrating through the insulation layer or dielectric layer provided between adjacent active semiconductor layer and conductive layer or between adjacent conductive layers. Specifically, the via hole penetrates simultaneously through the insulation layer or dielectric layer between the silicon semiconductor layer 310 and the first conductive layer 320, between the first conductive layer 320 and the second conductive layer 330, between the second conductive layer 330 and the oxide semiconductor layer 340, between the oxide semiconductor layer 340 and the third conductive layer 350, between the third conductive layer 350 and the fourth conductive layer 360, and between the fourth conductive layer 360 and the fifth conductive layer 370.

In the drawings of the present disclosure, white circles are used to indicate regions corresponding to via holes.

In an embodiment of the present disclosure, the array substrate further includes a fourth conductive layer located on a side of the third conductive layer away from the substrate and insulated from the third conductive layer.

Figure 20:
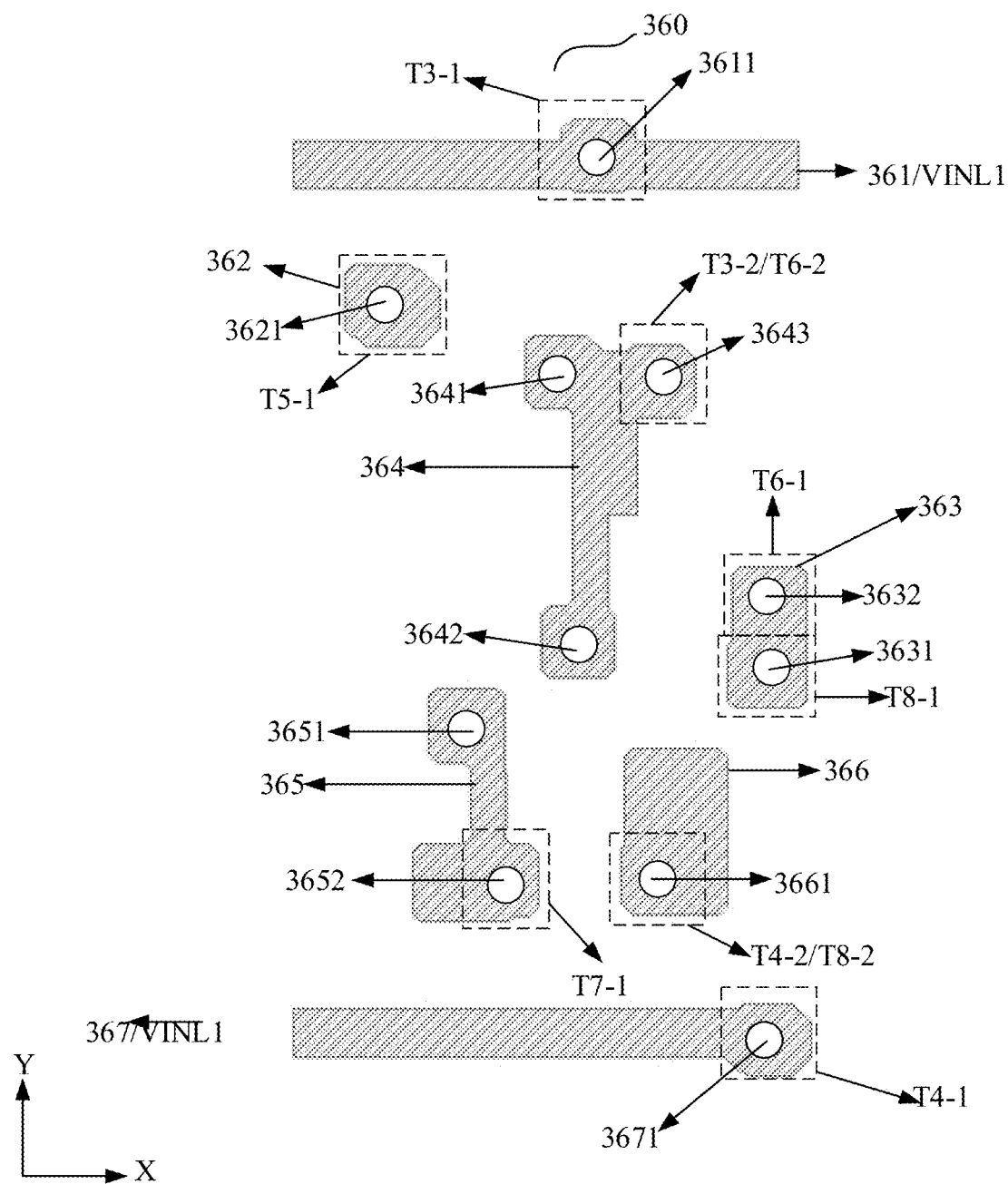
FIG. 20 shows a schematic plan view of a fourth conductive layer in an array substrate according to Embodiment 2 of the present disclosure.

FIG. 20 shows a schematic plan view of the fourth conductive layer 360 in an array substrate according to Embodiment 2 of the present disclosure. As shown in FIG. 20, the fourth conductive layer 360 includes a first connection part 361, a second connection part 362, a third connection part 363, a fourth connection part 364, a fifth connection part 365, a sixth connection part 366, and a seventh connection part 367. The specific locations are shown in FIG. 20, and will not be described in detail here.

The first connection part 361 is coupled to the oxide semiconductor layer 340 through the via hole 3611. Specifically, the first connection part 361 is coupled to the drain region T3-$d$ of the driving reset transistor T3 through the via hole 3611 to form the first terminal T3-1 of the driving reset transistor T3. The first connection part 361 is used as the first reset voltage line VINL1.

The second connection part 362 is coupled to the silicon semiconductor layer 310 through the via hole 3621. Specifically, the second connection part 362 is coupled to the drain region T5-$d$ of the data writing transistor T5 through the via hole 3621, forming the first terminal T5-1 of the data writing transistor T5.

The third connection part 363 is coupled to the silicon semiconductor layer 310 through the via hole 3631. Specifically, the third connection part 363 is coupled to the drain region T8-$d$ of the second light emission control transistor T8 through the via hole 3631 to form the first terminal T8-1 of the second light emission control transistor T8. The third connection part 363 is coupled to the oxide semiconductor layer 340 through the via hole 3632. Specifically, the third connection part 363 is coupled to the drain region T6-$d$ of the compensation transistor T6 through the via hole 3632 to form T6-1 of the compensation transistor T6.

The fourth connection part 364 is coupled to the second conductive layer 330 through the via hole 3641, specifically to the voltage stabilizing block 331 located on the side of the compensation control signal line CCSL away from the second terminal C2 of the storage capacitor C in FIG. 17. Besides, the fourth connection part 364 is also coupled to the first conductive layer 320 through the via hole 3642. Specifically, the fourth connection part 364 is coupled to the gate T1-$g$ of the driving transistor T1 and the first terminal C1 of the storage capacitor C through the via hole 3642. The fourth connection part 364 is coupled to the oxide semiconductor layer 340 through the via hole 3643. Specifically, the fourth connection part 364 is coupled to the source region T3-$s$ of the driving reset transistor T3 and the source region T6-$s$ of the compensation transistor T6 through the via hole 3643, forming the first terminal T3-2 of the driving reset transistor T3 and the first terminal T6-2 of the compensation transistor T6.

The fifth connection part 365 is coupled to the second conductive layer 330 through the via hole 3651. Specifically, the fifth connection part 365 is coupled to the first power voltage line VDL and the second terminal C2 of the storage capacitor C through the via hole 3651. The fifth connection part 365 is coupled to the silicon semiconductor layer 310 through the via hole 3652. Specifically, the fifth connection part 365 is coupled to the drain region T7-$d$ of the first light emission control transistor T7 through the via hole 3652 to form the first terminal T7-1 of the first light emission control transistor T7.

The sixth connection part 366 is coupled to the silicon semiconductor layer 310 through the via hole 3661. Specifically, the sixth connection part 366 is coupled to the source region T8-$s$ of the second light emission control transistor T8 and the source region T4-$s$ of the light emission reset transistor T4 through the via hole 3661, forming the second terminal T8-2 of the second light emission control transistor T8 and the second terminal T4-2 of the light emission reset transistor T4.

The seventh connection part 367 is coupled to the silicon semiconductor layer 310 through the via hole 3671. Specifically, the first connection part 367 is coupled to the drain region T4-$d$ of the light emission reset transistor T4 through the via hole 3671 to form the first terminal T4-1 of the light emission reset transistor T4. The seventh connection part 367 functions as the first reset voltage line VINL1.

In an embodiment of the present disclosure, the array substrate further includes a fifth conductive layer located on a side of the fourth conductive layer away from the substrate and insulated from the fourth conductive layer.

Figure 21:
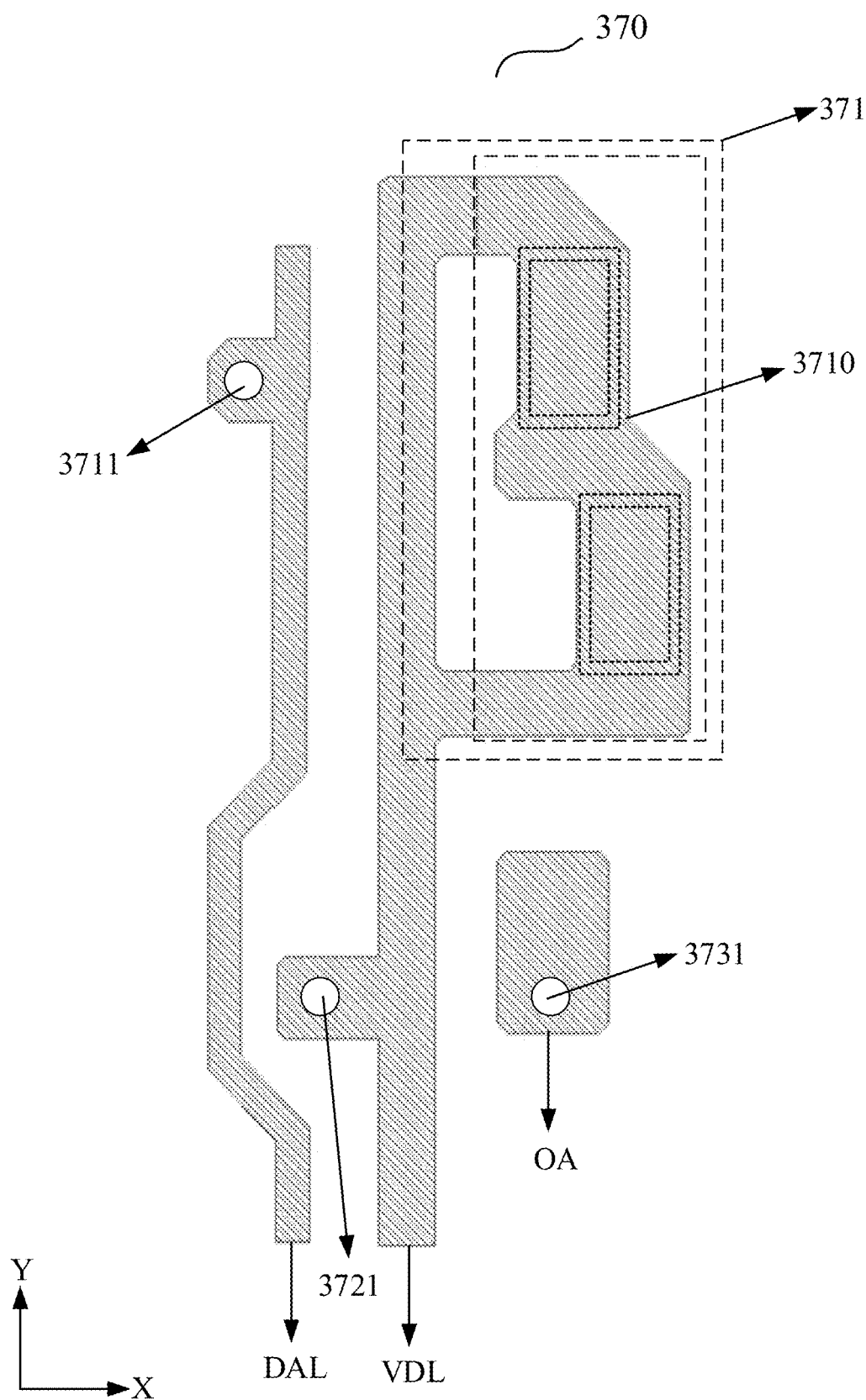
FIG. 21 shows a schematic plan view of a fifth conductive layer in an array substrate according to Embodiment 2 of the present disclosure.

FIG. 21 shows a schematic plan view of the fifth conductive layer 370 in an array substrate according to Embodiment 2 of the present disclosure. As shown in FIG. 21, the fifth conductive layer includes a data signal line DAL, a first power voltage line VDL, and a transfer terminal OA coupled to the first terminal of the light emission device 200, as disposed along the row direction X. The data signal line DAL extends along the column direction Y, and is coupled to the second connection part 362 of the fourth conductive layer 360 through the via hole 3711. The first power voltage line VDL extends along the column direction Y as a whole, and is coupled to the fifth connection part 365 of the fourth conductive layer 360 through the via hole 3721. The transfer terminal OA extends along the column direction Y, and is coupled to the sixth connection part 366 of the fourth conductive layer 360 through the via hole 3731. In an embodiment of the present disclosure, the distance that the transfer terminal OA extends along the column direction Y is smaller than the data signal line DAL and the first power voltage line VDL.

In an embodiment of the present disclosure, the first power voltage line VDL has a closed rectangular part 371. With reference to FIGS. 18 and 21, the orthographic projection on the substrate of the second side, extending in the Y direction of the rectangular part 371 arranged in the row direction X, overlaps the orthographic projection of the oxide semiconductor layer 340 on the substrate. Such arrangement renders the oxide semiconductor layer 340 to be isolated from the encapsulation layer on the side of the fifth conductive layer 370 away from the substrate and adjacent to the fifth conductive layer 370. Thus, it prevents the hydrogen element in the encapsulation layer from causing the oxide material, such as metal oxide material, in the oxide semiconductor layer 340 to become unstable in performance. The overlapping part between the orthographic projection on the substrate of the second side, extending in the Y direction of the rectangular part 371 arranged in the row direction X, and the orthographic projection on the substrate of the oxide semiconductor layer 340, is the aforementioned barrier part 3710.

The solid line rectangular frame on the barrier part 3710 in FIG. 21 represents a region on the barrier part 3710 corresponding to the recessed region of the first planarization layer. One recessed region may surround the channel region T3-c of the driving reset transistor T3, and another recessed region may surround the channel region T6-c of the compensation transistor T6. This helps to further extend the path of the hydrogen element in the encapsulation layer entering the channel region T3-c of the driving reset transistor T3 and the channel region T6-c of the compensation transistor T6, thereby improving the stability of the driving reset transistor T3 and the compensation transistor T6.

Figure 22:
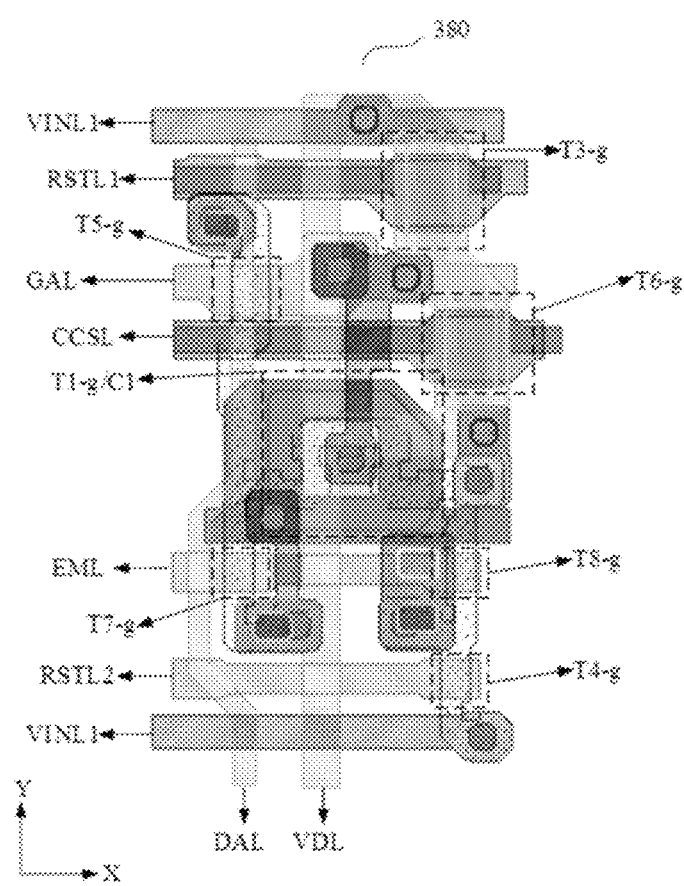
FIG. 22 shows a planar layout view of a silicon semiconductor layer, a first conductive layer, a second conductive layer, an oxide semiconductor layer, a third conductive layer, a fourth conductive layer and a fifth conductive layer as stacked according to Embodiment 2 of the present disclosure.

FIG. 22 shows a schematic plan view of the silicon semiconductor layer, the first conductive layer, the second conductive layer, the oxide semiconductor layer, the third conductive layer, the fourth conductive layer and the fifth conductive layer after stacking according to Embodiment 2 of the present disclosure.

As shown in FIG. 22, the plan layout view 380 includes a silicon semiconductor layer 310, a first conductive layer 320, a second conductive layer 330, an oxide semiconductor layer 340, a third conductive layer 350, a fourth conductive layer 360, and a fifth conductive layer 370. For ease of viewing, FIG. 22 shows the gate T1-g of the driving transistor T1, the gate T3-g of the driving reset transistor T3, the gate T4-g of the light emission reset transistor T4, the gate T5 of the data writing transistor T5-g, the gate T6-g of the compensation transistor T6, the first plate C1 of the storage capacitor C, the gate T7-g of the first light emission control transistor T7 and the gate T8-g of the second light emission control transistor T8.

It should be noted that the array substrate according to an embodiment of the present disclosure may further be provided with other film layers, for example, the buffer layer 101, the first interlayer insulation layer 103, the second interlayer insulation layer 103, the second gate insulation layer 106, a third interlayer insulation layer 107, a first planarization layer 108 and a second planarization layer 109 as mentioned in FIG. 13 and formed on the substrate 300.

The recessed region 108a shown in FIG. 13 may be formed on the first planarization layer 108 in an embodiment of the present disclosure. The orthographic projection of the recessed region 108a on the substrate 300 surrounds the orthographic projections of the channel region T3-c of the reset transistor T3 and the channel region T6-c of the compensation transistor T6 on the substrate 300. The orthographic projection of the barrier part 3710 of the first power voltage line VDL of the fifth conductive layer 370 on the substrate 300 covers the oxide semiconductor layer 370, i.e., covering the orthographic projections of the channel region T3-c of the reset transistor T3 and the channel region T6-c of the compensation transistor T6 on the substrate 300. In addition, the barrier part 3710 is partially filled in the recessed regions 108a. The path for the H element to enter the channel region T3-c of the reset transistor T3 and the channel region T6-c of the compensation transistor T6 is increased, thereby improving the stability of the reset transistor T3 and the compensation transistor T6.

Embodiment 3

The main difference between the sub-pixels of Embodiment 3 and the sub-pixels of the foregoing Embodiment 1 is that the driving reset voltage terminal Vinit1 coupled to the driving reset transistor T3 and the light emission reset voltage terminal Vinit2 of the light emission reset transistor T4 are different terminals. The sub-pixel structure according to Embodiment 3 of the present disclosure is illustrate in detail in the following with reference to the drawings.

Figure 23:
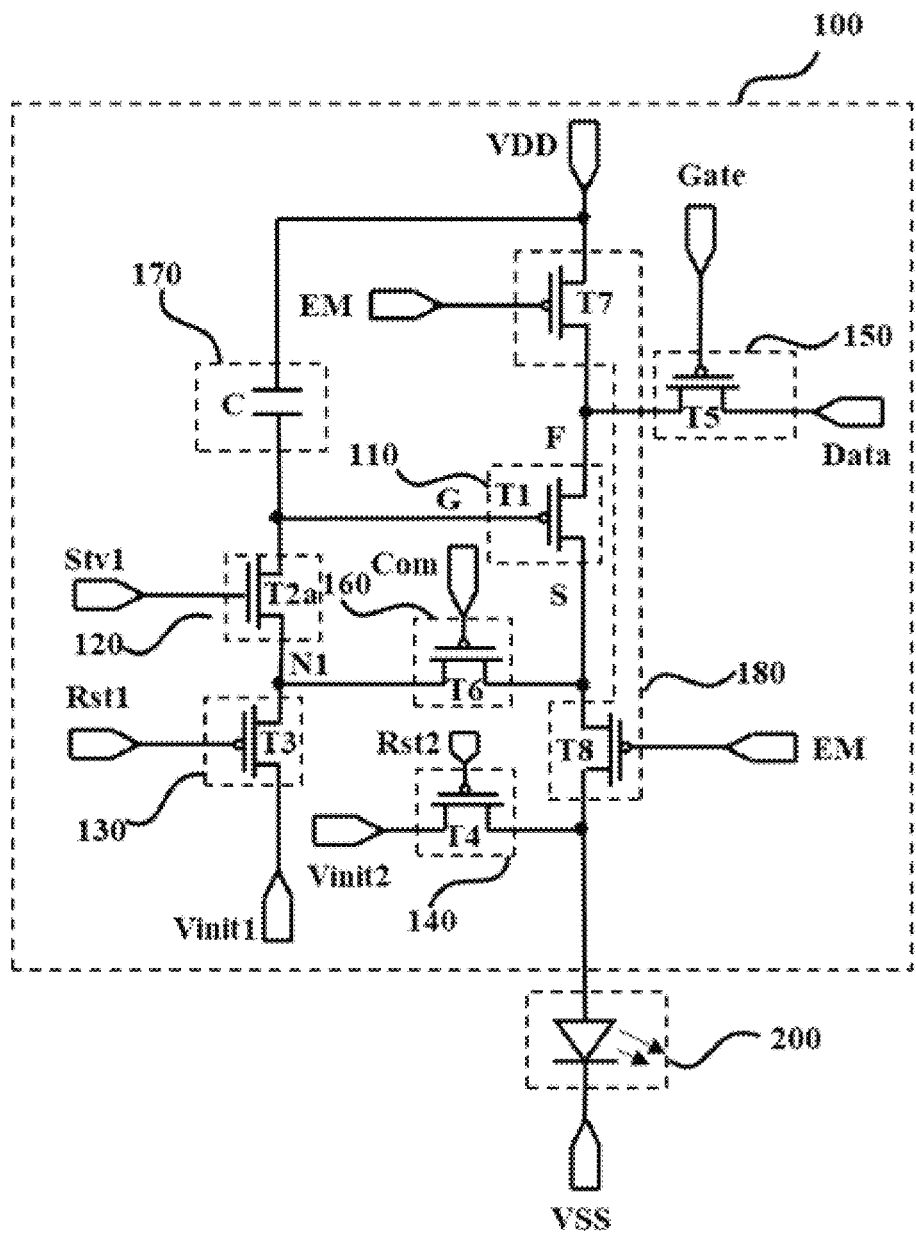
FIG. 23 shows a schematic diagram of a sub-pixel according to Embodiment 3 of the present disclosure.

Specifically, FIG. 23 shows a schematic diagram of a sub-pixel according to Embodiment 3 of the present disclosure. As shown in FIG. 23, the pixel circuit 100 may include a driving transistor T1, a voltage stabilizing transistor T2a, a driving reset transistor T3, a light emission reset transistor T4, a data writing transistor T5, a compensation transistor T6, a storage capacitor C, a first light emission control transistor T7 and a second light emission control transistor T8. The main difference in the schematic diagram of the circuit structure of the sub-pixel between Embodiment 3 and Embodiment 1 of the present disclosure is that: the driving reset voltage terminal Vinit1 coupled to the driving reset transistor T3 and the light emission reset voltage terminal Vinit2 of the light emission reset transistor T4 are different terminals. For the connections between the remaining transistors and the storage capacitor C, reference may be made to the description in Embodiment 1, and details are not repeated here.

In an embodiment of the present disclosure, the voltage stabilizing transistor T2a may be the aforementioned oxide transistor. That is, the active layer of the voltage stabilizing transistor T2a may include an oxide semiconductor material, such as a metal oxide semiconductor material. It should be understood that, the aforementioned recessed region may be formed around the channel region of the voltage stabilizing transistor T2a. The driving transistor T1, the driving reset transistor T3, the data writing transistor T5, the light emission reset transistor T4, the compensation transistor T6, the first light emission control transistor T7 and the second light emission control transistor T8 may be the aforementioned silicon semiconductor transistors. That is to say, the active layers of the driving transistor T1, the driving reset transistor T3, the data writing transistor T5, the light emission reset transistor T4, the compensation transistor T6, the first light emission control transistor T7 and the second light emission control transistor T8 may include silicon semiconductor materials.

In an embodiment of the present disclosure, the voltage stabilizing transistor T2a may be an N-type transistor. The driving transistor T1, the driving reset transistor T3, the data writing transistor T5, the light emission reset transistor T4, the compensation transistor T6, the first light emission control transistor T7 and the second light emission control transistor T8 may be P-type transistors.

Based on the foregoing description, the pixel circuit according to an embodiment of the present disclosure may be an 8T1C circuit. That is, it includes the aforementioned 8 transistors and 1 storage capacitor C. FIGS. 24-31 illustrate schematic plan layout views of an array substrate according to embodiments of the present disclosure. The repeating unit composed of 8 pixel circuits as shown in FIG. 23 is taken as an example. It should be understood that the 8 pixel circuits in the repeating unit are divided into two rows and four columns. Adjacent pixel circuits in the X direction of the repeating unit are disposed in a mirror symmetrical way. In the pixel circuit, the compensation control signal and the scan signal GA are the same signal, and the voltage stabilizing transistor T2a is an oxide transistor.

The positional relationships among various circuits in the repeating unit on the substrate will be described below with reference to FIGS. 24 to 30. Those skilled in the art will understand that the scales in FIGS. 24 to 30 are drawn to facilitate a clearer representation of positions of parts, and should not be regarded as true scales of components. Those skilled in the art may select the size of each component based on actual requirements, which is not specifically limited in the present disclosure.

In an embodiment of the present disclosure, the array substrate includes a shielding layer 309 on the substrate 300.

Figure 24:
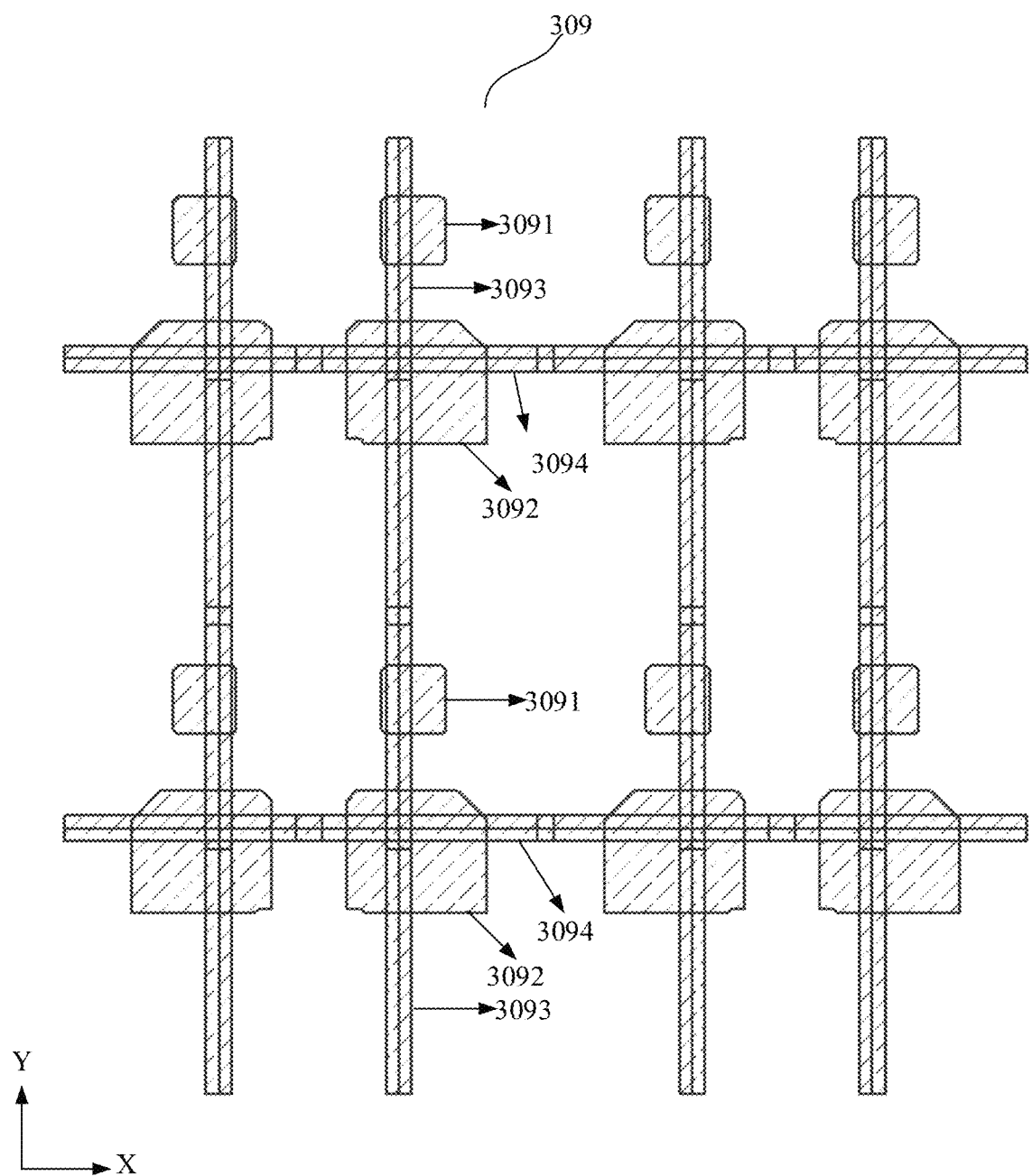
FIG. 24 shows a schematic plan view of a shielding layer in an array substrate according to Embodiments 3 and 4 of the present disclosure.

FIG. 24 shows a schematic plan view of the shielding layer 309 in an array substrate according to Embodiment 3 of the present disclosure. The shielding layer 309 includes a first block shielding part 3091, a second block shielding part 3092, a vertical strip shielding parts 3093 connecting the first block shielding part 3091 and the second block shielding part 3092, and a horizontal strip shielding part 3094 connecting two adjacent second block shielding parts 3092 in the X direction, as alternately arranged apart in the Y direction. The area of the second block shielding part 3092 is larger than that of the first block shielding part 3091. The orthographic projection of the first block shielding part 3091 in the Y direction is located within the second block shielding part 3092. In addition, the orthographic projection of the vertical strip shielding part 3093 in the Y direction is located within the first block shielding part 3091. The orthographic projection of the horizontally strip shielding part 3094 in the X direction is located within the second block shielding part 3092.

It should be noted that the first block shielding part 3091, the second block shielding part 3092, the vertical strip shielding part 3093 and the horizontal strip shielding part 3094 form an integral structure.

In an embodiment of the present disclosure, the array substrate includes a silicon semiconductor layer 310 on a side of the shielding layer 309 away from the substrate 300.

Figure 25:
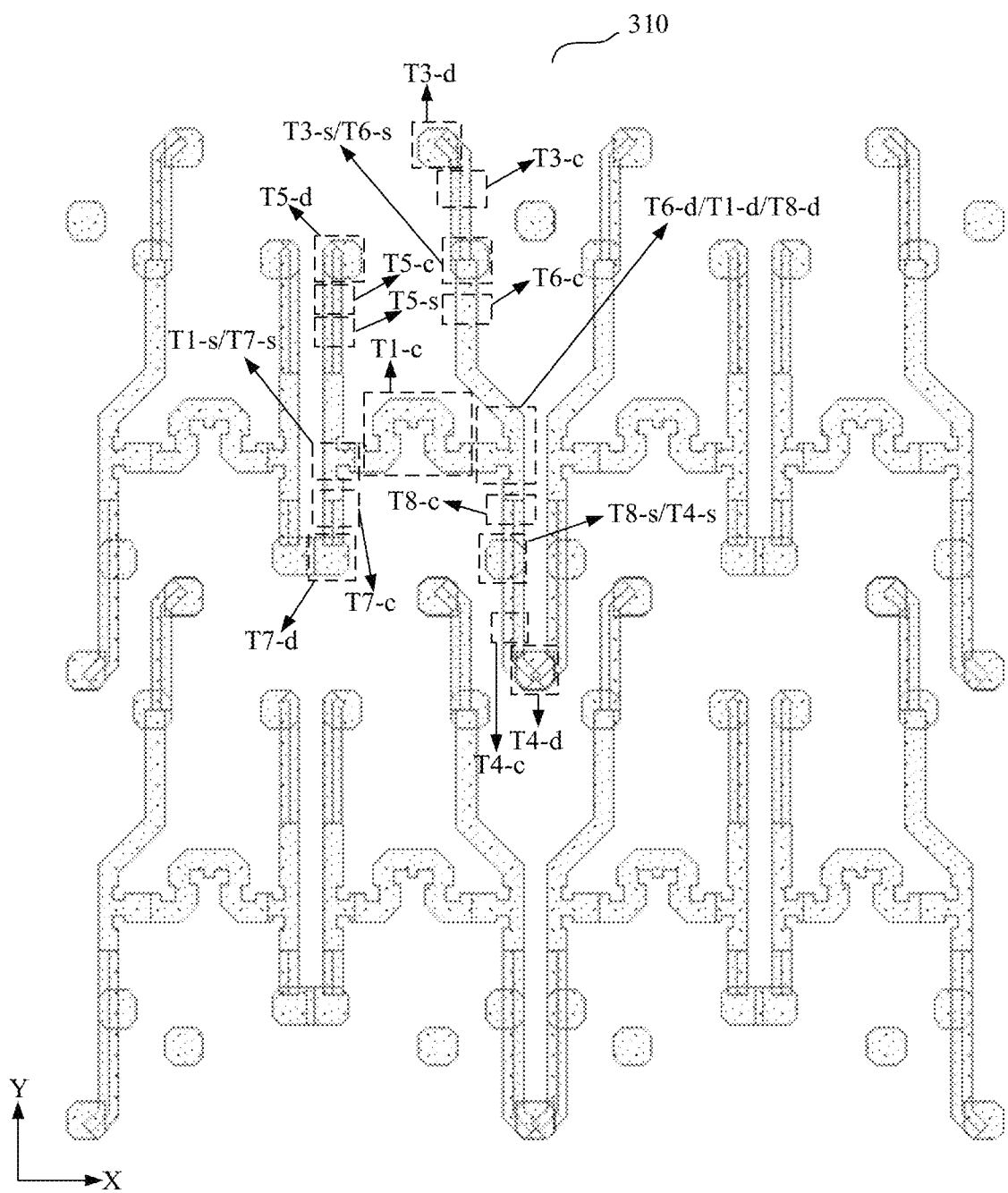
FIG. 25 shows a schematic plan view of a silicon semiconductor layer in an array substrate according to Embodiments 3 and 4 of the present disclosure.

FIG. 25 shows a schematic plan view of a silicon semiconductor layer 310 in an array substrate according to an embodiment of the present disclosure. In an exemplary embodiment of the present disclosure, the driving transistor T1, the driving reset transistor T3, the light emission reset transistor T4, the data writing transistor T5, the compensation transistor T6, the first light emission control transistor T7, and the second light emission control transistor T8 in the pixel circuit are silicon transistors, such as low temperature polysilicon transistors.

In an exemplary embodiment of the present disclosure, the silicon semiconductor layer 310 may be used to form the active regions of the above-described driving transistor T1, driving reset transistor T3, light emission reset transistor T4, data writing transistor T5, compensation transistor T6, first light emission control transistor T7, and second light emission control transistor T8. In an exemplary embodiment of the present disclosure, the silicon semiconductor layer 310 includes a channel region pattern and a doped region pattern of a transistor (i.e., first and second source/drain regions of the transistor). In an embodiment of the present disclosure, the channel region pattern and the doped region pattern of each transistor are integrally provided.

It should be noted that, in FIG. 25, a dotted line frame is used to denote regions in the silicon semiconductor layer 310 for source/drain regions and channel regions of respective transistors.

As shown in FIG. 25, the silicon semiconductor layer 310 includes the channel region T3-c of the driving reset transistor T3, the channel region T5-c of the data writing transistor T5, the channel region T6-c of the compensation transistor T6, the channel region T1-c of the driving transistor T1, the channel region T7-c of the first light emission control transistor T7, the channel region T8-c of the second light emission control transistor T8, and the channel region T4-c of the light emission reset transistor T4, as arranged in sequence along the Y direction (column direction) and the X direction (row direction).

In an exemplary embodiment of the present disclosure, the silicon semiconductor layer used for the above-described transistor may include an integrally formed low temperature polysilicon layer. The source region and the drain region of each transistor may be conductive by doping or the like, so as to realize electrical connections among various structures. That is, the silicon semiconductor layer of the transistor is an overall pattern formed of p-silicon or n-silicon, and each transistor in the same pixel circuit includes a doped region pattern (i.e., including a source region s and a drain region d) and a channel region pattern. The active layers of different transistors are separated by doping structures.

As shown in FIG. 5, the silicon semiconductor layer 310 further includes: a drain region T3-d of the driving reset transistor T3, a drain region T5-d of the data writing transistor T5, a source region T3-s of the driving reset transistor T3, a source region T6-s of the compensation transistor T6, a source region T5-s of the data writing transistor T5, a source region T1-s of the driving transistor T1, a source region T7-s of the first light emission control transistor T7, a drain region T6-d of the compensation transistor T6, a drain region T1-d of the driving transistor T1, a drain region T8-d of the second light emission control transistor T8, a drain region T7-d of the first light emission control transistor T7, a source region T8-s of the second light emission control transistor T8, a source region T4-s of the light emission reset transistor T4, and a drain region T4-d of the light emission reset transistor T4, along the Y direction and the X direction.

In an exemplary embodiment of the present disclosure, the silicon semiconductor layer 310 may be formed of a silicon semiconductor material such as amorphous silicon, polysilicon, or the like. The above-mentioned source region and drain region may be regions doped with n-type impurities or p-type impurities. For example, the source regions and drain regions of the first light emission control transistor T7, the data writing transistor T5, the driving transistor T1, the compensation transistor T6, the driving reset transistor T3, the light emission reset transistor T4 and the second light emission control transistor T8 are regions doped with P-type impurities.

It should be noted that the drain region T4-d of the light emission reset transistor T4 of a pixel circuit in the same row of pixel circuits of the repeating unit according to an embodiment of the present disclosure may be shared with the drain region T4-d of the light emission reset transistor T4 in the adjacent pixel circuit at one side thereof; and forms an integral structure with the drain region T7-d of the first light emission control transistor T7 in the adjacent pixel circuit on the other side thereof.

In addition, it should be noted that the orthographic projection of the channel region T1-c of the driving transistor T1 on the substrate is located within the orthographic projection of the second block shielding part 3092 on the substrate.

In an embodiment of the present disclosure, the array substrate further includes a first conductive layer 320 on a side of the silicon semiconductor layer away from the substrate.

Figure 26:
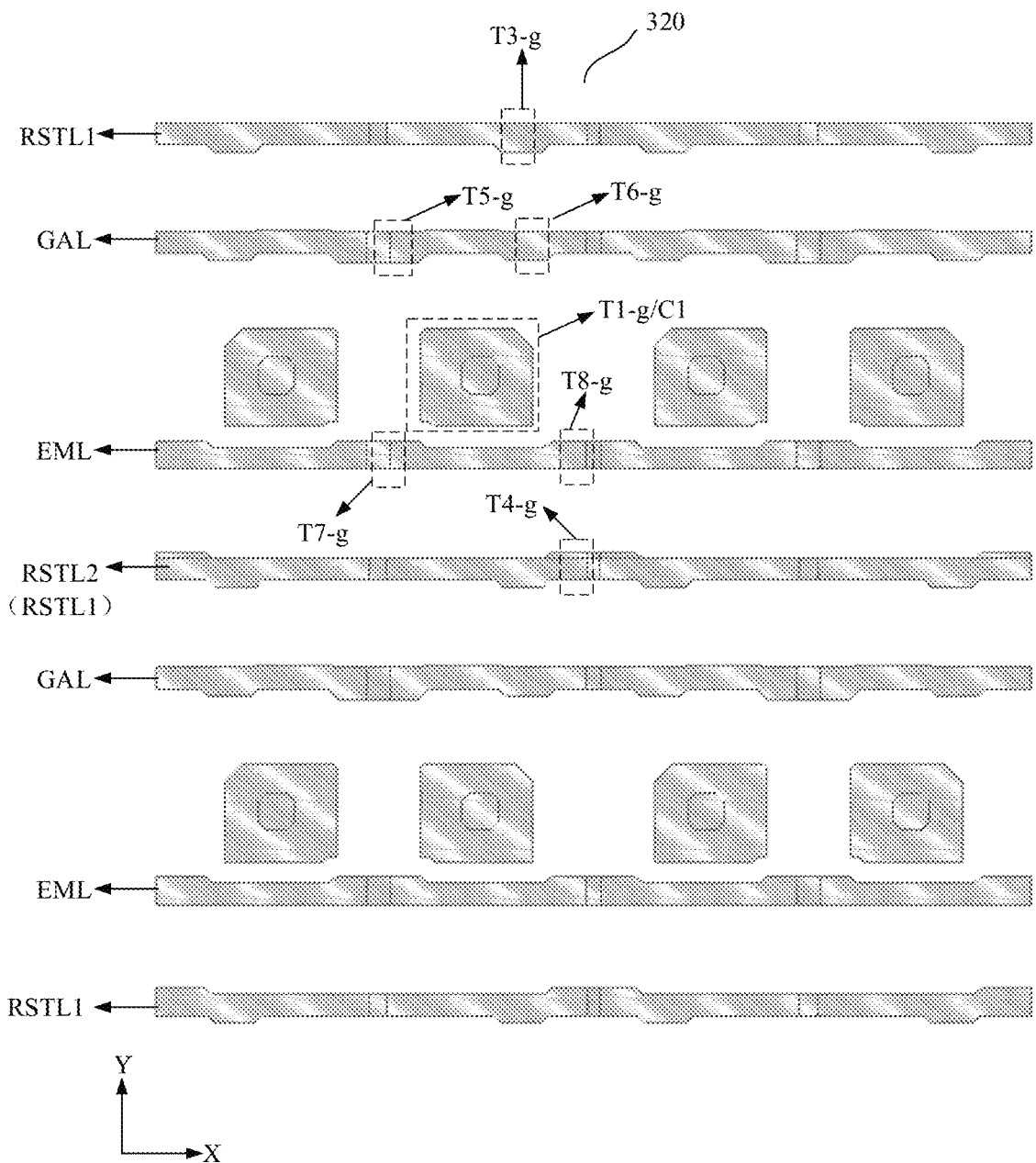
FIG. 26 shows a schematic plan view of a first conductive layer in an array substrate according to Embodiments 3 and 4 of the present disclosure.

FIG. 26 shows a schematic plan view of the first conductive layer 320 in an array substrate according to Embodiment 3 of the present disclosure. As shown in FIG. 26, the first conductive layer 320 includes a first reset control signal line RSTL1, a scan signal line GAL, a first terminal C1 of the storage capacitor C (the gate T1-g of the driving transistor T1), the light emission control signal line EML, and the second reset control signal line RSTL2 as arranged in sequence along the Y direction, the specific positional relationships of which are shown in FIG. 26 and will not be described in detail here.

It should be noted that each pixel circuit arranged in the X direction may share a first reset control signal line RSTL1, a scan signal line GAL, a light emission control signal line EML, and a second reset control signal line RSTL2. In addition, the second reset control signal line RSTL2 in one row of pixel circuits among the two adjacent rows of pixel circuits in the Y direction may be used as the first reset control signal line RSTL1 in the next row of pixel circuits.

In an embodiment of the present disclosure, the light emission control signal line EML is coupled to the light emission control signal input terminal EM, and is configured to provide the light emission control signal input terminal EM with the light emission control signal EMS.

In an embodiment of the present disclosure, the scan signal line GAL is coupled to the scan signal input terminal Gate and the compensation control signal input terminal Com, and is configured to provide the scan signal GA to the scan signal input terminal Gate, and is further configured to provide the compensation control signal to the compensation control signal input terminal Com.

In an embodiment of the present disclosure, the gate T1-g of the driving transistor T1 may also serve as the first terminal C1 of the storage capacitor C in an integrated structure. It should be noted that the orthographic projection of the first terminal C1 of the storage capacitor C on the substrate is located within the orthographic projection of the second block shielding part 3092 on the substrate.

In an embodiment of the present disclosure, the first reset control signal line RSTL1 is coupled to the driving reset control signal input terminal Rst1 to provide the reset control signal RST to the driving reset control signal input terminal Rst1.

In an embodiment of the present disclosure, referring to FIG. 25 and FIG. 26, the part where the orthographic projection of the first reset control signal line RSTL1 on the substrate overlaps the orthographic projection of the silicon semiconductor layer 310 on the substrate is the gate T3-g of the driving reset transistor T3 of the pixel circuit. The part where the orthographic projection of the scan signal line GAL on the substrate overlaps the orthographic projection of the silicon semiconductor layer 310 on the substrate is the gate T5-g of the data writing transistor T5 and the gate T6-g of the compensation transistor T6 in the pixel circuit, respectively. The part where the orthographic projection of the first terminal C1 of the storage capacitor C in the pixel circuit on the substrate overlaps the orthographic projection of the silicon semiconductor layer 310 on the substrate is the gate T1-g of the driving transistor T1 in the pixel circuit. The part where the orthographic projection of the light emission control signal line EML on the substrate overlaps the orthographic projection of the silicon semiconductor layer 310 on the substrate is the gate T7-g of the first light emission control transistor T7 and the gate T8-g of the second light emission control transistor T8 in the pixel circuit, respectively.

In an embodiment of the present disclosure, the second reset control signal line RSTL2 is coupled to the light emission reset control signal input terminal Rst2 to provide the light emission reset control signal input terminal Rst2 with the reset control signal RST.

In an embodiment of the present disclosure, the part where the orthographic projection of the second reset control signal line RSTL2 on the substrate overlaps the orthographic projection of the silicon semiconductor layer 310 on the substrate is the gate T4-g of the light emission reset transistor T4 of the pixel circuit.

It should be noted that the active regions of the transistors shown in FIG. 26 correspond to respective regions where the first conductive layer 320 and the silicon semiconductor layer 310 overlap with each other.

In an embodiment of the present disclosure, the array substrate further includes a second conductive layer 330 located on a side of the first conductive layer 320 away from the substrate and insulated from the first conductive layer 320.

Figure 27:
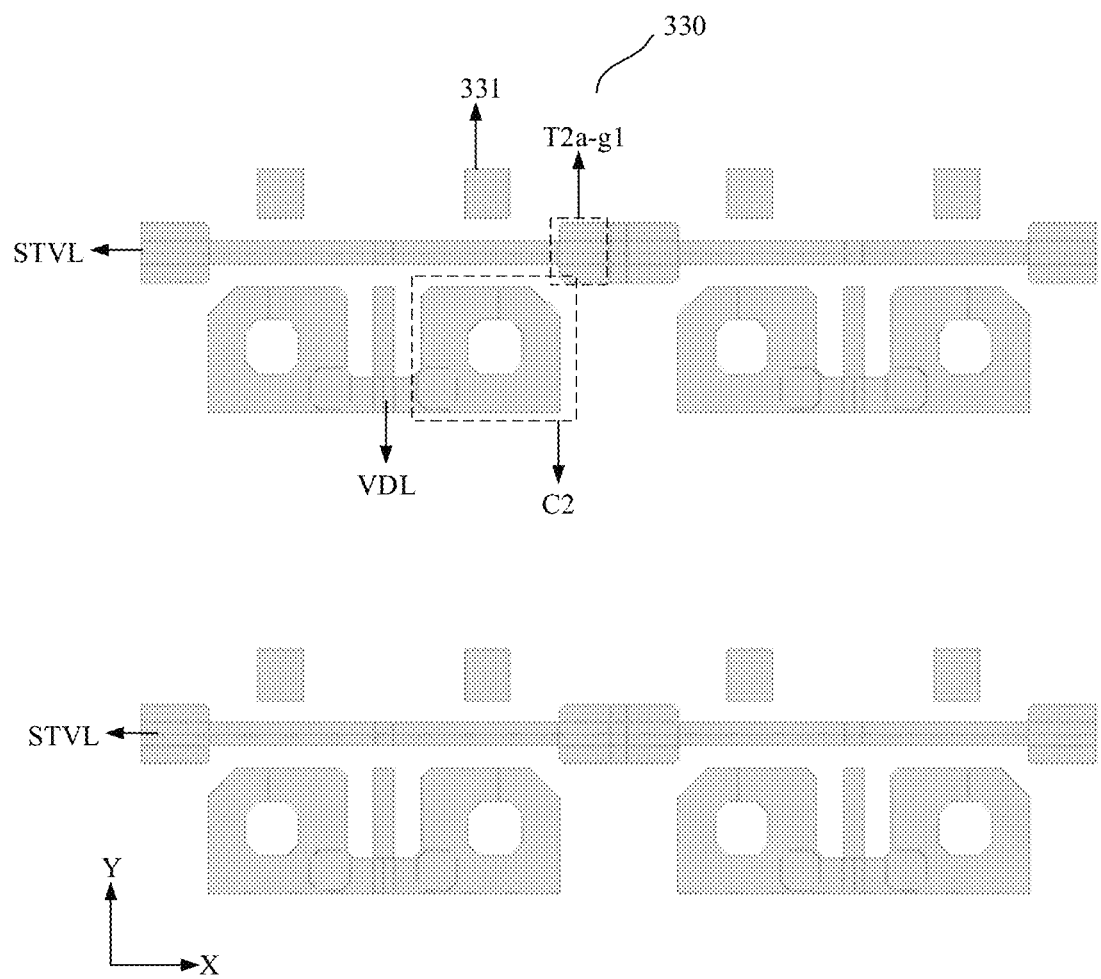
FIG. 27 shows a schematic plan view of a second conductive layer in an array substrate according to Embodiments 3 and 4 of the present disclosure.

FIG. 27 shows a schematic plan view of the second conductive layer 330 in an array substrate according to Embodiment 3 of the present disclosure. As shown in FIG. 27, the second conductive layer 330 includes a voltage stabilizing block 331, a voltage stabilizing control signal line STVL, a second terminal C2 of the storage capacitor C, and a first power voltage line VDL as disposed in the Y direction. Reference may be made to FIG. 27 for the specific positional relationships.

In an embodiment of the present disclosure, referring to FIGS. 26 and 27, the projections of the second terminal C2 of the storage capacitor C and the first terminal C1 of the storage capacitor C on the substrate at least partially overlap with each other.

In an embodiment of the present disclosure, as shown in FIG. 27, the first power voltage line VDL in each pixel circuit extends along the X direction and is integrally formed with the second terminal C2 of the storage capacitor C. The first power voltage line VDL is coupled to the first power voltage terminal VDD, and is configured to provide the first power voltage Vdd thereto. The voltage stabilizing control signal line STVL is coupled to the voltage stabilizing control signal input terminal Sty, and is configured to provide the voltage stabilizing control signal STV thereto.

In a pixel circuit among the same row of pixel circuits of the repeating unit according to an embodiment of the present disclosure, the second terminal C2 of the storage capacitor C and the first power voltage line VDL may be formed as an integral structure with the second terminal C2 of the storage capacitor C and the first power voltage line VDL in the adjacent pixel circuit at one side thereof; and may be further arranged at intervals with respect to the second terminal C2 of the adjacent storage capacitor C and the first power voltage line VDL at the other side thereof.

In an embodiment of the present disclosure, the orthographic projection of the second terminal C2 of the storage capacitor C on the substrate is located within the orthographic projection of the second block shielding part 3092 on the substrate. The orthographic projection of the voltage stabilizing block 331 on the substrate is located within the orthographic projection of the first block shielding part 3091 on the substrate.

In an embodiment of the present disclosure, as shown in FIG. 27, the voltage stabilizing control signal line STVL is provided with the first gate T2a-g1 of the voltage stabilizing transistor T2a.

In an embodiment of the present disclosure, the array substrate further includes an oxide semiconductor layer 340 located on the side of the second conductive layer 330 away from the substrate and insulated from the second conductive layer 330.

Figure 28:
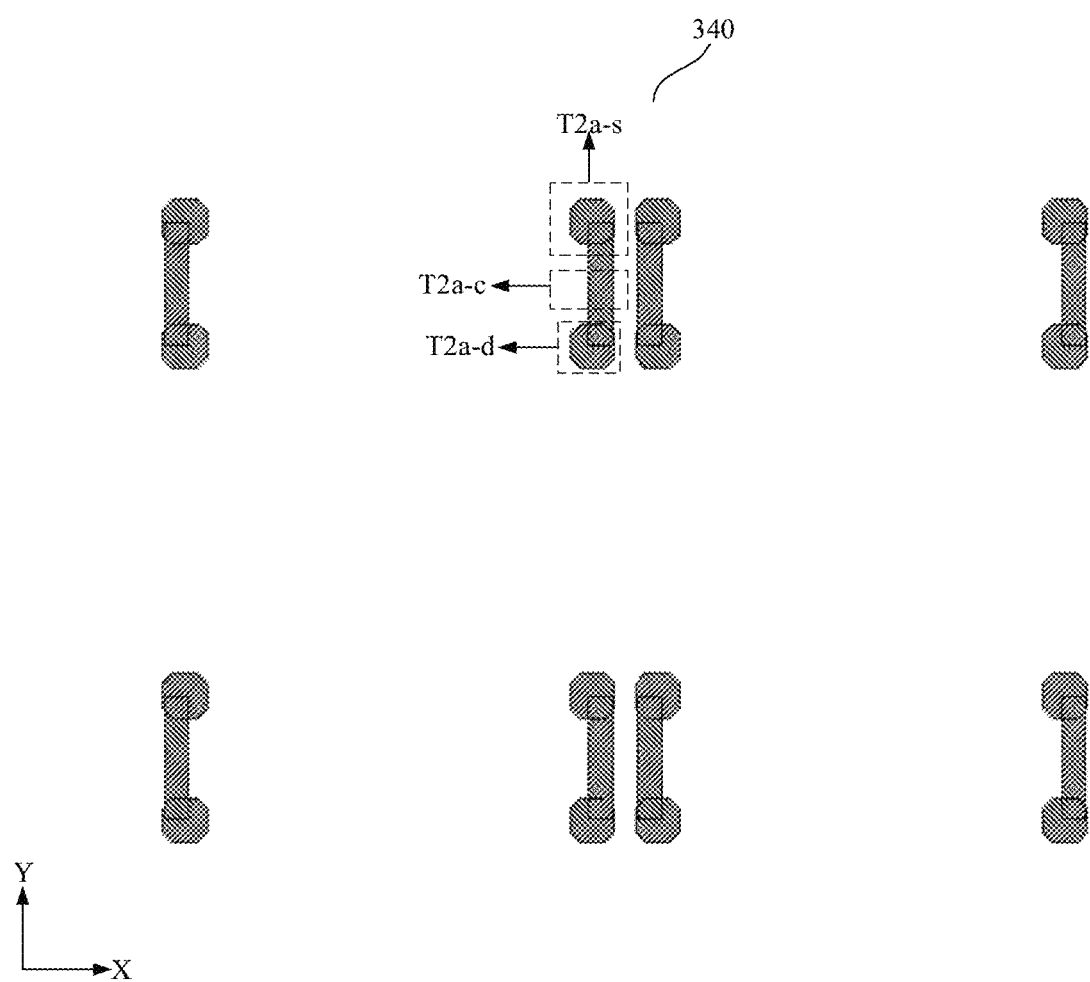
FIG. 28 shows a schematic plan view of an oxide semiconductor layer in an array substrate according to Embodiments 3 and 4 of the present disclosure.

FIG. 28 shows a schematic plan view of the oxide semiconductor layer 340 in an array substrate according to Embodiment 3 of the present disclosure. In an exemplary embodiment of the present disclosure, the oxide semiconductor layer 340 may be used to form the active layer of the above-described voltage stabilizing transistor T2a.

In an exemplary embodiment of the present disclosure, similar to the silicon semiconductor layer 310, the oxide semiconductor layer 340 includes a channel pattern and a doped region pattern of a transistor (i.e., a first source/drain region and a second source/drain region of the transistor).

In FIG. 28, a dotted line frame is used to show regions of the source/drain regions and the channel region of the voltage stabilizing transistor T2a in the oxide semiconductor layer 340.

As shown in FIG. 28, the oxide semiconductor layer 340 sequentially includes the source region T2a-s of the voltage stabilizing transistor T2a, the channel region T2a-c of the voltage stabilizing transistor T2a, and the drain region T2a-d of the voltage stabilizing transistor T2a along the Y direction.

In an embodiment of the present disclosure, referring to FIGS. 27 and 28, the overlapping part between the orthographic projection of the voltage stabilizing control signal line STVL on the substrate and the orthographic projection of the oxide semiconductor layer 340 on the substrate is the first gate T2a-g1 of the voltage stabilizing transistor T2a. The channel region T2a-c of the voltage stabilizing transistor T2a completely overlap the projection of the first gate T2a-g1 of the voltage stabilizing transistor T2a on the substrate.

In an exemplary embodiment of the present disclosure, the oxide semiconductor layer 340 may be formed of an oxide semiconductor material, such as, indium gallium zinc oxide IGZO. The above-mentioned source region and drain region may be regions doped with n-type impurities or p-type impurities. For example, both the source region and the drain region of the voltage stabilizing transistor T2a are regions doped with N-type impurities.

In an embodiment of the present disclosure, the array substrate further includes a third conductive layer 350 located on the side of the oxide semiconductor layer 340 away from the substrate and insulated from the oxide semiconductor layer.

Figure 29:
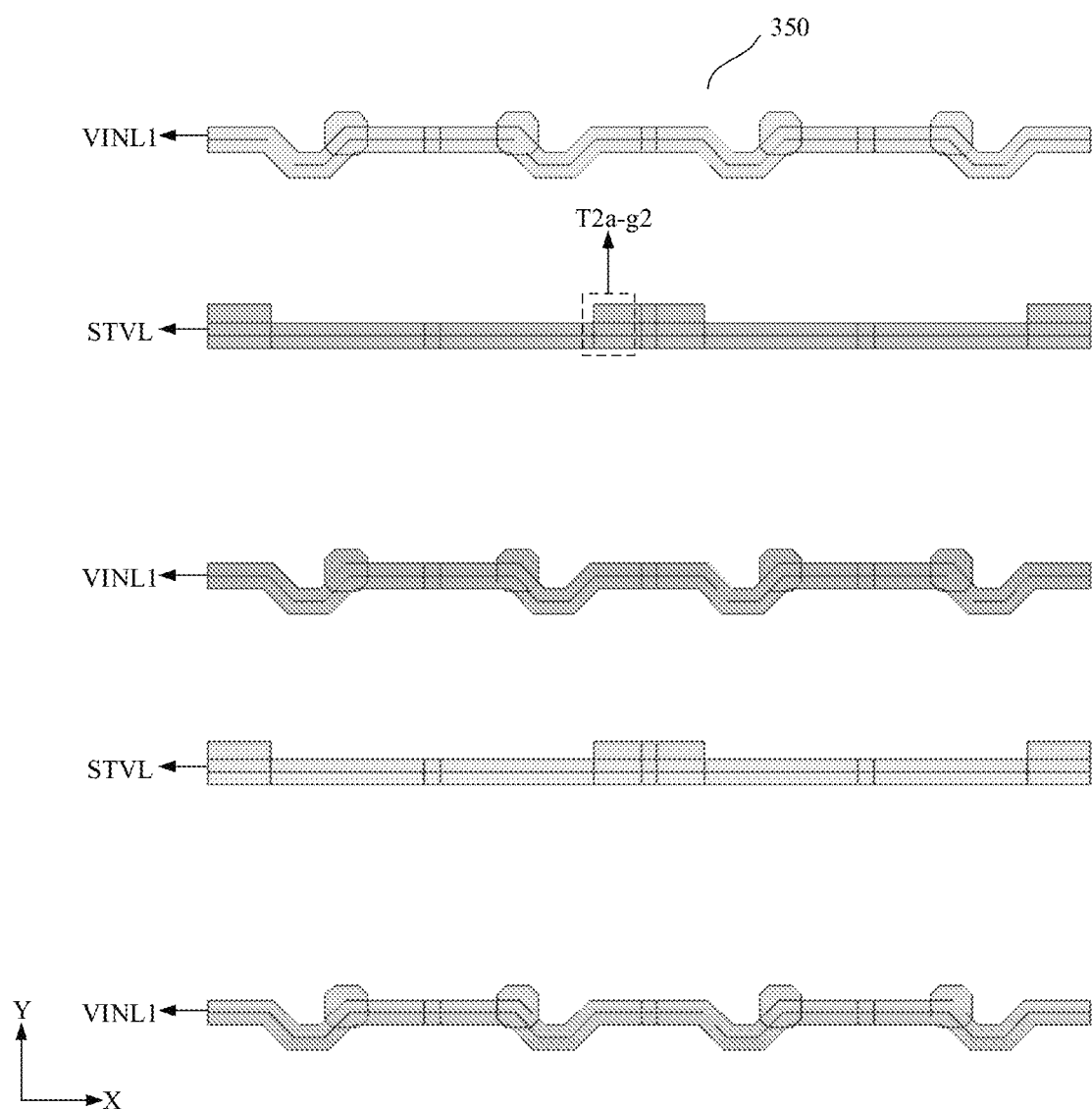
FIG. 29 shows a schematic plan view of a third conductive layer in an array substrate according to Embodiments 3 and 4 of the present disclosure.

FIG. 29 shows a schematic plan view of the third conductive layer 350 in an array substrate according to an embodiment of the present disclosure. In an exemplary embodiment of the present disclosure, the third conductive layer 350 may include a voltage stabilizing control signal line STVL and a first reset voltage line VINL1. The voltage stabilizing control signal line STVL is provided with the first gate T2a-g2 of the voltage stabilizing transistor T2a. In an embodiment of the present disclosure, referring to FIG. 27, FIG. 28 and FIG. 29, projections of on the substrate of the second gate T2a-g2 of the voltage stabilizing transistor T2a, the channel region T2a-c of the voltage stabilizing transistor T2a, and the first gate T2a-g1 of the voltage stabilizing transistor T2a completely overlap.

It should be noted that, in an embodiment of the present disclosure, the pixel circuits located in the same row may share a voltage stabilizing control signal line STVL and a first reset voltage line VINL1 of the third conductive layer 350.

In addition, it should be noted that each row of repeating units corresponds to two first reset voltage lines VINL1. Two adjacent ones of the three first reset voltage lines VINL1 shown in FIG. 29 correspond to a row of repeating units, and the remaining one (such as the first reset voltage line VINL1 at the bottom in FIG. 29) belongs to the next row of repeating units.

In some embodiments of the present disclosure, an insulation layer or a dielectric layer is further provided between adjacent active semiconductor layer and conductive layer or between adjacent conductive layers, respectively. Specifically, an insulation layer or a dielectric layer (which will be described in detail below with reference to the cross-sectional view) is further provided respectively between the silicon semiconductor layer 310 and the first conductive layer 320, between the first conductive layer 320 and the second conductive layer 330, between the second conductive layer 330 and the oxide semiconductor layer 340, between the oxide semiconductor layer 340 and the third conductive layer 350, between the third conductive layer 350 and the fourth conductive layer 360 (which will be described in detail below with reference to FIG. 12), and between the fourth conductive layer 360 and the fifth conductive layer 370 (which will be described in detail below with reference to FIG. 11).

It should be noted that the via hole described below is a via hole simultaneously penetrating through the insulation layer or dielectric layer provided between adjacent active semiconductor layer and conductive layer or between adjacent conductive layers. Specifically, the via hole penetrates simultaneously through the insulation layer or dielectric layer provided between the silicon semiconductor layer 310 and the first conductive layer 320, between the first conductive layer 320 and the second conductive layer 330, between the second conductive layer 330 and the oxide semiconductor layer 340, between the oxide semiconductor layer 340 and the third conductive layer 350, between the third conductive layer 350 and the fourth conductive layer 360, and between the fourth conductive layer 360 and the fifth conductive layer 370.

In the drawings of the present disclosure, white circles are used to indicate regions corresponding to via holes.

In an embodiment of the present disclosure, the array substrate further includes a fourth conductive layer 360 located on the side of the third conductive layer 35 away from the substrate and insulated from the third conductive layer 350.

Figure 30:
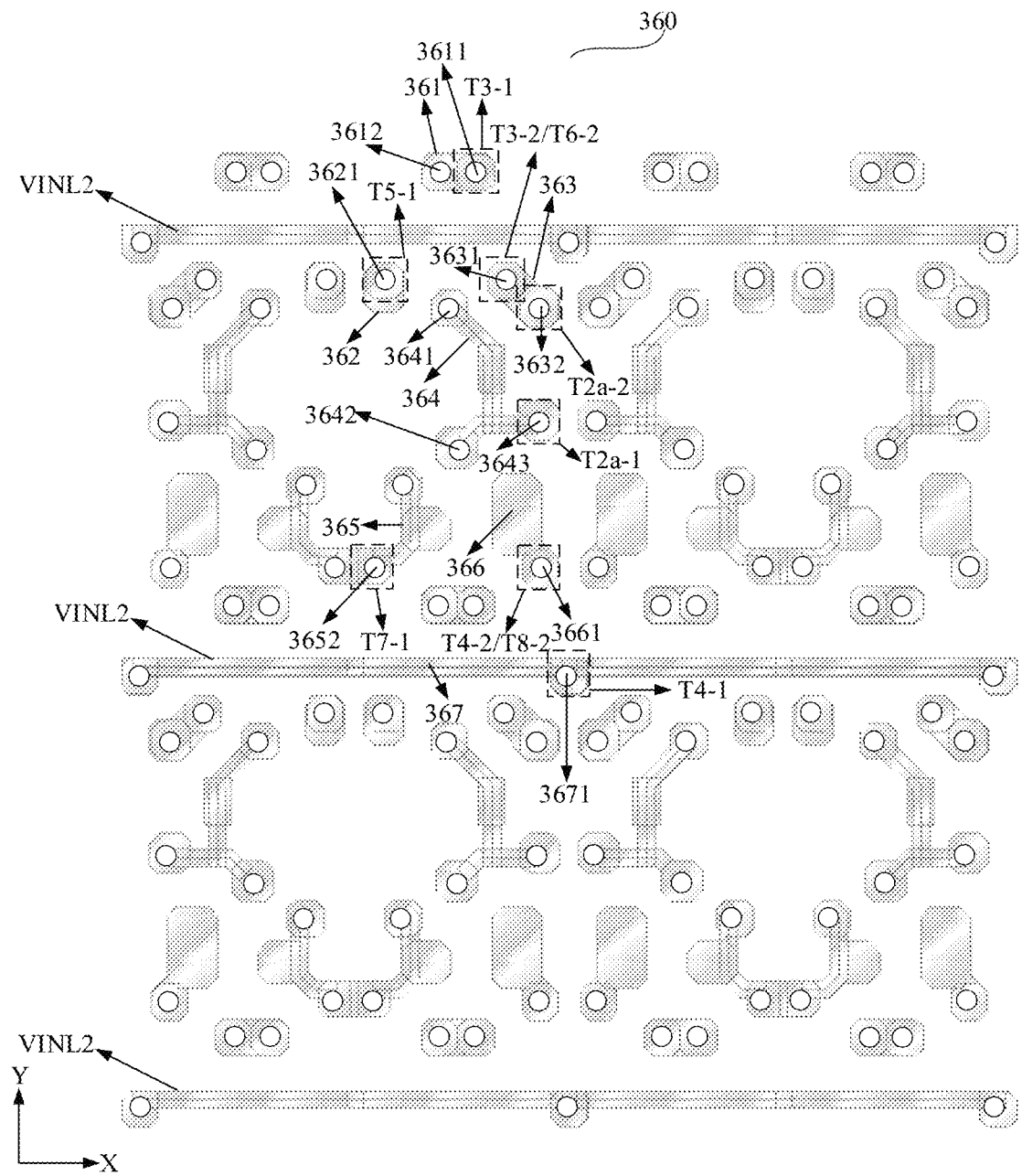
FIG. 30 shows a schematic plan view of a fourth conductive layer in an array substrate according to Embodiments 3 and 4 of the present disclosure.

FIG. 30 shows a schematic plan view of the fourth conductive layer 360 in an array substrate according to Embodiment 3 of the present disclosure. As shown in FIG. 30, the fourth conductive layer 360 in each pixel circuit may include a first connection part 361, a second connection part 362, a third connection part 363, a fourth connection part 364, a fifth connection part 365, a sixth connection part 366 and a seventh connection part 367. The specific relationships are shown in FIG. 30, and details are not described here.

In an embodiment of the present disclosure, the second connection part 362, the third connection part 363, the fourth connection part 364, the fifth connection part 365, and the sixth connection part 366 are provided at a middle position between the first connection part 361 and the seventh connection part 367. The specific positions are shown in FIG. 30.

The first connection part 361 is coupled to the silicon semiconductor layer 310 through the via hole 3611. Specifically, the first connection part 361 is coupled to the drain region T3-d of the driving reset transistor T3 through the via hole 3611, forming the first terminal T3-1 of the driving reset transistor T3. The first connection part 361 is coupled to the first reset voltage line VINL1 in the third conductive layer 360 through the via hole 3612.

The second connection part 362 is coupled to the silicon semiconductor layer 310 through the via hole 3621. Specifically, the second connection part 362 is coupled to the drain region T5-d of the data writing transistor T5 through the via hole 3621, forming the first terminal T5-1 of the data writing transistor T5.

The third connection part 363 is coupled to the silicon semiconductor layer 310 through the via hole 3631. Specifically, the third connection part 363 is coupled to the source region of the driving reset transistor T3 and the source region T3-s/T6-s of the compensation transistor T6 through the via hole 3631, forming the second terminal of the driving reset transistor T3 and the second terminal T3-2/T6-2 of the compensation transistor T6. The third connection part 363 is coupled to the oxide semiconductor layer 340 through the via hole 3632. Specifically, the third connection part 363 is coupled to the source region T2a-s of the voltage stabilizing transistor T2a through the via hole 3632 to form the second terminal T2a-2 of the voltage stabilizing transistor T2a.

The fourth connection part 364 is coupled to the second conductive layer 330 through the via hole 3641, specifically to the voltage stabilizing block 331 located on the side of the voltage stabilizing control signal line STVL away from the second terminal C2 of the storage capacitor C in FIG. 7, so as to realize the voltage stabilizing effect. Besides, the fourth connection part 364 is also coupled to the first conductive layer 320 through the via hole 3642. Specifically, the fourth connection part 364 is coupled to the gate T1-g of the driving transistor T1 and the first terminal C1 of the storage capacitor C through the via hole 3642. The fourth connection part 364 is coupled to the oxide semiconductor layer 340 through the via hole 3643. Specifically, the fourth connection part 364 is coupled to the drain region T2a-d of the voltage stabilizing transistor T2a through the via hole 3643 to form the first terminal T2a-1 of the voltage stabilizing transistor T2a.

The fifth connection part 365 is coupled to the second conductive layer 330 through the via hole 3651. Specifically, the fifth connection part 365 is coupled to the first power voltage line VDL and the second terminal C2 of the storage capacitor C through the via hole 3651. The fifth connection part 365 is coupled to the silicon semiconductor layer 310 through the via hole 3652. Specifically, the fifth connection part 365 is coupled to the drain region T7-d of the first light emission control transistor T7 through the via hole 3652 to form the first terminal T7-1 of the first light emission control transistor T7.

It should be noted that, in a pixel circuit among the same row of pixel circuits of the repeating unit according to an embodiment of the present disclosure, the first terminal T7-1 of the first light emission control transistor T7 may be formed in an integral structure with the first terminal T7-1 of the first light emission control transistor T7 in the adjacent pixel circuit at one side thereof; and may be further spaced apart from the first terminal T7-1 of the adjacent first light emission control transistor T7 at the other side thereof.

The sixth connection part 366 is coupled to the silicon semiconductor layer 310 through the via hole 3661. Specifically, the sixth connection part 366 is coupled to the source region T8-s of the second light emitting control transistor T8 and the source region T4-s of the light emitting reset transistor T4 through the via hole 3661, forming the second terminal T8-2 of the second light emission control transistor T8 and the second terminal T4-2 of the light emission reset transistor T4.

The seventh connection part 367 is coupled to the silicon semiconductor layer 310 through the via hole 3671. Specifically, the first connection part 367 is coupled to the drain region T4-d of the light emission reset transistor T4 through the via hole 3671 to form the first terminal T4-1 of the light emission reset transistor T4. The seventh connection part 367 serves as the second reset voltage line VINL2.

It should be noted that, in an embodiment of the present disclosure, the pixel circuits located in the same row may share a second reset voltage line VINL2 of the fourth conductive layer 360. In addition, it should also be noted that each row of repeating units corresponds to two second reset voltage lines VINL2. Two adjacent ones of the three second reset voltage lines VINL2 shown in FIG. 30 correspond to a row of repeating units, and the remaining one (such as the first reset voltage line VINL1 at the bottom in FIG. 30) belongs to the upper row of repeating units.

In an embodiment of the present disclosure, the array substrate further includes a fifth conductive layer 370 located on the side of the fourth conductive layer 360 away from the substrate and insulated from the fourth conductive layer 360.

Figure 31:
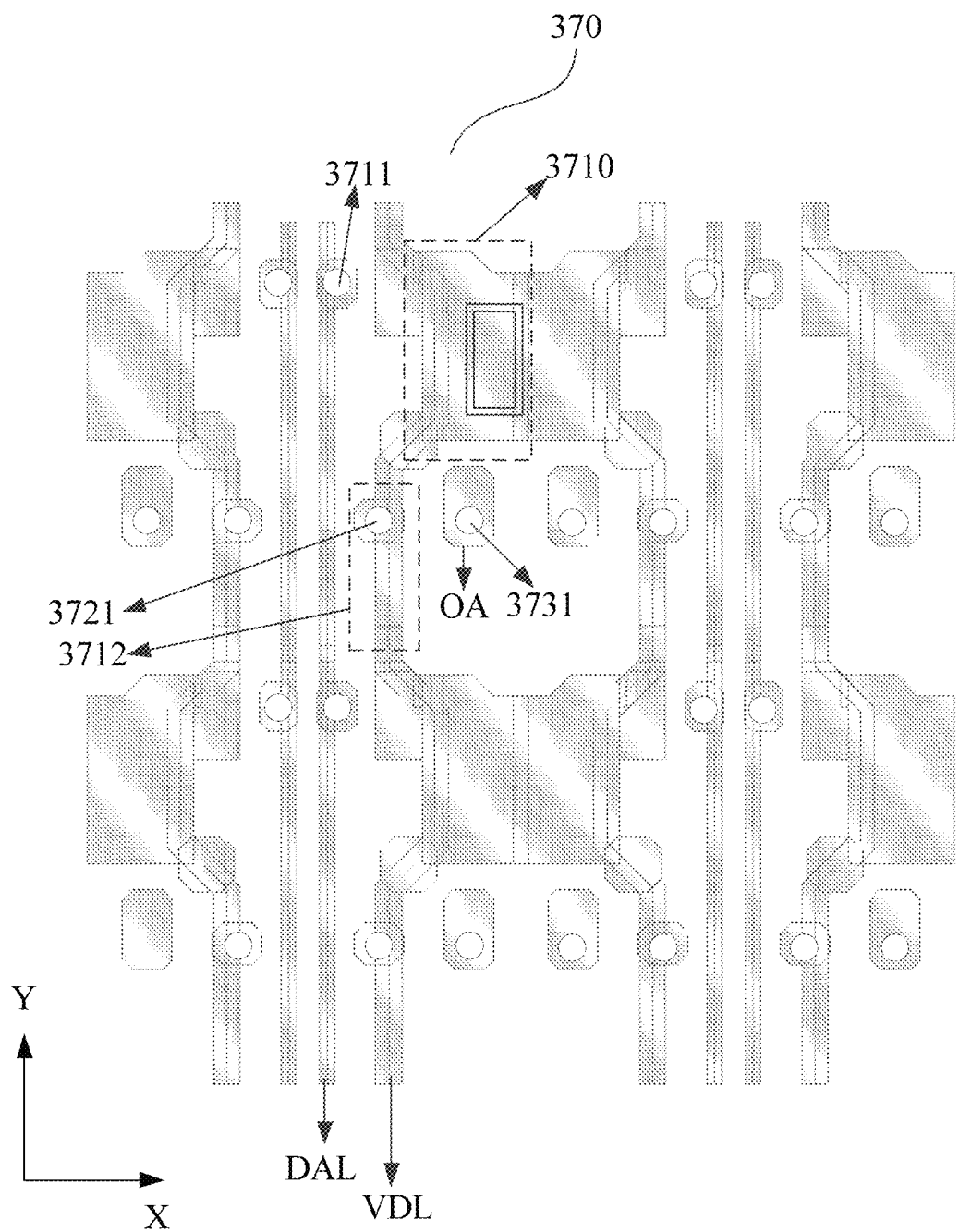
FIG. 31 shows a schematic plan view of a fifth conductive layer in an array substrate according to Embodiment 3 of the present disclosure.

FIG. 31 shows a schematic plan view of the fifth conductive layer 370 in an array substrate according to Embodiment 3 of the present disclosure. As shown in FIG. 31, the fifth conductive layer 370 includes a data signal line DAL, a first power voltage line VDL, and a transfer terminal OA coupled to the first terminal of the light emission device 200, as disposed along the row direction X. The data signal line DAL extends along the column direction Y, and is coupled to the second connection part 362 of the fourth conductive layer 360 through the via hole 3711. The first power voltage line VDL extends along the column direction Y as a whole, and is coupled to the fifth connection part 365 of the fourth conductive layer 360 through the via hole 3721. The transfer terminal OA extends along the column direction Y, and is coupled to the sixth connection part 366 of the fourth conductive layer 360 through the via hole 3731. In an embodiment of the present disclosure, the distance that the transfer terminal OA extends along the column direction Y is smaller than the data signal line DAL and the first power voltage line VDL.

In an embodiment of the present disclosure, the first power voltage line VDL has a barrier part 3710 and a voltage line connection part 3712 which are integrally formed and alternately arranged in the Y direction. The orthographic projection of the barrier part 3710 on the substrate covers the oxide semiconductor layer 340, the third connection part 363 and the fourth connection part 34. Such arrangement enables the oxide semiconductor layer 340 to be isolated from the encapsulation layer arranged on a side of the fifth conductive layer 370 away from the substrate and adjacent to the fifth conductive layer 370. Thus, the hydrogen element in the encapsulation layer is prevented from causing the oxide material, such as the metal oxide material, in the oxide semiconductor layer 340 to become unstable in performance.

The solid line rectangular frame on the barrier part 3710 in FIG. 31 represents a region on the barrier part 3710 corresponding to the recessed region of the first planarization layer. The recessed region may surround the channel region T2a-c of the voltage stabilizing transistor T2a to further extend the path of the hydrogen element in the encapsulation layer entering the channel region T2a-c of the voltage stabilizing transistor T2a, thereby improving the stability of the voltage stabilizing transistor T2a.

It should be noted that the array substrate according to an embodiment of the present disclosure may further be provided with other film layers, for example, the buffer layer 101, the first interlayer insulation layer 103, the second interlayer insulation layer 104, the second gate insulation layer 106, the third interlayer insulation layer 107, the first planarization layer 108 and the second planarization layer 109 as mentioned in FIG. 13 and formed on the substrate 300.

The recessed region 108a shown in FIG. 13 may be formed on the first planarization layer 108 in an embodiment of the present disclosure. The orthographic projection of the recessed region 108a on the substrate 300 surrounds the orthographic projection of the channel region T2a-c of the voltage stabilizing transistor T2a on the substrate 300. The orthographic projection of the barrier part 3710 of the first power voltage line VDL of the fifth conductive layer 370 on the substrate 300 covers the oxide semiconductor layer 370, that is, covering the orthographic projection of the channel region T2a-c of the voltage stabilizing transistor T2a on the substrate 300. In addition, part of the barrier part 3710 is filled in each recessed region 108a. Such scheme increases the path of the H element entering the channel region T2a-c of the voltage stabilizing transistor T2a, thereby improving the stability of the voltage stabilizing transistor T2a.

The barrier part 3710 of the first power voltage line VDL of the fifth conductive layer 370 in a pixel circuit among the same row of pixel circuits of the repeating unit according to an embodiment of the present disclosure may be formed in an integral structure with barrier part 3710 of the first power voltage line VDL of the fifth conductive layer 370 in the adjacent pixel circuit located on one side thereof; and is further spaced apart from the barrier part 3710 of the first power voltage line VDL of the adjacent fifth conductive layer 370 located on the other side thereof.

In an embodiment of the present disclosure, the orthographic projection of the voltage line connection part 3712 of the first power voltage line VDL of the fifth conductive layer 370 on the substrate may overlap the orthographic projection of the vertical strip shielding part 3093 in the shielding layer 309 on the substrate. The voltage line connecting part 3712 of the first power voltage line VDL of the fifth conductive layer 370 and the vertical strip shielding part 3093 of the shielding layer 309 may both extend to the non-display area of the array substrate and are coupled through a via hole structure.

Embodiment 4

The main difference between Embodiment 4 and Embodiment of the present disclosure is that the first planarization layer 108 may not have the recessed region 108a and the annular via hole as shown in FIG. 13. That is to say, the barrier part 3710 of the power voltage line VDL in the fifth conductive layer 370 will not sink due to the first planarization layer 108 being provided with the recessed region 108a and the annular via hole as shown in FIG. 13.

It should be noted that, for other schemes in embodiments of the present disclosure, reference may be made to the descriptions of Embodiment 3, which will not be repeated here.

Figure 32:
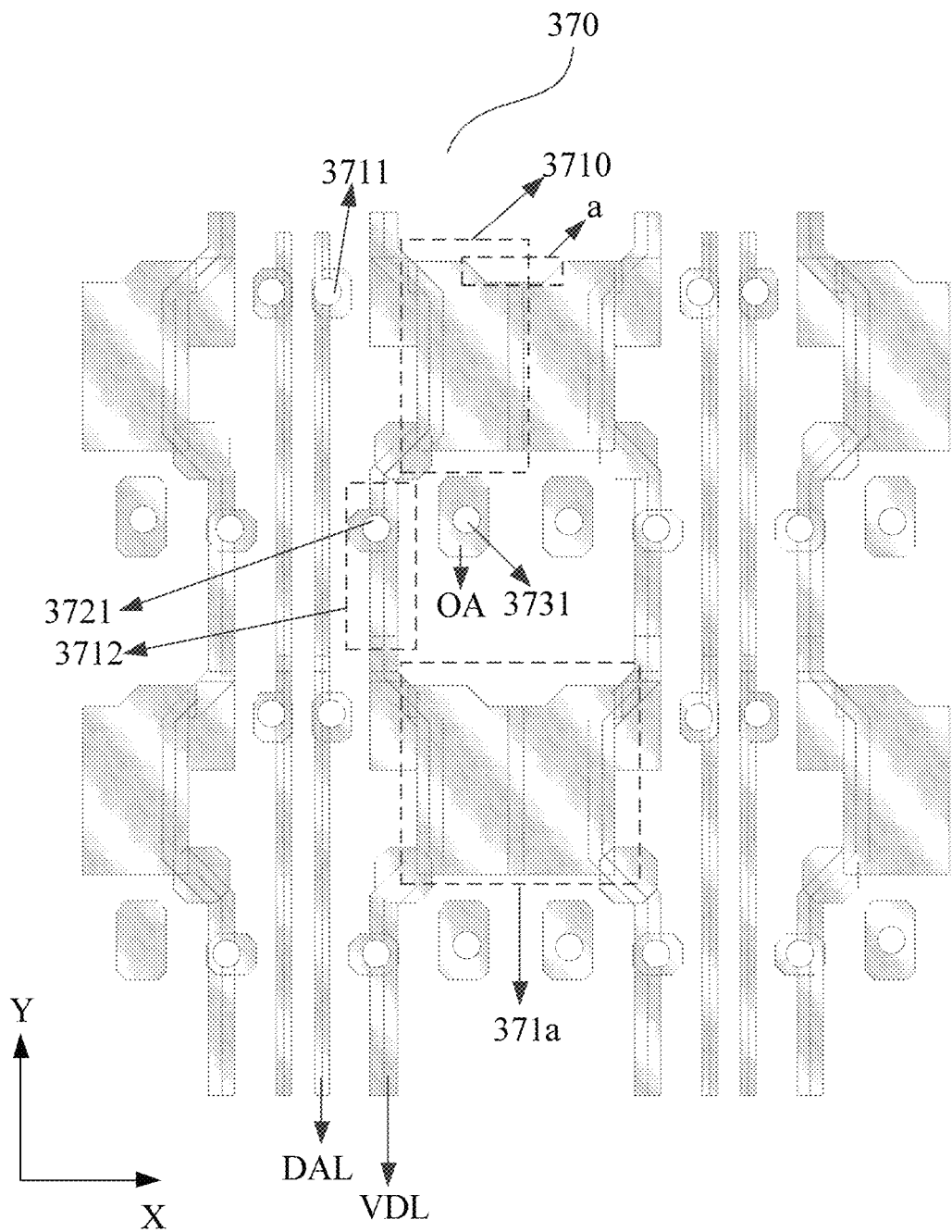
FIG. 32 shows a schematic plan view of a fifth conductive layer in an array substrate according to Embodiment 4 of the present disclosure.

FIG. 32 shows a schematic plan view of the fifth conductive layer 370 in an array substrate according to Embodiment 4 of the present disclosure. Compared with FIG. 31, the solid line annular frame on the barrier part 3710 is missing. This means that the barrier part 3710 of the first power voltage line VDL in the fifth conductive layer 370 will not sink due to the first planarization layer 108 being provided with the recessed region 108a and the annular via hole as shown in FIG. 13.

In an embodiment of the present disclosure, the array substrate may further include a transparent conductive layer located on a side of the second planarization layer 109 away from the fifth conductive layer 370.

Figure 33:
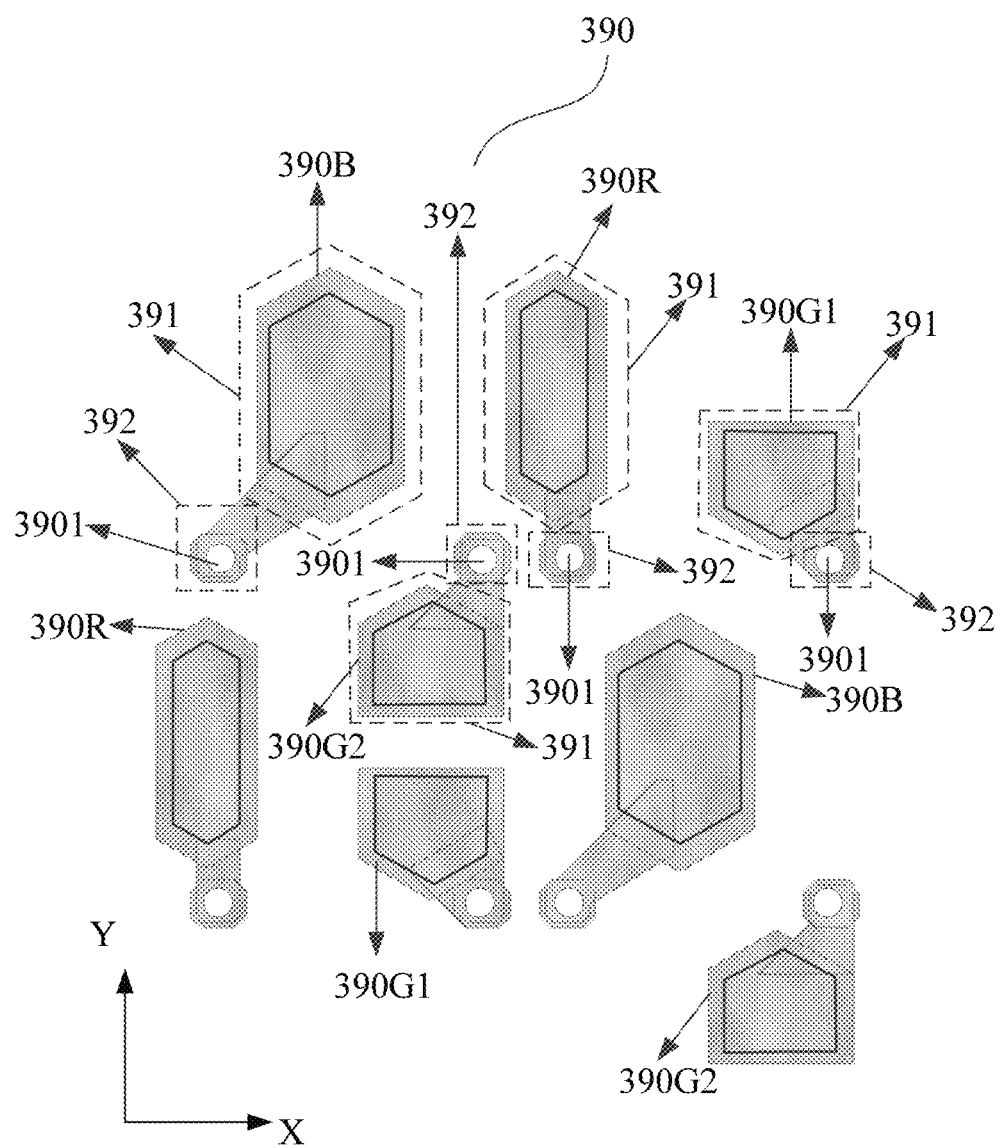
FIG. 33 shows a schematic stacking plan view of a transparent conductive layer and a pixel definition layer as stacked in an array substrate according to Embodiment 4 of the present disclosure.

FIG. 33 is a schematic plan stacking view of the transparent conductive layer and the pixel definition layer after stacking in an array substrate according to Embodiment 4 of the present disclosure. As shown in FIG. 33, the transparent conductive layer in the schematic plan stacking diagram 390 includes anodes of a plurality of light emission devices 200. It should be noted that the sub-pixel SPX of the array substrate according to an embodiment of the present disclosure may have multiple sub-pixels, which are R (red) sub-pixels, G (green) sub-pixels, and B (blue) sub-pixels. That is to say, the light emission colors corresponding to the light emission devices of the R sub-pixel, the G sub-pixel and the B sub-pixel are red light, green light, and blue light, respectively.

In an embodiment of the present disclosure, each pixel unit PX may include four sub-pixels SPX, which are respectively R sub-pixel, G1 (green) sub-pixel, B sub-pixel, and G2 (green) sub-pixel arranged in the X direction. The anodes of the light emission devices in the R sub-pixel, G1 sub-pixel, B sub-pixel, and G2 sub-pixel are respectively defined as the first anode 390R, the second anode 390G1, the third anode 390B, and the fourth anode 390G2. The first anode 390R, the second anode 390G1, the third anode 390B, and the fourth anode 390G2 each includes a main part 391 and a via connection part 392. The via connection part 392 may pass through the via hole 3901 and is coupled to the transfer terminal OA of the fifth conductive layer shown in FIG. 31.

It should be noted that, in FIG. 33, the dotted line frame is used to indicate the region of the main part 391 and the via connection part 392 for each anode in the transparent conductive layer. In FIG. 33, the region on the main part 391 of each anode enclosed by the black solid line frame is the opening region of the pixel definition layer.

In addition, it should also be understood that the orthographic shapes of the main parts 391 of the first anode 390R and the third anode 390B may be hexagonal. The area of the main part 391 of the third anode 390B is larger than that of the main part 391 of the first anode 390R. The orthographic shapes of the main parts 391 of the fourth anode 390G2 and the second anode 390G1 may be the same, and both are pentagons. The areas of the main parts 391 of the fourth anode 390G2 and the second anode 390G1 may be the same. The shape of the pixel opening on the main part 391 of each anode may be similar to the shape thereof.

In an embodiment of the present disclosure, two adjacent pixel circuits are arranged in a mirror symmetrical way. In this way, the barrier part 3710 of the first power voltage line VDL of the fifth conductive layer 370 in some two adjacent pixel circuits may be connected as a barrier unit 371a, as shown in FIG. 32. On the one hand, such scheme helps to prevent the hydrogen element in the encapsulation layer from causing the oxide material in the oxide semiconductor layer 340, such as metal oxide material, to become unstable in performance. On the other hand, because the fifth conductive layer 370 has the barrier unit 371a, it may be also ensured that the anode formed subsequently has good planarizationness, thereby ensuring the light emission effect.

In an embodiment of the present disclosure, the main part 391 of each anode may at least partially overlap the barrier part 3710 of the first power voltage line VDL of the fifth conductive layer 370.

Figure 34:
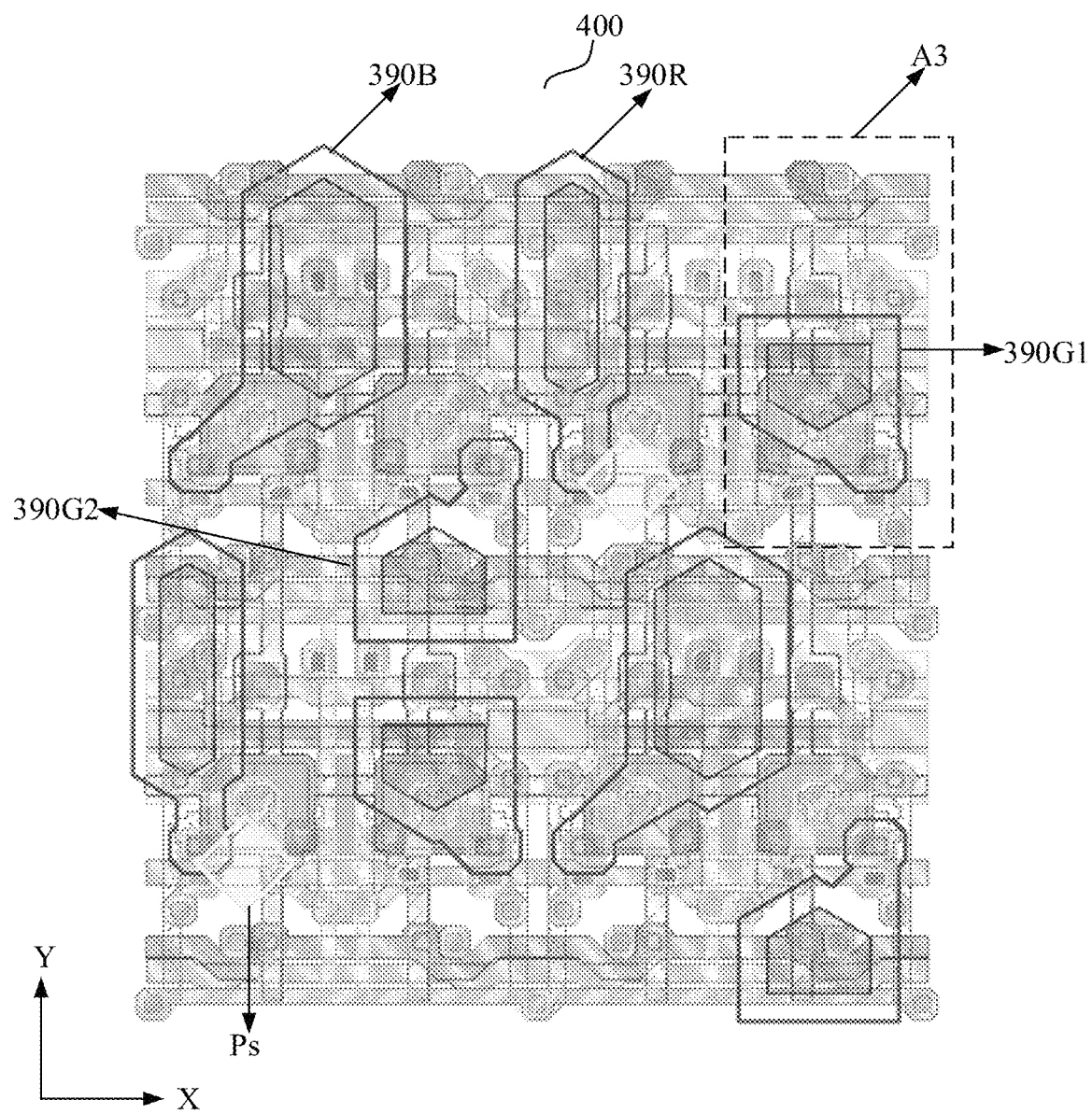
FIG. 34 shows a schematic plan layout view of a shielding layer, a silicon semiconductor layer, a first conductive layer, a second conductive layer, an oxide semiconductor layer, a third conductive layer, a fourth conductive layer, a fifth conductive layer, a transparent conductive layer and a pixel definition layer mentioned above, and a spacer as stacked according to Embodiment 4 of the present disclosure.

FIG. 34 shows a schematic plan layout view of the shielding layer, the silicon semiconductor layer, the first conductive layer, the second conductive layer, the oxide semiconductor layer, the third conductive layer, the fourth conductive layer, the fifth conductive layer, the transparent conductive layer, the pixel definition layer, and the spacer PS after stacking as mentioned in Embodiment 4 of the present disclosure. Besides, FIG. 49 shows a schematic plan layout view of the shielding layer 309, the silicon semiconductor layer 310, and the second conductive layer 330 after stacking in Embodiment 4 of the present disclosure.

Figure 35:
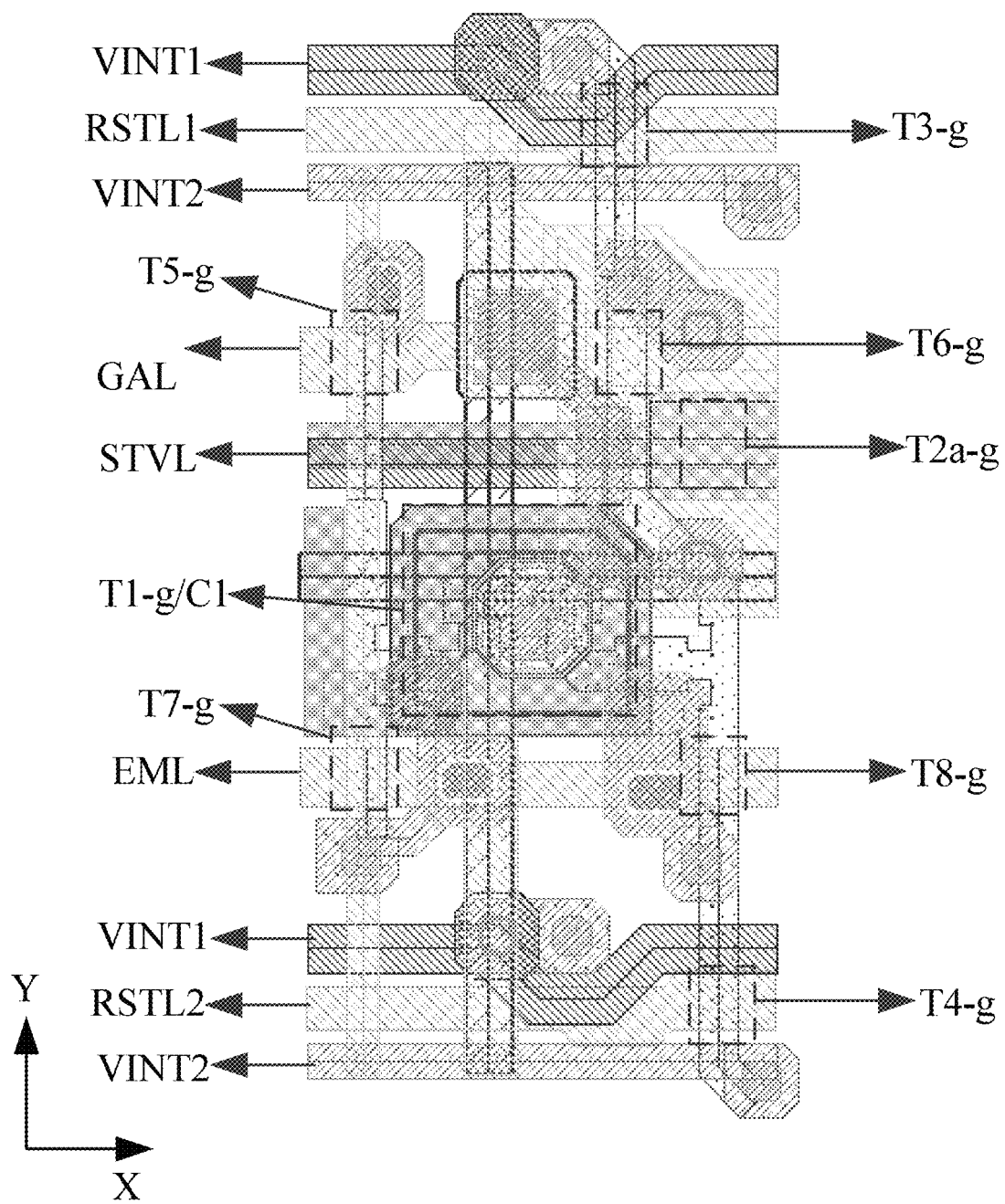
FIG. 35 shows a schematic plan view of a pixel circuit at section A3 in the stacked structure shown in FIG. 34.

As shown in FIG. 34, the schematic plan layout view 400 shows a schematic plan view of 8 sub-pixels in the array substrate. FIG. 35 shows a schematic plan view of the pixel circuit at section A3 in the stacked structure as shown in FIG. 34.

Figure 49:
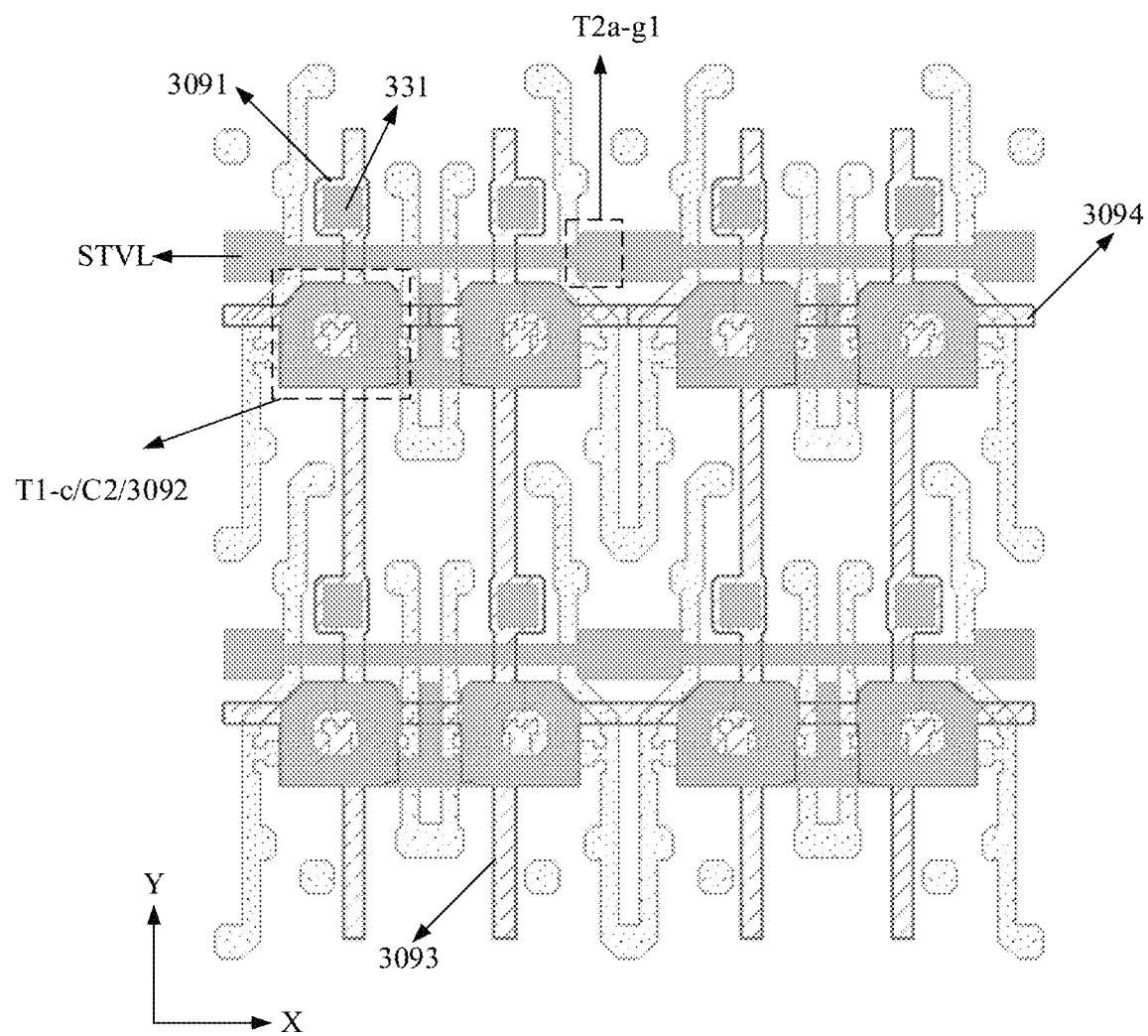
FIG. 49 shows a schematic plan layout view of a shielding layer, a silicon semiconductor layer, and a second conductive layer as stacked according to Embodiment 4 of the present disclosure.

As shown in FIGS. 34, 35 and 49, the pixel circuit includes a shielding layer 309, a silicon semiconductor layer 310, a first conductive layer 320, a second conductive layer 330, an oxide semiconductor layer 340, a third conductive layer 350, a fourth conductive layer 360 and a fifth conductive layer 370. For ease of viewing, FIG. 12 shows the gate T1-g of the driving transistor T1, the gate T2a-g of the voltage stabilizing transistor T2a, the gate T3-g of the driving reset transistor T3, the gate T4-g of the light emission reset transistor T4, the gate T5-g of the data writing transistor T5, the gate T6-g of the compensation transistor T6, the first plate C1 of the storage capacitor C, the gate T7-g of the first light emission control transistor T7 and the gate T8-g of the second light emission control transistor T8.

It should be noted that the spacer PS is formed on the pixel definition layer, and the material thereof may be the same as that of the pixel definition layer, both of which are organic materials. The spacer PS and the pixel definition layer may be formed by a one-time masking process or multiple times of masking process, depending on the specific situations.

Embodiment 5

The main difference between Embodiment 5 and Embodiment 4 of the present disclosure is that the orthographic projection of the main parts 391 of part of the anodes in the transparent conductive layer on the substrate is completely located within the orthographic projection of the barrier unit 371a of the fifth conductive layer 370 on the substrate. Other parts in Embodiment 5 of the present disclosure may be the same as those in Embodiment 4, which will not be described in detail here.

Figure 36:
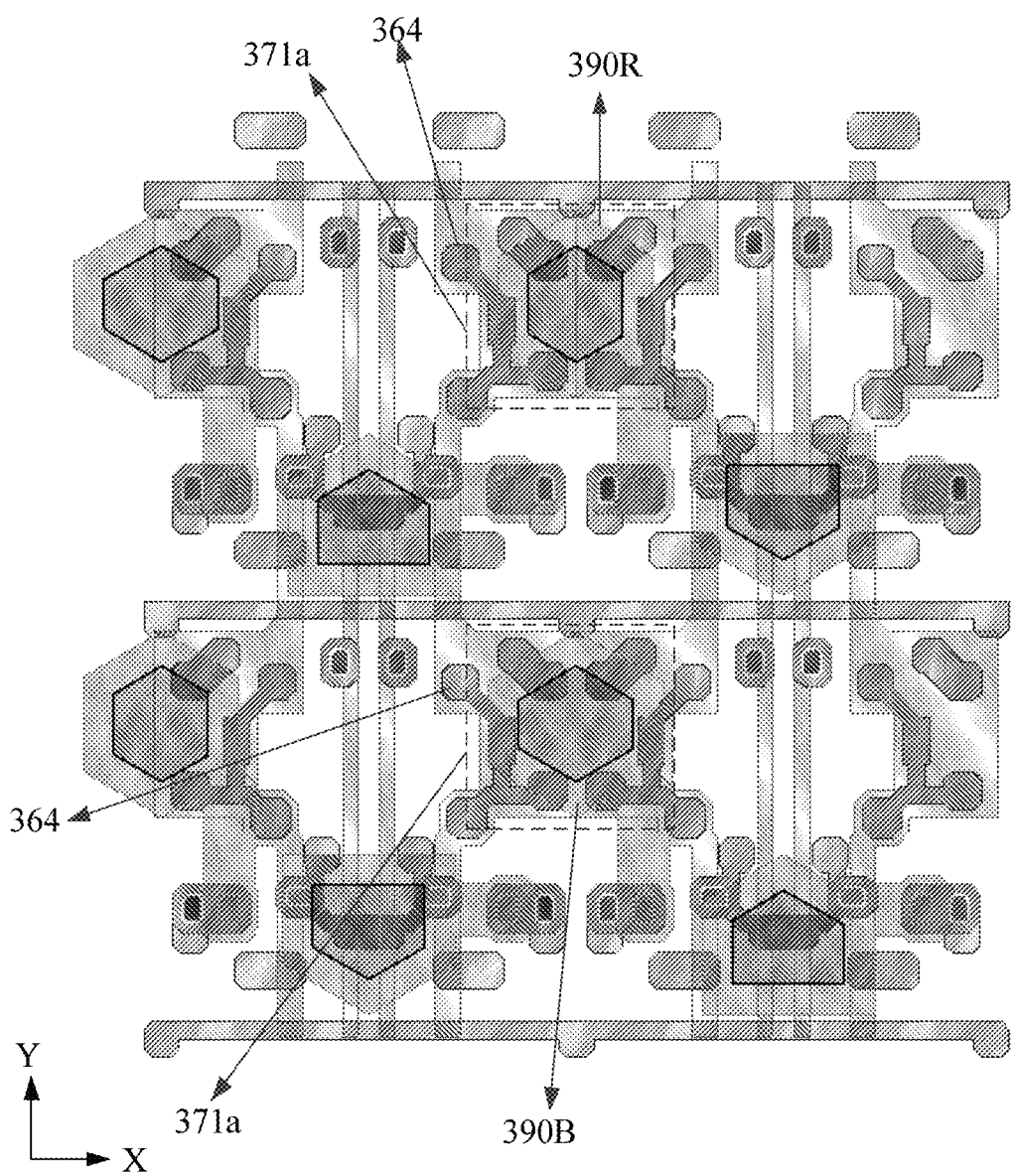
FIG. 36 shows a schematic diagram of the stacking relationship among a fourth conductive layer, a fifth conductive layer, a transparent conductive layer, and a pixel definition layer according to Embodiment 5 of the present disclosure.

Specifically, FIG. 36 shows a schematic diagram of the stacking relationship among the fourth conductive layer, the fifth conductive layer, the transparent conductive layer, and the pixel definition layer as described in Embodiment 5 of the present disclosure.

As shown in FIG. 36, the orthographic projections of the main part 391 of the first anode 390R and the main part 391 of the third anode 390B on the substrate are respectively located within the orthographic projection of the barrier unit 371a of the fifth conductive layer 370 on the substrate. On the one hand, this helps to ensure that the subsequently formed anode has good planarizationness, so as to solve the problem of color shift caused by the uneven anode. On the other hand, this also prevents the hydrogen element in the encapsulation layer from causing the oxide material in the oxide semiconductor layer 340, such as metal oxide material, to become unstable in performance. On yet another hand, due to the presence of the barrier unit 371a in the fifth conductive layer 370, the N1 node in the pixel circuit can also be shielded. That is, the barrier unit 371a can cover the connection part 364 in the fourth conductive layer to shield the N1 node in the pixel circuit.

It should be noted that, in FIG. 36, the dotted line frame is used to indicate the region where the barrier unit 371a of the fifth conductive layer 370 is located. In addition, it should be noted that, while ensuring the pixel opening, the structure of the fifth conductive layer 370 may also be adjusted as compared with Embodiment 4, in order to ensure the planarizationness of the main part 391 of the anode. For example, the notch formed at the connection point in the barrier unit 371a of Embodiment 4 is filled. That is, a side of the barrier part 3710 of the first power voltage line VDL of the fifth conductive layer 370 in each pixel circuit away from the data signal line DAL is not provided with the notch a shown in FIG. 32.

In addition, the main part 391 of the first anode 390R and the main part 391 of the third anode 390B in Embodiment 5 of the present disclosure are also changed from the elongated hexagon in an embodiment into a shape close to a regular hexagon.

Embodiment 6

The main difference between Embodiment 6 and Embodiment 5 of the present disclosure is that the orthographic projection shape of the barrier unit 371a of the fifth conductive layer 370 on the substrate may be respectively similar to the orthographic projection shape on the substrate of the main part 391 of the first anode 390R and the main part 391 of the third anode 390B corresponding thereto. For other parts in Embodiment 6 of the present disclosure, reference may be made to those in Embodiment 5, which will not be described in detail here.

Figure 37:
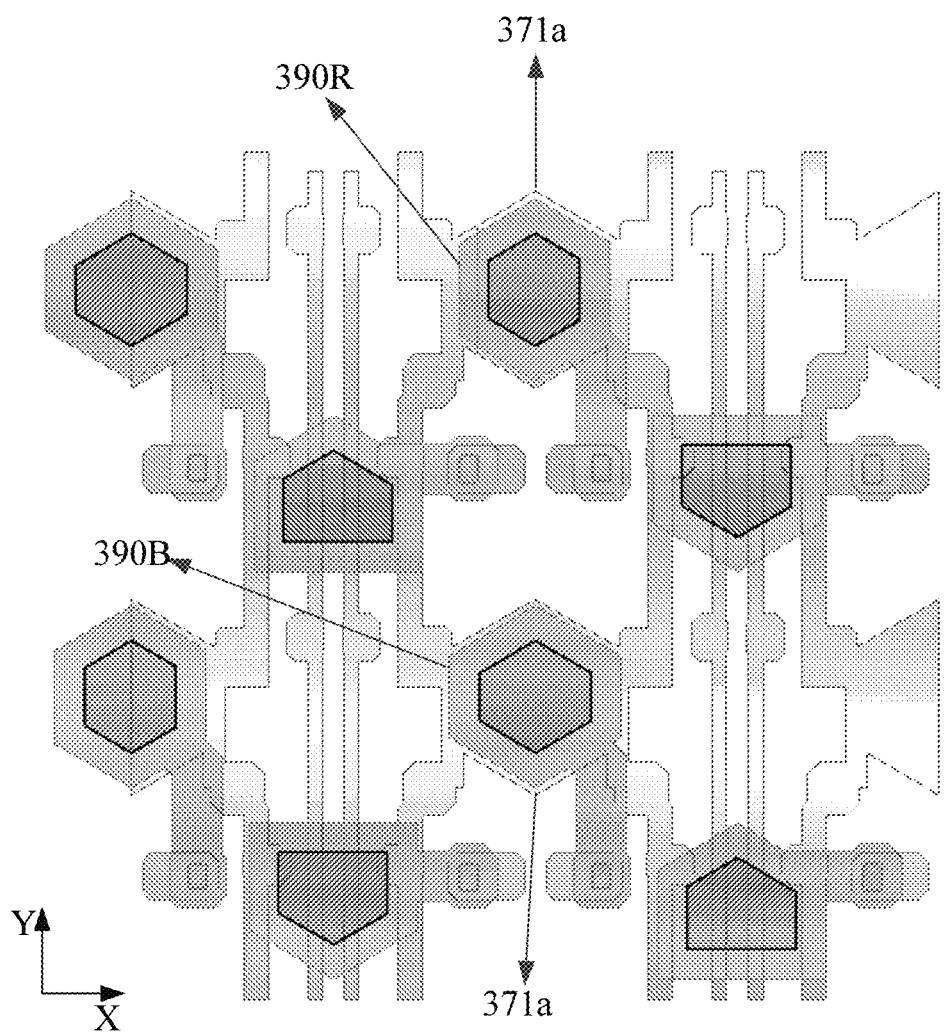
FIG. 37 shows a schematic diagram of the stacking relationship among a fifth conductive layer, a transparent conductive layer, and a pixel definition layer according to Embodiment 6 of the present disclosure.

Specifically, FIG. 37 shows a schematic diagram of the stacking relationship among the fifth conductive layer, the transparent conductive layer, and the pixel definition layer as described in Embodiment 6 of the present disclosure.

As shown in FIG. 37, the orthographic projections of the main part 391 of the first anode 390R and the main part 391 of the third anode 390B on the substrate are approximately regular hexagons. Therefore, the barrier unit 371a in the fifth conductive layer 370 opposite to the main part 391 of the first anode 390R and the main part 391 of the third anode 390B is also set to be approximately in the shape of a regular hexagon. This helps to ensure that the orthographic projections on the substrate of the main part 391 of the first anode 390R and the main part 391 of the third anode 390B are respectively located within the orthographic projections of the corresponding barrier units 371a of the fifth conductive layer 370 on the substrate. That is, while ensuring the planarizationness of the main part 391 of the first anode 390R and the main part 391 of the third anode 390B, the space occupied by the barrier unit 371a of the fifth conductive layer 370 can also be reduced, so as to prevent it from affecting the performance of adjacent structures.

Embodiment 7

The main difference between Embodiment 7 and Embodiment 5 of the present disclosure is that the orthographic shape of the barrier unit 371a of the fifth conductive layer 370 on the substrate is generally rectangular, and the side of the barrier unit 371a close to the data signal line DAL may be provided with a groove b opposite to the via hole 3711 at the data signal line DAL. For other parts in Embodiment 7 of the present disclosure, reference may be made to those in any of the above-mentioned embodiments, which will not be described in detail here.

Figure 38:
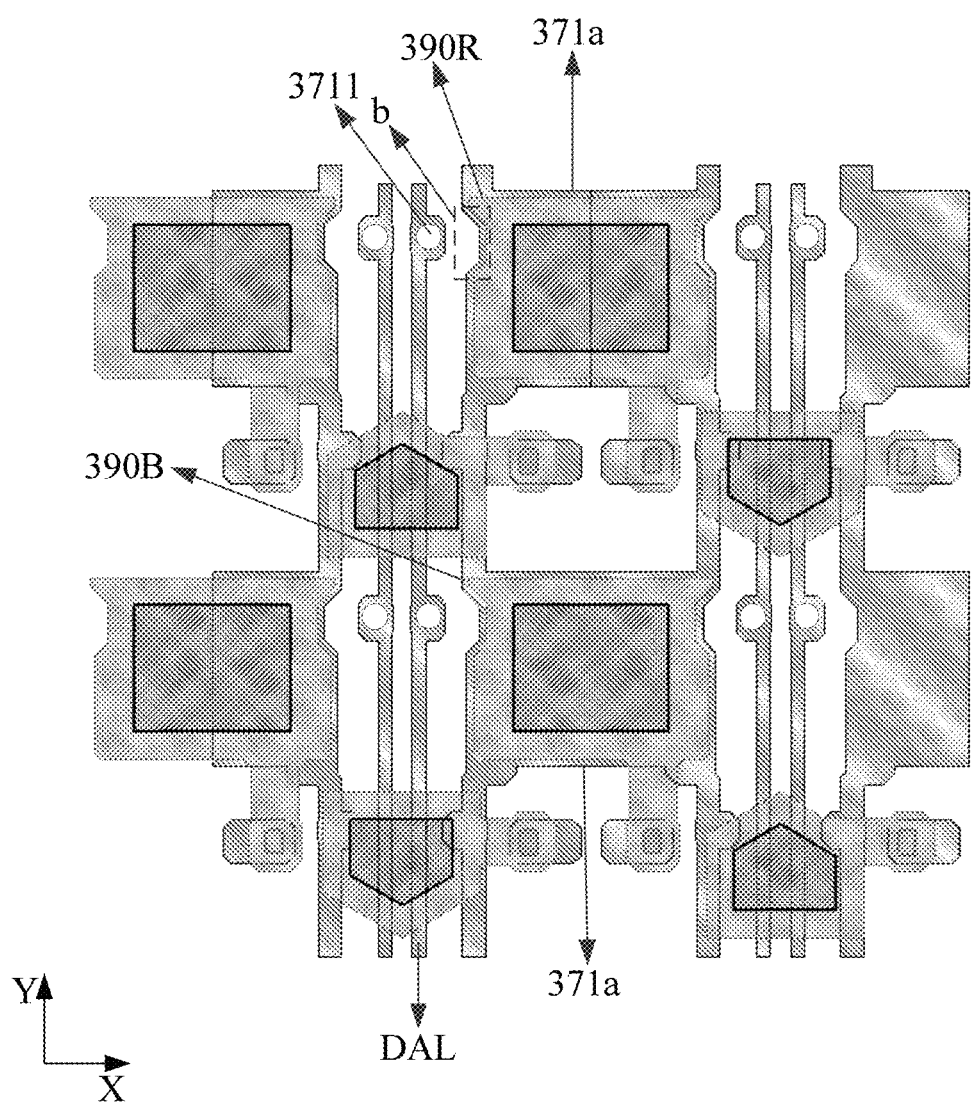
FIG. 38 shows a schematic diagram of the stacking relationship among a fifth conductive layer, a transparent conductive layer, and a pixel definition layer according to Embodiment 7 of the present disclosure.

Specifically, FIG. 38 shows a schematic diagram of the stacking relationship among the fifth conductive layer, the transparent conductive layer, and the pixel definition layer as described in Embodiment 7 of the present disclosure.

As shown in FIG. 38, the orthographic projection shape of the barrier unit 371a of the fifth conductive layer 370 on the substrate is rectangular as a whole. The side of the barrier unit 371a close to the data signal line DAL may be provided with a groove b opposite to the via hole 3711 at the data signal line DAL. At the same time, the orthographic projection shapes of the main part 391 of the first anode 390R and the main part 391 of the third anode 390B on the substrate are similar to the orthographic projection shape of the corresponding barrier unit 371a of the fifth conductive layer 370 on the substrate. That is, the orthographic shapes of the main part 391 of the first anode 390R and the main part 391 of the third anode 390B on the substrate are rectangular as a whole. The side of the main part 391 of the first anode 390R and the main part 391 of the third anode 390B close to the data signal line DAL may be provided with a groove b opposite to the via hole 3711 at the data signal line DAL. This helps to avoid the case where the main part 391 is too close to the anode at the via hole 3711 to affect the display.

It should be noted that the orthographic projections of the main part 391 of the first anode 390R and the main part 391 of the third anode 390B on the substrate are respectively located within the orthographic projection of the barrier unit 371a of the fifth conductive layer 370 on the substrate.

Embodiment 8

The main difference between Embodiment 8 and Embodiment 5 of the present disclosure is that the orthographic projection areas of the main part 391 of the first anode 390R and the main part 391 of the third anode 390B on the substrate are respectively larger than the orthographic projection area of the opposite barrier unit 371a in the fifth conductive layer 370 on the substrate, and the orthographic projections of the main part 391 of the first anode 390R and the main part 391 of the third anode 390B on the substrate substantially completely cover the orthographic projection of the opposite barrier unit 371a in the fifth conductive layer 370, respectively. For other parts in Embodiment 8 of the present disclosure, reference may be made to those in any of the foregoing embodiments, and will not be described in detail here.

It should be noted that the substantially complete coverage as mentioned in embodiments of the present disclosure refers to that the orthographic projections of the main part 391 of the first anode 390R and the main part 391 of the third anode 390B on the substrate respectively cover most of the orthographic projection of the opposing barrier unit 371a in the fifth conductive layer 370 on the substrate, and only a small part (i.e., a negligible part) is not covered.

Figure 39:
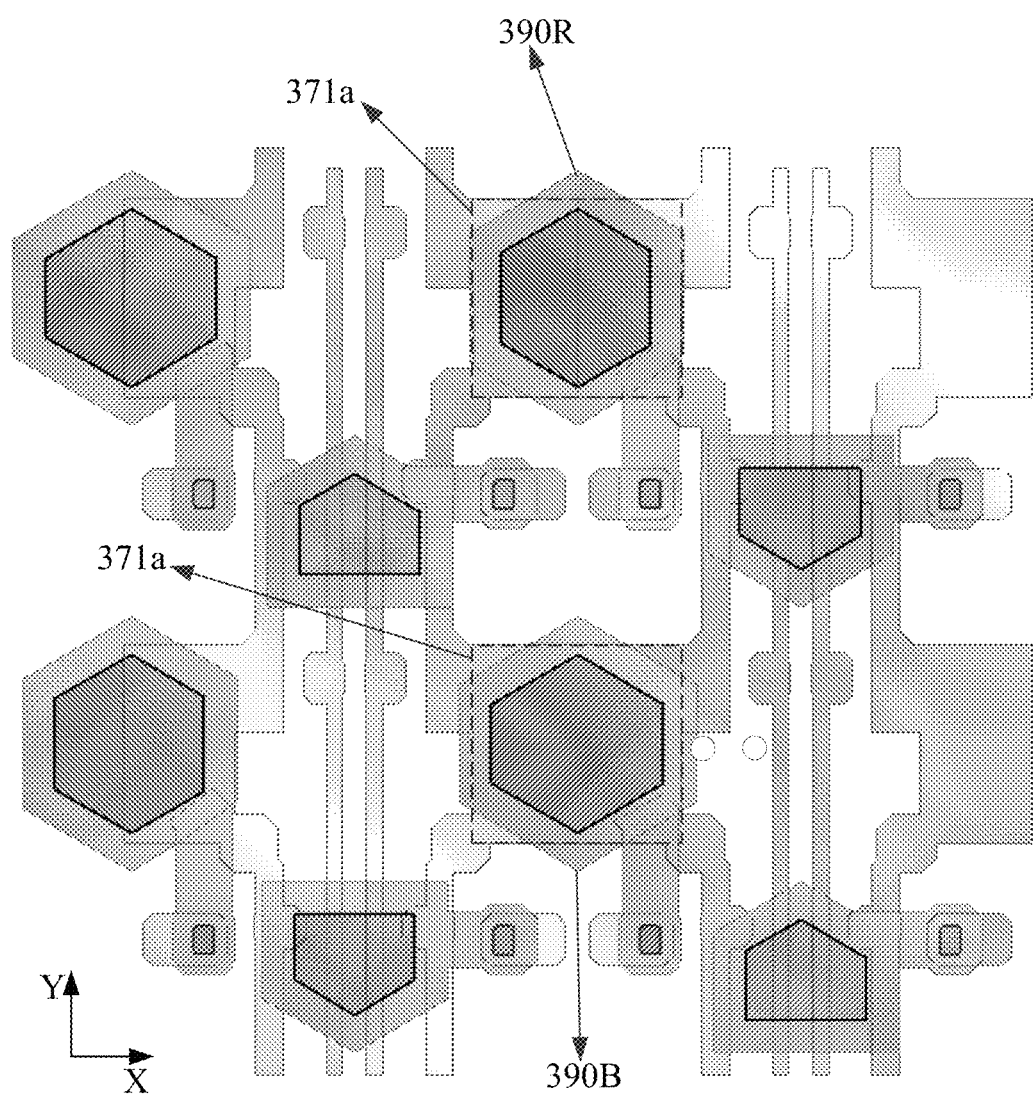
FIG. 39 shows a schematic diagram of the stacking relationship among a fifth conductive layer, a transparent conductive layer, and a pixel definition layer according to Embodiment 8 of the present disclosure.

Specifically, FIG. 39 shows a schematic diagram of the stacking relationship among the fifth conductive layer, the transparent conductive layer, and the pixel definition layer as described in Embodiment 8 of the present disclosure.

As shown in FIG. 39, the orthographic projections of the main part 391 of the first anode 390R and the main part 391 of the third anode 390B on the substrate substantially completely cover the orthographic projection of the opposite barrier unit 371a in the fifth conductive layer 370 on the substrate, respectively.

In an embodiment of the present disclosure, the orthographic projections of the main part 391 of the first anode 390R and the main part 391 of the third anode 390B on the substrate are or approximate regular hexagons, and the orthographic projection on the substrate of the barrier unit 371a of the fifth conductive layer 370 is or approximates a shape of rectangle.

Embodiment 9

The main difference between Embodiment 9 and Embodiment 7 of the present disclosure is that the pixel circuits of two adjacent columns share a first power voltage line VDL of the fifth conductive layer 370. For other parts in Embodiment 9 of the present disclosure, reference may be made to any one of the foregoing embodiments, and is not described in detail here.

Figure 40:
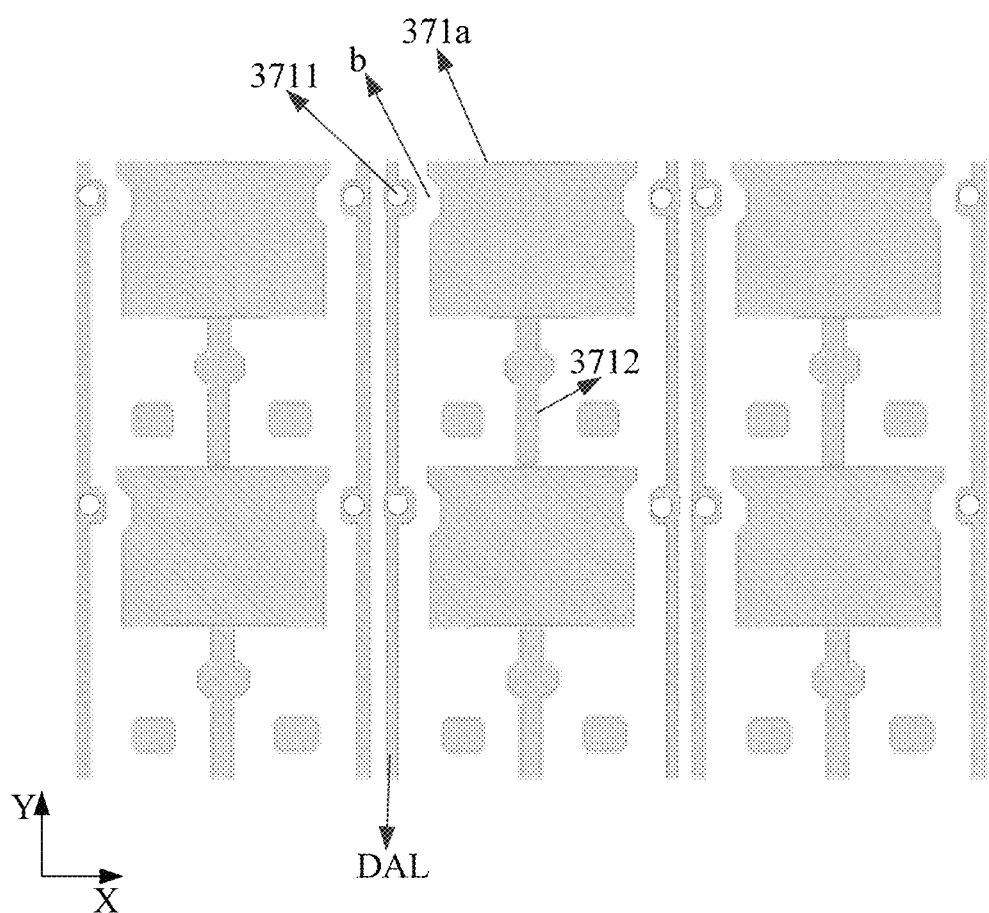
FIG. 40 shows a schematic plan view of a fifth conductive layer according to Embodiment 9 of the present disclosure.

Specifically, FIG. 40 shows a schematic plan view of the fifth conductive layer described in Embodiment 9 of the present disclosure.

As shown in FIG. 40, the first power voltage line VDL has a barrier unit 371a and a voltage line connection part 3712 that are integrally formed and alternately arranged in the Y direction. Two adjacent barrier units 371a in each first power voltage line VDL are connected by a voltage line connection part 3712.

It should be noted that the width of the barrier unit 371a in the X direction is larger than the width of the voltage line connection part 3712 in the X direction.

In an embodiment of the present disclosure, a side of the barrier unit 371a close to the data signal line DAL may be provided with a groove b opposite to the via hole 3711 at the data signal line DAL.

In addition, it should be noted that, the two adjacent barrier units 371a in each first power voltage line VDL are not limited to being connected by one voltage line connection part 3712 or by two voltage line connection parts 3712 as mentioned in the foregoing embodiments, and may be also connected by three, four or more voltage line connection parts 3712.

The voltage line connection part 3712 of the first power voltage line VDL mentioned in any embodiment of the present disclosure may be located in the same layer as the barrier unit 371a, such as forming an integrated structure. Alternatively, the two may be located in different layers. For example, the voltage line connection part 3712 of the first power voltage line VDL may be provided in the same layer as the first conductive layer, the second conductive layer, the third conductive layer, the fourth conductive layer or the transparent electrode layer as mentioned in any of the foregoing embodiments.

Embodiment 10

Figure 41:
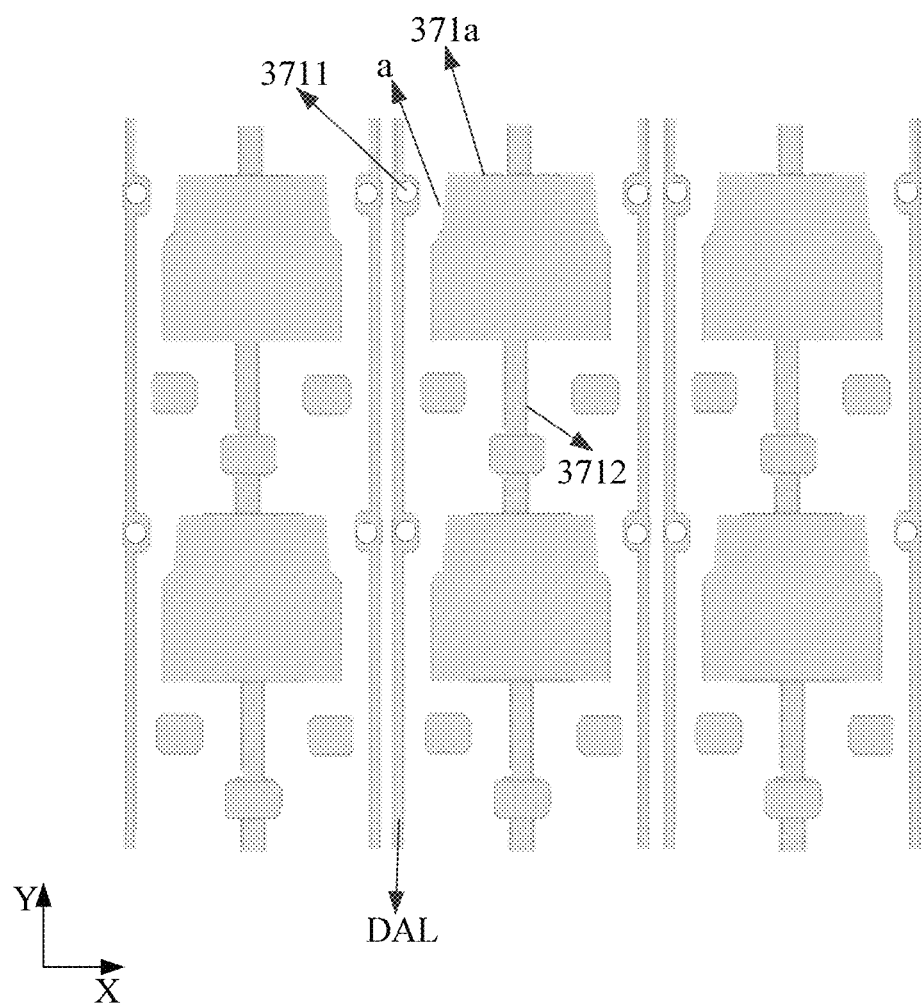
FIG. 41 shows a schematic plan view of a fifth conductive layer according to Embodiment 10 of the present disclosure.

FIG. 41 shows a schematic plan view of the fifth conductive layer described in Embodiment 10 of the present disclosure. As shown in FIG. 41, the main difference between Embodiment 10 and Embodiment 9 of the present disclosure is that a side of the barrier unit 371a of the first power voltage line VDL of the fifth conductive layer 370 close to the data signal line DAL may be provided with a notch a opposite to the via hole 3711 at the data signal line DAL. For other parts in Embodiment 10 of the present disclosure, reference may be made to those in any of the foregoing embodiments, which will not be described in detail here.

Embodiment 11

Figure 42:
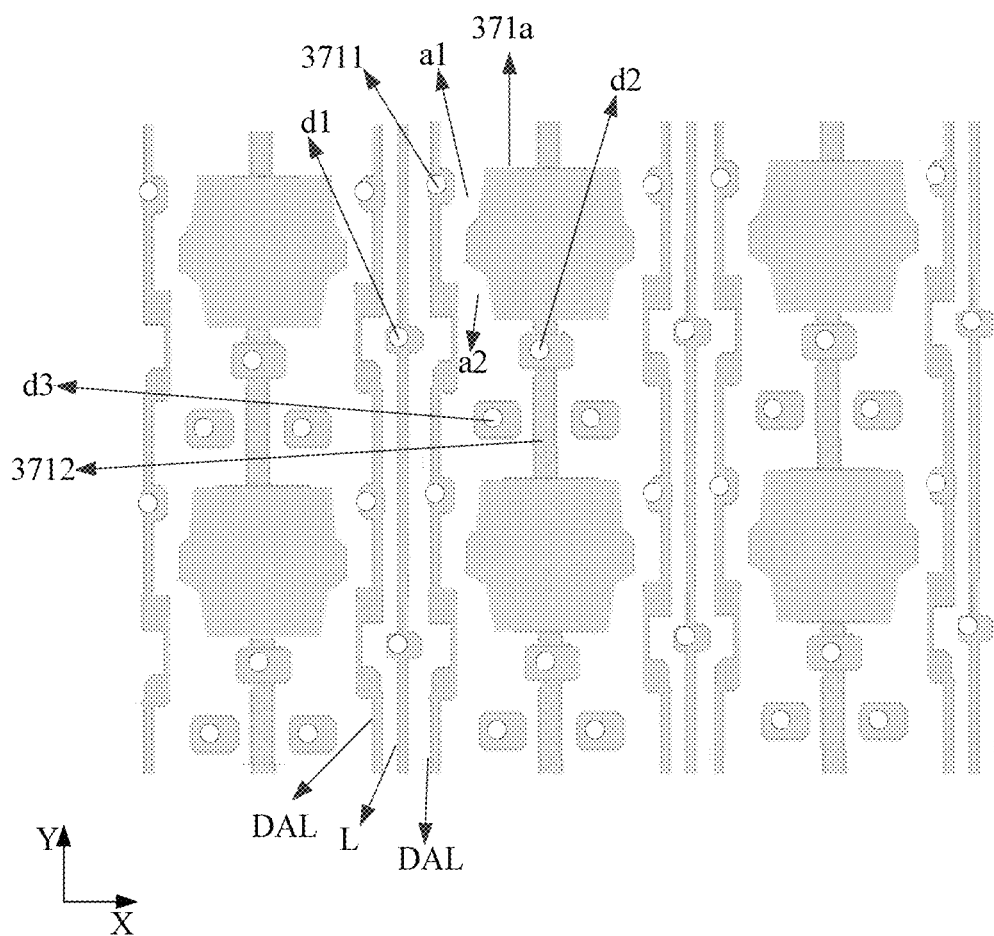
FIG. 42 shows a schematic plan view of a fifth conductive layer according to Embodiment 11 of the present disclosure.

FIG. 42 shows a schematic plan view of the fifth conductive layer described in Embodiment 11 of the present disclosure. As shown in FIG. 41, the main differences between Embodiment 11 and Embodiment 10 of the present disclosure are as follows.

The barrier unit 371a of the first power voltage line VDL of the fifth conductive layer 370 includes at least two notches, where one notch a1 corresponds to the position of the via hole 3711 at the data signal line DAL, and the other notch a2 corresponds to the position of the connection via hole d1 of the signal line L located between the two data signal lines DAL. The signal line located between the two data signal lines DAL may be a reset signal line, another power signal line different from the first power voltage line VDL, or an auxiliary electrode such as an auxiliary cathode line.

Besides, in order to obtain a better layout of the connection via hole d2 and the anode connection via hole d3 of the first power voltage line VDL, in the Y direction, a distance between the connection via hole d2 of the first power voltage line VDL (equivalent to the via hole 3721 as mentioned in the foregoing embodiments) and the connection via hole d1 of the nearest signal line L is smaller than the distance between the anode connection via hole d3 (equivalent to the via hole 3731 as mentioned in the foregoing embodiments) and the connection via hole d1 of the same signal line L.

It should be noted that, for other parts in Embodiment 11 of the present disclosure, reference may be made to those in any of the foregoing embodiments, which will not be described in detail here.

Embodiment 12

Figure 43:
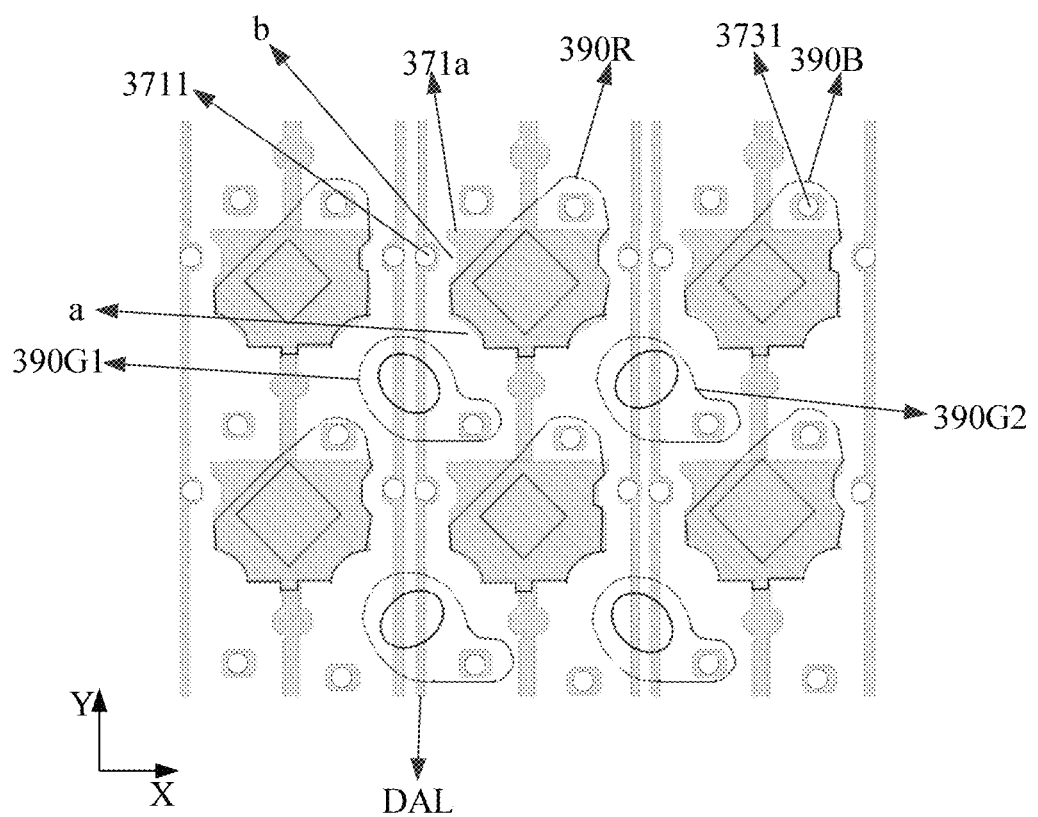
FIG. 43 shows a schematic plan view of a fifth conductive layer, a transparent conductive layer, and a pixel definition layer according to Embodiment 12 of the present disclosure.

FIG. 43 is a schematic plan view of the fifth conductive layer, the transparent conductive layer, and the pixel definition layer described in Embodiment 12 of the present disclosure. As shown in FIG. 43, the main differences between Embodiment 12 and Embodiment 11 of the present disclosure are as follows.

The barrier unit 371a of the first power voltage line VDL of the fifth conductive layer 370 is provided with a groove b corresponding to the position of the via hole 3711 at the data signal line DAL. The barrier unit 371a is further provided with a notch a corresponding to the protruding portion of the anode. For example, the notch a is in a recessed shape that is roughly the same as the contour of the part closest to the main part 391 of the second anode 390G1 (the fourth anode 390G2). The groove a is provided at the first power voltage line VDL, such that the second anode 390G1 and the fourth anode 390G2 are prevented from being too high on the side close to the barrier unit 371a as compared with other areas, which is caused by the barrier unit 371a of the first power voltage line VDL, thereby avoiding the situation where the anodes are too inclined and the poor planarizationness is caused.

Besides, most of the orthographic projections of the main part 391 of the first anode 390R and the main part 391 of the third anode 390B on the substrate overlap the orthographic projection of the barrier unit 371a on the substrate, and may also overlap partially the contours of a groove b and two notches a. As shown in FIG. 43, part of the contour may also approximately coincide with the contour of the connection part.

In addition, in the X direction, the via holes 3731 connected to the respective anodes may be located on the same straight line, or may be approximately staggered by a certain distance due to the control over the size of the anodes and the spacing between the anodes.

It should be noted that, for other parts in Embodiment 12 of the present disclosure, reference may be made to those in any of the foregoing embodiments, which will not be described in detail here.

Embodiment 13

Figure 44:
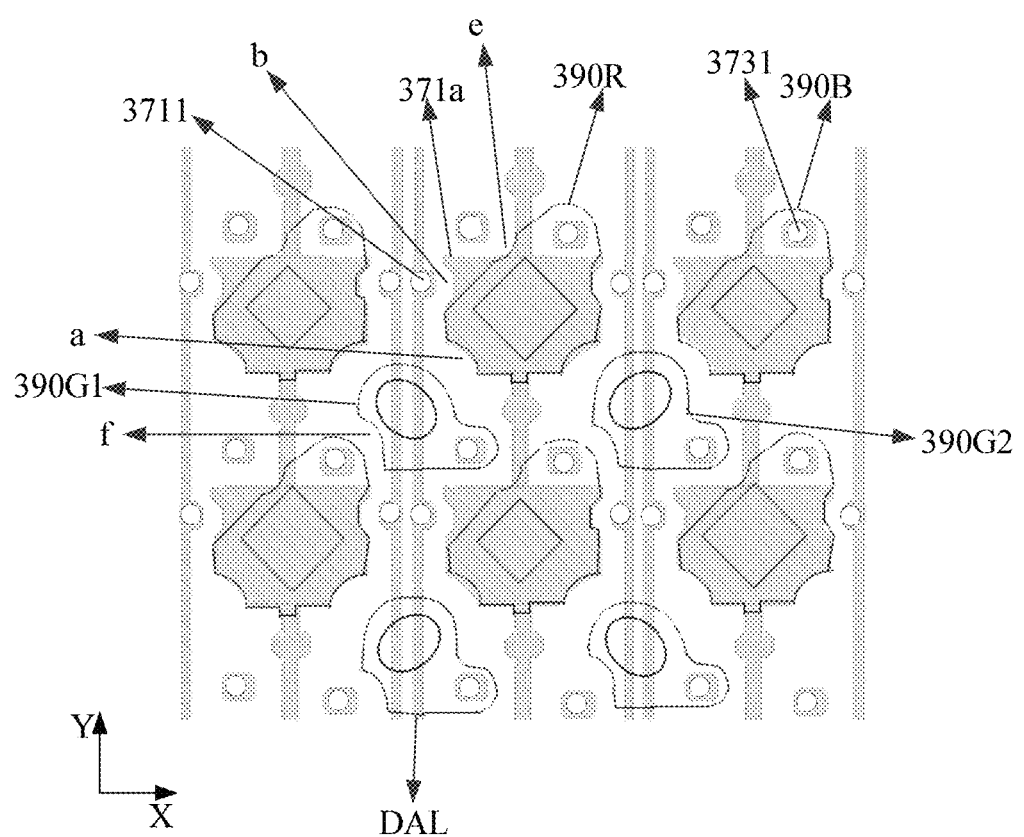
FIG. 44 shows a schematic plan view of a fifth conductive layer, a transparent conductive layer, and a pixel definition layer according to Embodiment 13 of the present disclosure.

FIG. 44 is a schematic plan view of the fifth conductive layer, the transparent conductive layer, and the pixel definition layer described in Embodiment 13 of the present disclosure. As shown in FIG. 44, the main differences between Embodiment 13 and Embodiment 14 of the present disclosure are as follows.

In addition to the aforementioned notch a and groove b, the first anode 390R has an additional groove e corresponding to the connection via hole 3731 of the fourth anode 390G2. The second anode 390G1 has an additional groove f corresponding to the connection via hole 3731 of the first anode 390R. In addition to the aforementioned notch a and groove b, the third anode 390B also has an additional groove e corresponding to the connection via hole 3731 of the second anode 390G1. The fourth anode 390G2 has an additional groove f corresponding to the connection via hole 3731 of the third anode 390B.

It should be noted that, for other parts in Embodiment 13 of the present disclosure, reference may be made to those in any of the foregoing embodiments, which will not be described in detail here.

Embodiment 14

Figure 45:
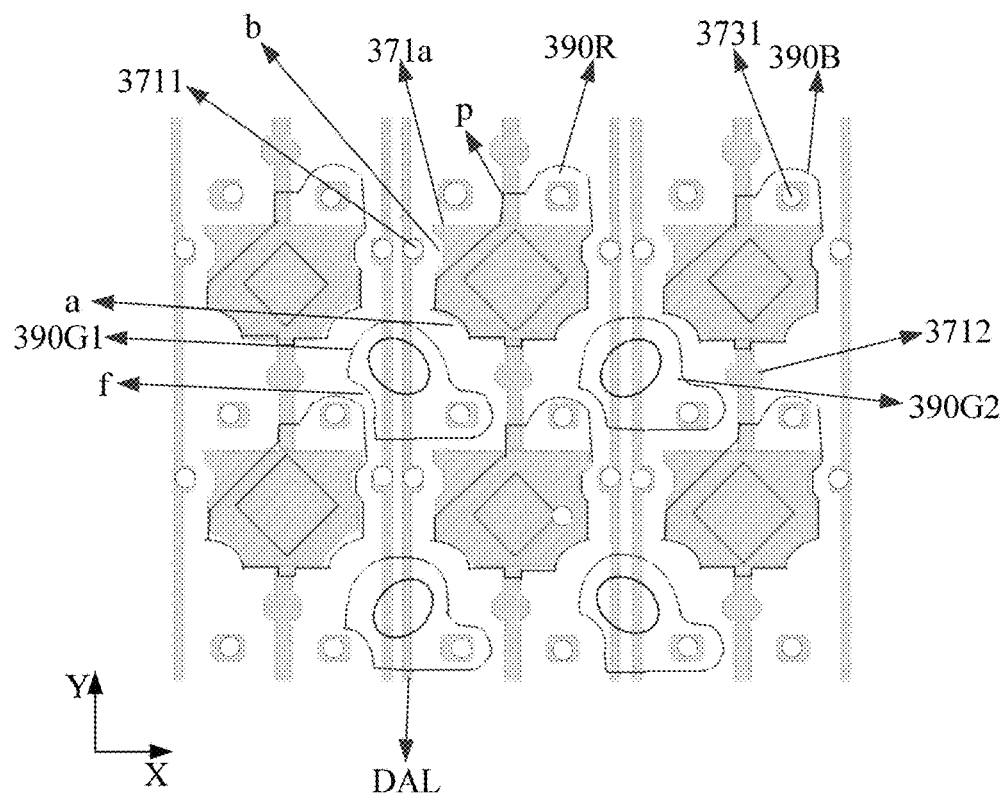
FIG. 45 shows a schematic plan view of a fifth conductive layer, a transparent conductive layer, and a pixel definition layer according to Embodiment 14 of the present disclosure.

FIG. 45 is a schematic plan view of the fifth conductive layer, the transparent conductive layer, and the pixel definition layer described in Embodiment 14 of the present disclosure. As shown in FIG. 45, the main differences between Embodiment 14 and Embodiment 13 of the present disclosure are as follows.

The first anode 390R and the third anode 390B do not have a groove e, but a respective protruding part P is added. The orthographic projection of the protruding part P on the substrate partially overlaps the orthographic projection of the voltage line connection part 3712 on the substrate. Besides, the connection via hole 3731 of each anode in the same row is located on the same straight line.

It should be noted that, for other parts in Embodiment 14 of the present disclosure, reference may be made to those in any of the foregoing embodiments, which will not be described in detail here.

Embodiment 15

Figure 46:
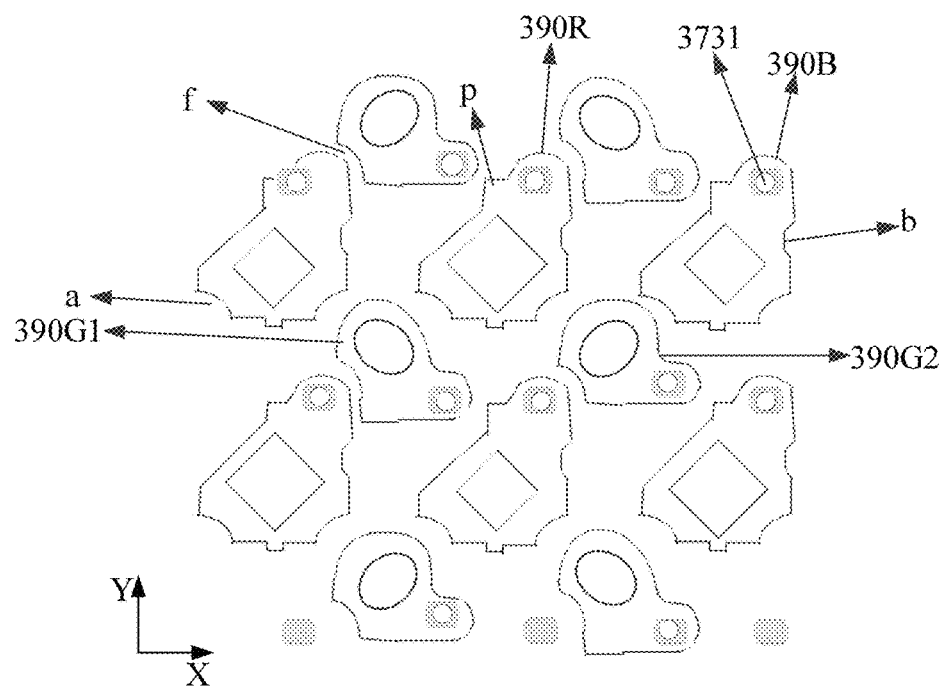
FIG. 46 is a schematic plan view of a transparent conductive layer and a pixel definition layer according to Embodiment 15 of the present disclosure.

FIG. 46 is a schematic plan view of the transparent conductive layer and the pixel definition layer described in Embodiment 15 of the present disclosure. As shown in FIG. 46, the main difference between Embodiment 14 and Embodiment 13 of the present disclosure is that the positions of the via holes are different. For example, the connection via hole 3731 of the second anode 390G1 and the connection via hole 3731 of the fourth anode 390G2 are not located on the same straight line.

It should be noted that, for other parts in Embodiment 15 of the present disclosure, reference may be made to those in any of the foregoing embodiments, which will not be described in detail here.

It should be noted that Embodiment 1 and Embodiment 2 as mentioned above may also include the shielding layer in Embodiment 3, and the transparent conductive layer, the pixel definition layer, and the spacer in Embodiment 4. In addition to the above-mentioned film layers, an encapsulation layer and the like may also be provided in the above-mentioned embodiments. The encapsulation layer may be a structure in which an organic film layer and an inorganic film layer are stacked. The groove as mentioned in the foregoing embodiments refers to a structure in which the groove bottom is provided with groove sides all around, and the notch refers to a structure surrounded by only one groove bottom and one groove side.

In addition, it should be noted that the features in the above embodiments may be arbitrarily combined without conflict, and the combined solution is also the content to be protected by the present disclosure.

Figure 47:
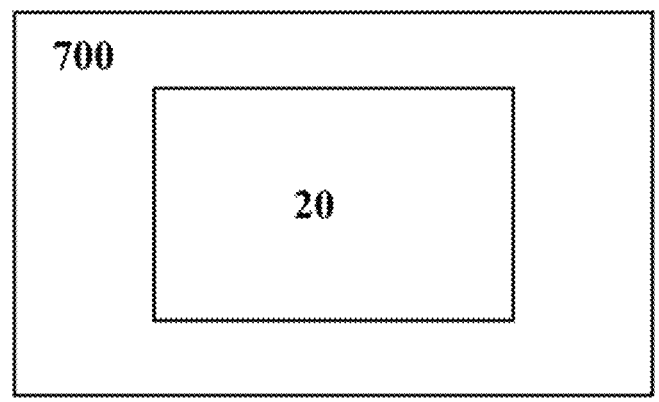
FIG. 47 shows a schematic structural diagram of a display panel according to an embodiment of the present disclosure.

FIG. 47 shows a schematic structural diagram of a display panel according to an embodiment of the present disclosure. As shown in FIG. 47, the display panel 700 may include the array substrate 20 according to any embodiment of the present disclosure or the array substrate including the pixel circuit 100 according to any embodiment of the present disclosure.

For example, the display panel 700 may further include other components, such as a timing controller, a signal decoding circuit, a voltage conversion circuit, etc. For example, these components may use existing conventional elements, which will not be described in detail here.

For example, the display panel 700 may be a rectangular panel, a circular panel, an oval panel, a polygonal panel, or the like. In addition, the display panel 700 may be not only a planarization panel, but also a curved panel, or even a spherical panel. For example, the display panel 700 may also have a touch function. That is, the display panel 700 may be a touch display panel.

Embodiments of the present disclosure also provide a display device including the display panel according to any embodiment of the present disclosure.

Figure 48:
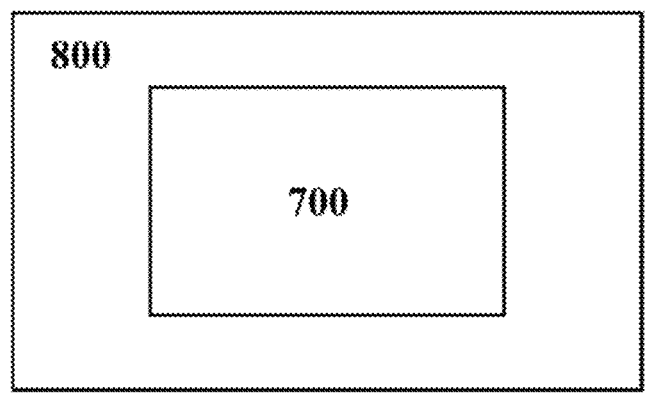
FIG. 48 shows a schematic structural diagram of a display device according to an embodiment of the present disclosure.

FIG. 48 shows a schematic structural diagram of a display device according to an embodiment of the present disclosure. As shown in FIG. 48, the display device 800 may include the display panel 700 according to any embodiment of the present disclosure.

The display device 800 may be any product or component with a display function, such as a mobile phone, a tablet computer, a television, a monitor, a notebook computer, a digital photo frame, a navigator, and the like.

The display panel and display device provided by embodiments of the present disclosure have the same or similar beneficial effects as the array substrates provided by the foregoing embodiments of the present disclosure. Since the array substrate has been described in detail in the foregoing embodiments, it will not be repeated here.

The foregoing description of embodiments has been provided for the purpose of illustration and description. It is not intended to be exhaustive or to limit the present application. Individual elements or features of a particular embodiment are generally not limited to the particular embodiment, but, where appropriate, are interchangeable and may be used in a selected embodiment, even if not specifically shown or described. They may also be changed in many ways. Such changes are not to be considered a departure from the present application, and all such modifications are included within the scope of the present application.

The invention claimed is:

1. An array substrate, comprising:
a substrate;
a plurality of sub-pixels on the substrate, wherein each sub-pixel comprises a pixel circuit, the pixel circuit comprises a plurality of transistors, and the plurality of transistors comprises at least one oxide transistor;
an oxide semiconductor layer on the substrate, wherein the oxide semiconductor layer comprises a channel region of the oxide transistor;
a first planarization layer on the substrate and covering at least a portion of the oxide semiconductor layer, wherein the first planarization layer comprises a recessed region, and at least a portion of an orthographic projection of the recessed region on the substrate is located outside an orthographic projection of the channel region of the oxide transistor on the substrate; and
a barrier part on a side of the first planarization layer away from the substrate, wherein at least a portion of an orthographic projection of the barrier part on the substrate overlaps an orthographic projection of the channel region of the oxide transistor on the substrate, an orthographic projection of the barrier part on the substrate overlaps at least a portion of an orthographic projection of the recessed region on the substrate, and the barrier part is filled in the recessed region.

2. The array substrate according to claim 1, wherein the orthographic projection of the recessed region on the substrate surrounds the orthographic projection of the channel region of the oxide transistor on the substrate.

3. The array substrate according to claim 2, wherein a distance in a horizontal direction between an inner annular surface of the recessed region and an edge of the channel region of the oxide transistor is from 0.5 µm to 7 µm, where the horizontal direction is perpendicular to a thickness direction of the substrate.

4. The array substrate according to claim 2, wherein
a distance in a horizontal direction between an inner annular surface of the recessed region and an outer annular surface of the recessed region is from 1 µm to 7 µm, where the horizontal direction is perpendicular to a thickness direction of the substrate.

5. The array substrate according to claim 1, wherein
the recessed region comprises a groove structure, and
at the groove structure, a ratio of a remaining thickness of the first planarization layer to a groove depth of the groove structure is greater than 0 and less than or equal to 3.

6. The array substrate according to claim 5, wherein at the groove structure, a sum of the remaining thickness of the first planarization layer and the groove depth of the groove structure is from 1 µm to 3 µm.

7. The array substrate according to claim 5, wherein the orthographic projection of the channel region of the oxide transistor on the substrate is located within the orthographic projection of the recessed region on the substrate.

8. The array substrate according to claim 1, wherein the barrier part is in direct contact with the first planarization layer.

9. The array substrate according to claim 1, wherein the pixel circuit comprises a driving circuit, a driving reset circuit and a compensation circuit, wherein
the driving circuit comprises a control terminal, a first terminal and a second terminal, and is configured to provide a driving current to a light emission device, the control terminal of the driving circuit being coupled to a first node;
the driving reset circuit is coupled to a driving reset control signal input terminal, the first node and a driving reset voltage terminal, and is configured to provide a driving reset voltage from the driving reset voltage terminal to the control terminal of the driving circuit under the control of a driving reset control signal from the driving reset control signal input terminal to reset the control terminal of the driving circuit; and
the compensation circuit is coupled to the second terminal of the driving circuit, the first node and a compensation control signal input terminal, and is configured to perform threshold compensation on the driving circuit according to a compensation control signal from the compensation control signal input terminal.

10. The array substrate according to claim 9, wherein
each of the driving circuit, the driving reset circuit and the compensation circuit comprises at least one of the transistors, the transistor of the driving circuit is defined as a driving transistor, the transistor of the driving reset circuit is defined as a driving reset transistor, and the transistor of the compensation circuit is defined as a compensation circuit transistor;
a first terminal of the driving transistor is coupled to the first terminal of the driving circuit, a gate of the driving transistor is coupled to the control terminal of the driving circuit, and a second terminal of the driving transistor is coupled to the second terminal of the driving circuit;
a first terminal of the driving reset transistor is coupled to the driving reset voltage terminal, a gate of the driving reset transistor is coupled to the driving reset control signal input terminal, and a second terminal of the driving reset transistor is coupled to the first node; and
a first terminal of the compensation transistor is coupled to the second terminal of the driving circuit, a gate of the compensation transistor is coupled to the compensation control signal input terminal, and a second terminal of the compensation transistor is coupled to the first node.

11. The array substrate according to claim 10, wherein
the plurality of transistors comprises at least one silicon semiconductor transistor; and
the array substrate further comprises:
a silicon semiconductor layer, located on a side of the oxide semiconductor layer close to the substrate, and isolated from the oxide semiconductor layer, wherein the silicon semiconductor layer comprises a channel region of the silicon semiconductor transistor.

12. The array substrate according to claim 11, wherein
the driving transistor is the silicon semiconductor transistor, and
the driving reset transistor and the compensation transistor are the oxide transistors.

13. The array substrate according to claim 12, wherein the driving transistor is a P type transistor;

the driving reset transistor and the compensation transistor are N type transistors;
the pixel circuit further comprises a data writing circuit, a storage circuit, a light emission control circuit and a light emission reset circuit;
the data writing circuit is coupled to a data signal input terminal, a scan signal input terminal and the first terminal of the driving circuit, and is configured to provide a data signal from the data signal input terminal to the first terminal of the driving circuit under the control of a scan signal from the scan signal input terminal;
the storage circuit is coupled to a first power voltage terminal and the control terminal of the driving circuit, and is configured to store a voltage difference between the first power voltage terminal and the control terminal of the driving circuit;
the light emission control circuit is coupled to the light emission control signal input terminal, the first power voltage terminal, the first and second terminals of the driving circuit, the light emission reset circuit and the light emission device, and is configured to apply a first power voltage from the first power voltage terminal to the driving circuit under the control of a light emission control signal from the light emission control signal input terminal, and to apply the driving current generated by the driving circuit to the light emission device; and
the light emission reset circuit is coupled to the light emission reset control signal input terminal, a first terminal of the light emission device and the light emission reset voltage terminal, and is configured to provide a light emission reset voltage from the light emission reset voltage terminal to the light emission device under the control of a light emission reset control signal from the light emission reset control signal input terminal to reset the light emission device.

14. The array substrate according to claim 13, wherein
each of the data writing circuit, the light emission reset circuit and the light emission control circuit comprises at least one of the transistors, the transistor of the data writing circuit is defined as a data writing transistor, the transistor of the light emission reset circuit is defined as a light emission reset transistor, the transistor of the light emission control circuit is defined as a light emission control transistor, the light emission control circuit comprises at least two light emission control transistors being a first light emission control transistor and a second light emission control transistor, and the storage circuit comprises a storage capacitor;
a first terminal of the data writing transistor is coupled to the data signal input terminal, a gate of the data writing transistor is coupled to the scan signal input terminal, and a second terminal of the data writing transistor is coupled to the first terminal of the driving circuit;
a first terminal of the storage capacitor is coupled to the first power voltage terminal, a second terminal of the storage capacitor is coupled to the control terminal of the driving circuit, and the storage capacitor is configured to store a voltage difference between the first power voltage terminal and the control terminal of the driving circuit;
a first terminal of the first light emission control transistor is coupled to the first power voltage terminal, a gate of the first light emission control transistor is coupled to the light emission control signal input terminal, and a second terminal of the first light emission control transistor is coupled to the first terminal of the driving circuit;

a first terminal of the second light emission control transistor is coupled to the second terminal of the driving circuit, a gate of the second light emission control transistor is coupled to the light emission control signal input terminal, and a second terminal of the second light emission control transistor is coupled to a first terminal of the light emission device; and a first terminal of the light emission reset transistor is coupled to the light emission reset voltage terminal, a gate of the light emission reset transistor is coupled to the light emission reset control signal input terminal, and a second terminal of the light emission reset transistor is coupled to a first terminal of the light emission device.

15. The array substrate according to claim 14, further comprising a conductive layer on a side of the first planarization layer away from the substrate, wherein the conductive layer comprises a data signal line and a first power voltage line arranged along a row direction, the data signal line is coupled to a first terminal of the data writing transistor; and the first power voltage line is coupled to a first terminal of the storage capacitor and a first terminal of the first light emission control transistor, and a portion of the first power voltage line serves as the barrier part.

16. The array substrate according to claim 11, wherein the pixel circuit further comprises:

a voltage stabilizing circuit, coupled to the control terminal of the driving circuit, the first node and a voltage stabilizing control signal input terminal, and configured to enable a conduction between the control terminal of the driving circuit and the first node under the control of a voltage stabilizing control signal from the voltage stabilizing control signal input terminal.

17. The array substrate according to claim 16, wherein the voltage stabilizing circuit comprises at least one of the transistors, and the transistor of the voltage stabilizing circuit is defined as a voltage stabilizing transistor;

a first terminal of the voltage stabilizing transistor is coupled to the control terminal of the driving circuit, a gate of the voltage stabilizing transistor is coupled to the voltage stabilizing control signal input terminal, and a second terminal of the voltage stabilizing transistor is coupled to the first node; and the driving transistor, the driving reset transistor and the compensation transistor are all the silicon semiconductor transistors, and the voltage stabilizing transistor is the oxide transistor.

18. The array substrate according to claim 9, wherein the driving reset voltage terminal and the light emission reset voltage terminal are different reset voltage terminals.

19. A display panel, comprising an array substrate, wherein the array substrate comprises:

a substrate;

a plurality of sub-pixels on the substrate, wherein each sub-pixel comprises a pixel circuit, the pixel circuit comprises a plurality of transistors, and the plurality of transistors comprises at least one oxide transistor;

an oxide semiconductor layer on the substrate, wherein the oxide semiconductor layer comprises a channel region of the oxide transistor;

a first planarization layer on the substrate and covering at least a portion of the oxide semiconductor layer, wherein the first planarization layer comprises a recessed region, and at least a portion of an orthographic projection of the recessed region on the substrate is located outside an orthographic projection of the channel region of the oxide transistor on the substrate; and a barrier part on a side of the first planarization layer away from the substrate, wherein at least a portion of an orthographic projection of the barrier part on the substrate overlaps an orthographic projection of the channel region of the oxide transistor on the substrate, an orthographic projection of the barrier part on the substrate overlaps at least a portion of an orthographic projection of the recessed region on the substrate, and the barrier part is filled in the recessed region.

20. A display device, comprising a display panel, wherein the display panel comprises a display panel, and the array substrate comprises:

a substrate;

a plurality of sub-pixels on the substrate, wherein each sub-pixel comprises a pixel circuit, the pixel circuit comprises a plurality of transistors, and the plurality of transistors comprises at least one oxide transistor;

an oxide semiconductor layer on the substrate, wherein the oxide semiconductor layer comprises a channel region of the oxide transistor;

a first planarization layer on the substrate and covering at least a portion of the oxide semiconductor layer, wherein the first planarization layer comprises a recessed region, and at least a portion of an orthographic projection of the recessed region on the substrate is located outside an orthographic projection of the channel region of the oxide transistor on the substrate; and a barrier part on a side of the first planarization layer away from the substrate, wherein at least a portion of an orthographic projection of the barrier part on the substrate overlaps an orthographic projection of the channel region of the oxide transistor on the substrate, an orthographic projection of the barrier part on the substrate overlaps at least a portion of an orthographic projection of the recessed region on the substrate, and the barrier part is filled in the recessed region.

* * * * *